(12) United States Patent
Yang et al.

(10) Patent No.: US 12,495,534 B2
(45) Date of Patent: Dec. 9, 2025

(54) EPITAXIAL FEATURES IN SEMICONDUCTOR DEVICES AND METHOD OF FORMING THE SAME

(71) Applicant: TAIWAN SEMICONDUCTOR MANUFACTURING COMPANY, LTD., Hsinchu (TW)

(72) Inventors: Chih-Chuan Yang, Hsinchu (TW); Wen-Chun Keng, Hsinchu County (TW); Shih-Hao Lin, Hsinchu (TW); Hsin-Wen Su, Hsinchu (TW); Yu-Kuan Lin, Taipei (TW); Ping-Wei Wang, Hsin-Chu (TW); Jing-Yi Lin, Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 673 days.

(21) Appl. No.: 17/832,589

(22) Filed: Jun. 4, 2022

(65) Prior Publication Data
US 2023/0225098 A1 Jul. 13, 2023

Related U.S. Application Data

(60) Provisional application No. 63/299,192, filed on Jan. 13, 2022.

(51) Int. Cl.
| | | |
|---|---|---|
| *H10B 10/00* | (2023.01) | |
| *G11C 11/412* | (2006.01) | |
| *H10D 30/62* | (2025.01) | |
| *H10D 30/67* | (2025.01) | |
| *H10D 84/83* | (2025.01) | |

(52) U.S. Cl.
CPC ............ *H10B 10/12* (2023.02); *G11C 11/412* (2013.01); *H10D 30/6211* (2025.01); *H10D 30/6735* (2025.01); *H10D 84/834* (2025.01)

(58) Field of Classification Search
CPC .. H10B 10/12; H10D 84/834; H10D 84/8311; H10D 84/8312; H10D 84/83125; H10D 84/83135; H10D 84/83138; H10D 84/8314; H10D 84/8316; H10D 84/832; H10D 84/833; H10D 84/835; H10D 84/836; H10D 84/837; H10D 84/839;
(Continued)

(56) References Cited

U.S. PATENT DOCUMENTS

| | | |
|---|---|---|
| 8,772,109 B2 | 7/2014 | Colinge |
| 8,785,285 B2 | 7/2014 | Tsai et al. |

(Continued)

*Primary Examiner* — Eric W Jones
(74) *Attorney, Agent, or Firm* — HAYNES AND BOONE, LLP

(57) ABSTRACT

A method includes forming a first fin protruding from a substrate in a first region of the substrate and a second fin protruding from the substrate in a second region of the substrate, recessing a portion of the first fin, thereby forming a first recess, recessing a portion of the second fin, thereby forming a second recess, depositing a blocking layer in the second recess, growing a base epitaxial layer in the first recess, removing the blocking layer from the second recess, and growing a doped epitaxial layer in the first recess and the second recess. The base epitaxial layer is dopant free. The doped epitaxial layer abuts the first fin in the first region and the second fin in the second region.

20 Claims, 46 Drawing Sheets

(58) Field of Classification Search
CPC .......... H10D 30/6211; H10D 30/6735; H10D 30/501–509; G11C 11/412
USPC ........................................................ 438/618
See application file for complete search history.

(56) References Cited

U.S. PATENT DOCUMENTS

| | | |
|---|---|---|
| 8,816,444 B2 | 8/2014 | Wann et al. |
| 8,823,065 B2 | 9/2014 | Wang et al. |
| 8,860,148 B2 | 10/2014 | Hu et al. |
| 9,105,490 B2 | 8/2015 | Wang et al. |
| 9,236,267 B2 | 1/2016 | De et al. |
| 9,236,300 B2 | 1/2016 | Liaw |
| 9,520,482 B1 | 12/2016 | Chang et al. |
| 9,576,814 B2 | 2/2017 | Wu et al. |
| 10,043,718 B1* | 8/2018 | Chen .................. H10D 84/0193 |
| 2015/0069328 A1 | 3/2015 | Leobandung |
| 2015/0349068 A1* | 12/2015 | Levesque ............ H10D 84/038 438/299 |
| 2016/0284601 A1* | 9/2016 | Yu ...................... H10D 84/0188 |
| 2017/0005195 A1 | 1/2017 | Ching et al. |
| 2017/0179257 A1* | 6/2017 | Chou ..................... H10D 86/01 |
| 2018/0122706 A1* | 5/2018 | Cheng .................. H01L 27/088 |
| 2019/0067128 A1* | 2/2019 | Chang ............... H01L 21/28088 |
| 2019/0214484 A1* | 7/2019 | Niimi .................. H01L 29/7827 |
| 2021/0202742 A1 | 7/2021 | Huang et al. |

* cited by examiner

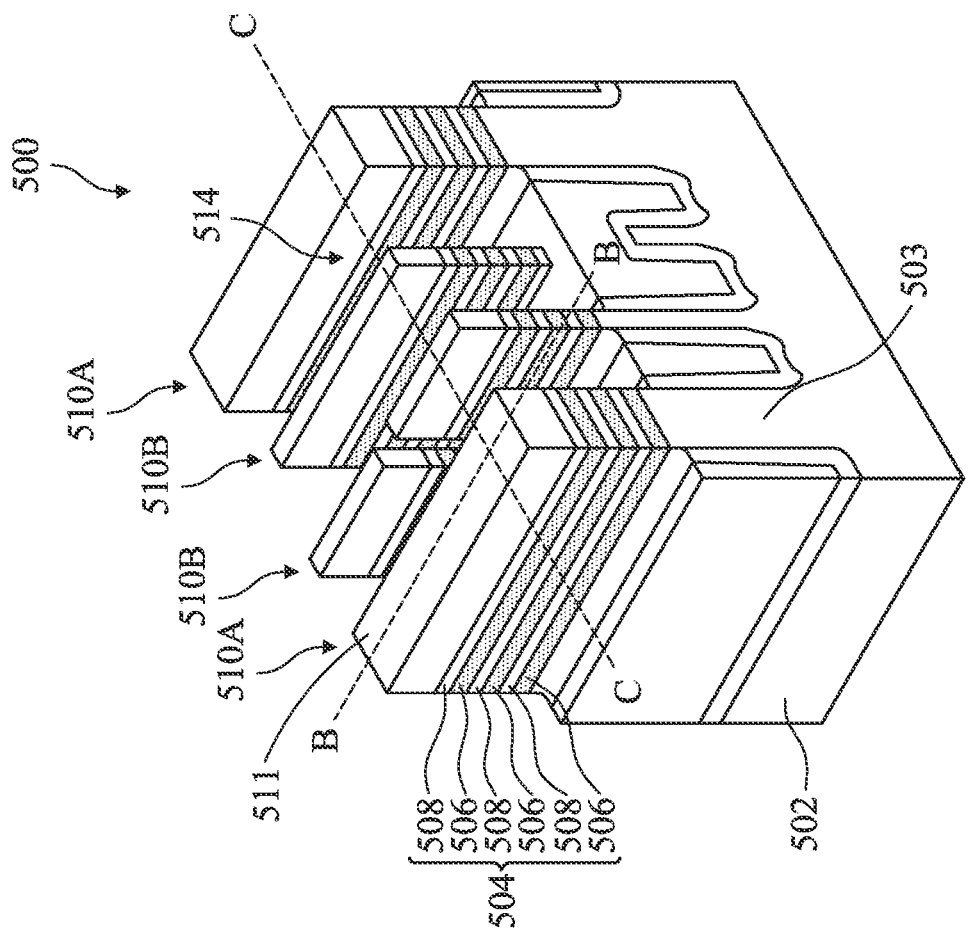
Fig. 7A
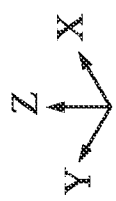

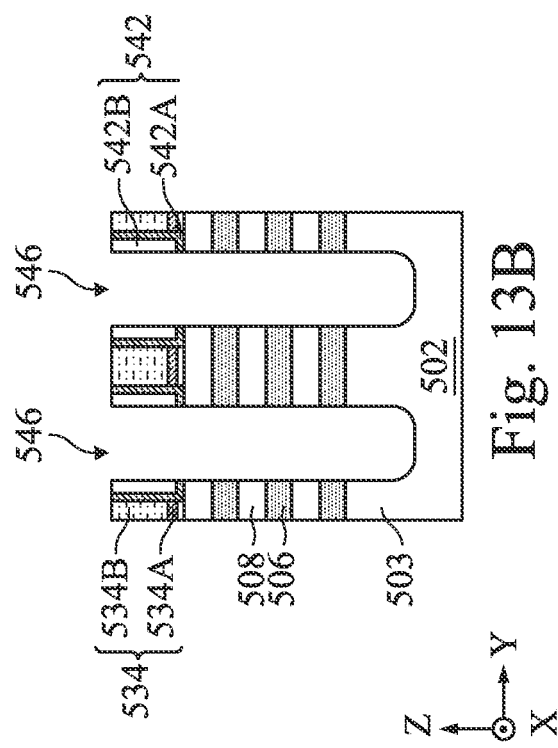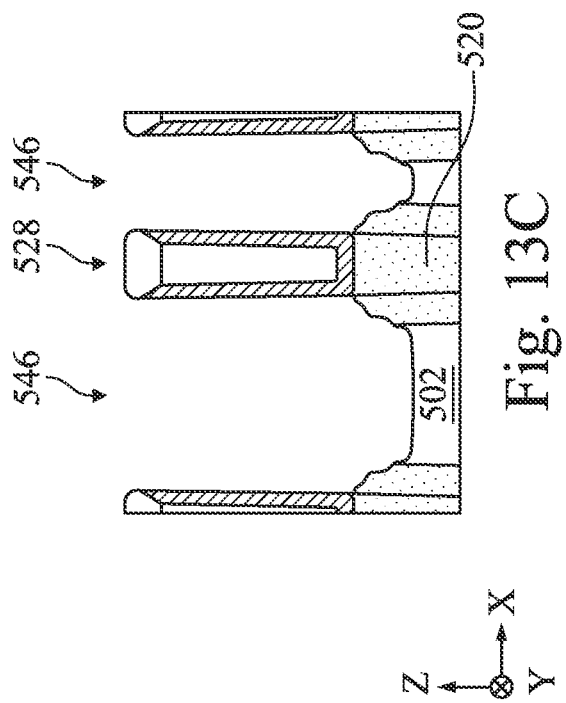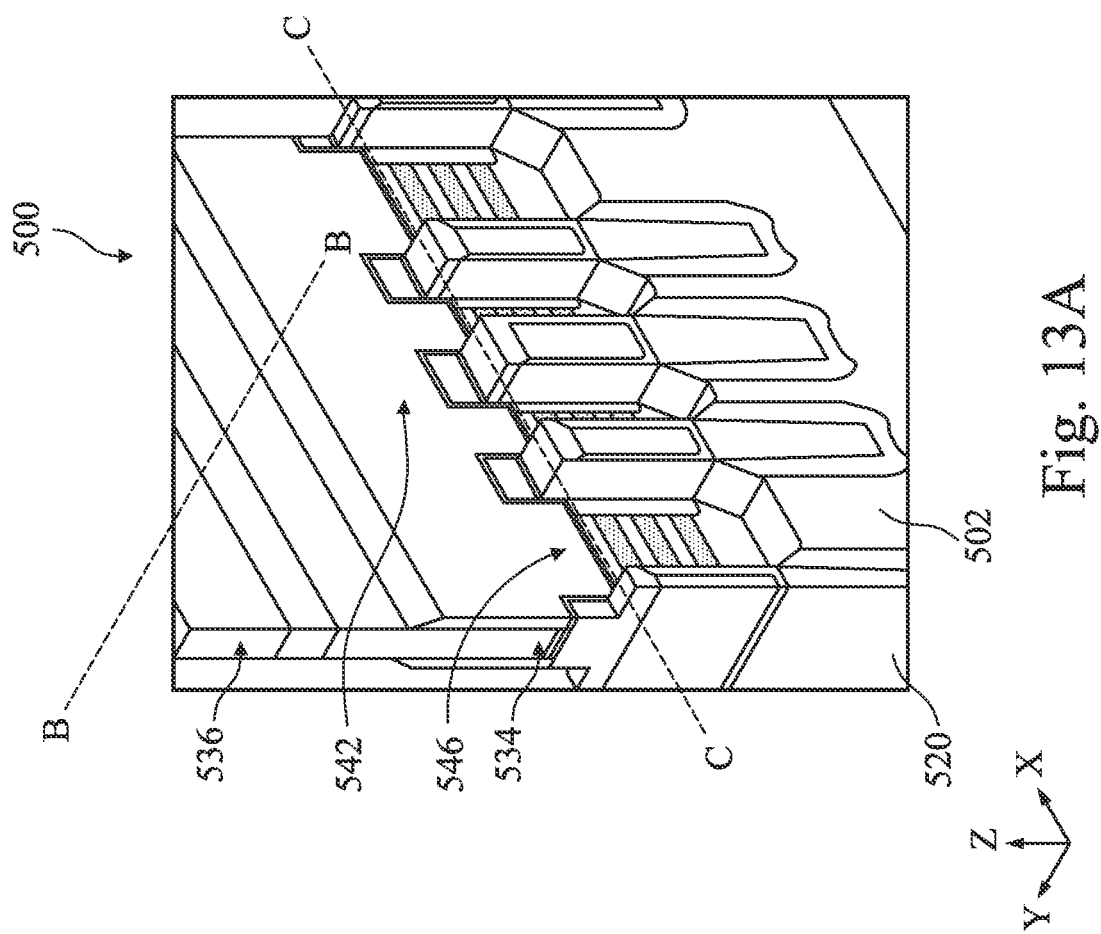

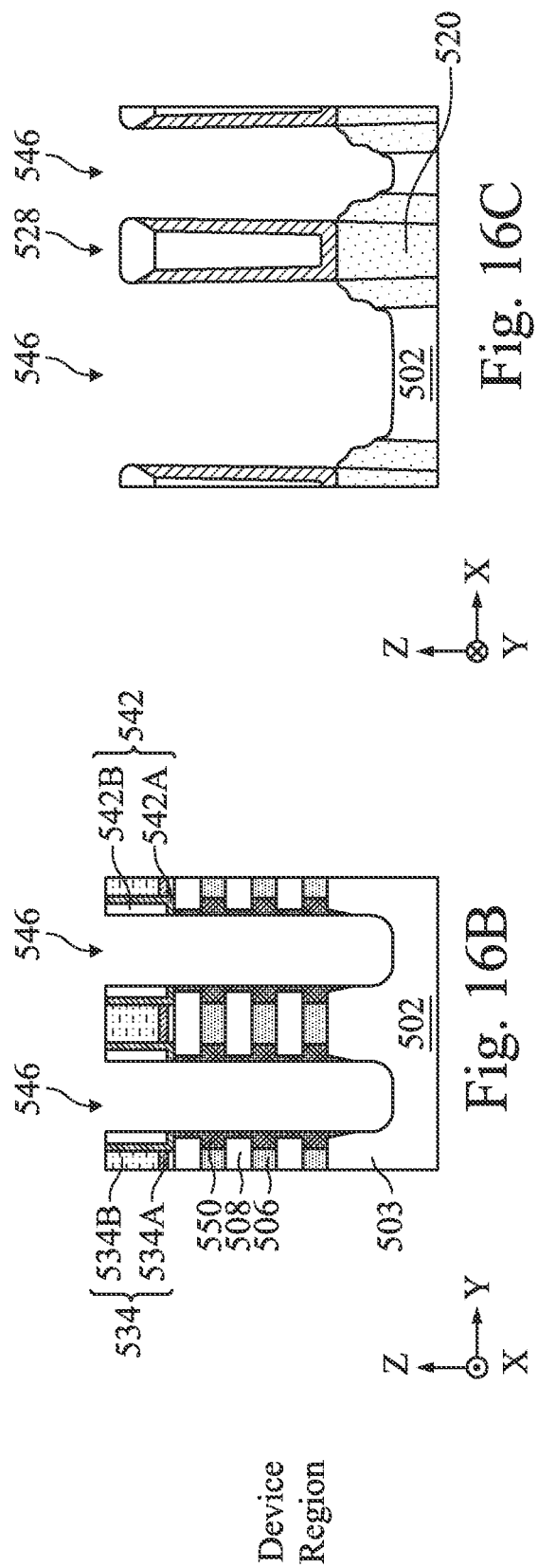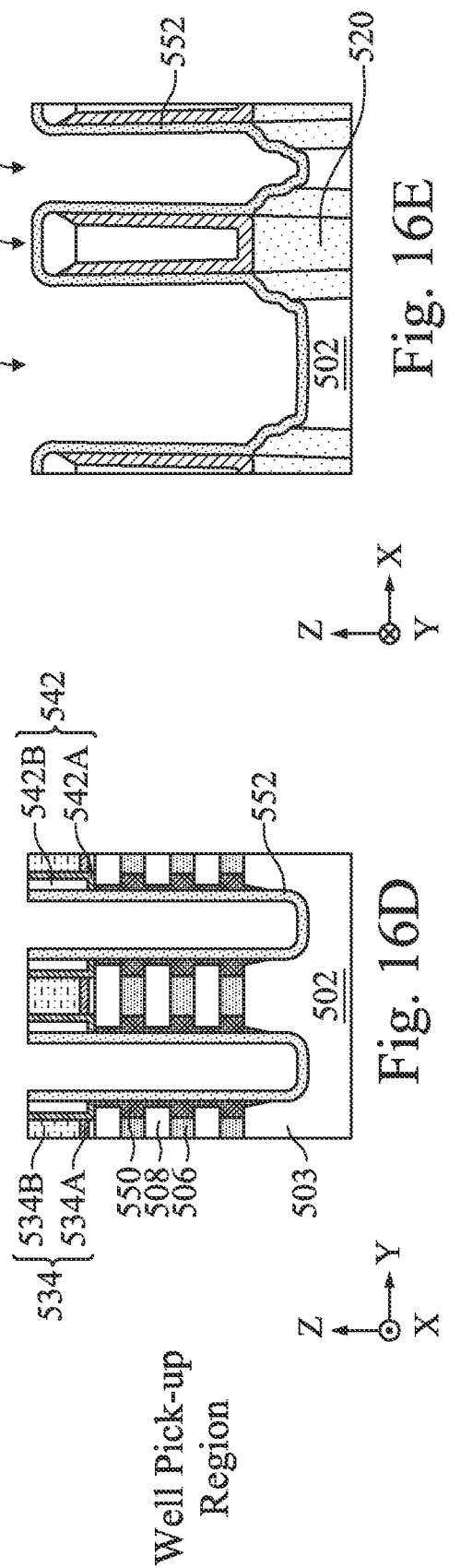

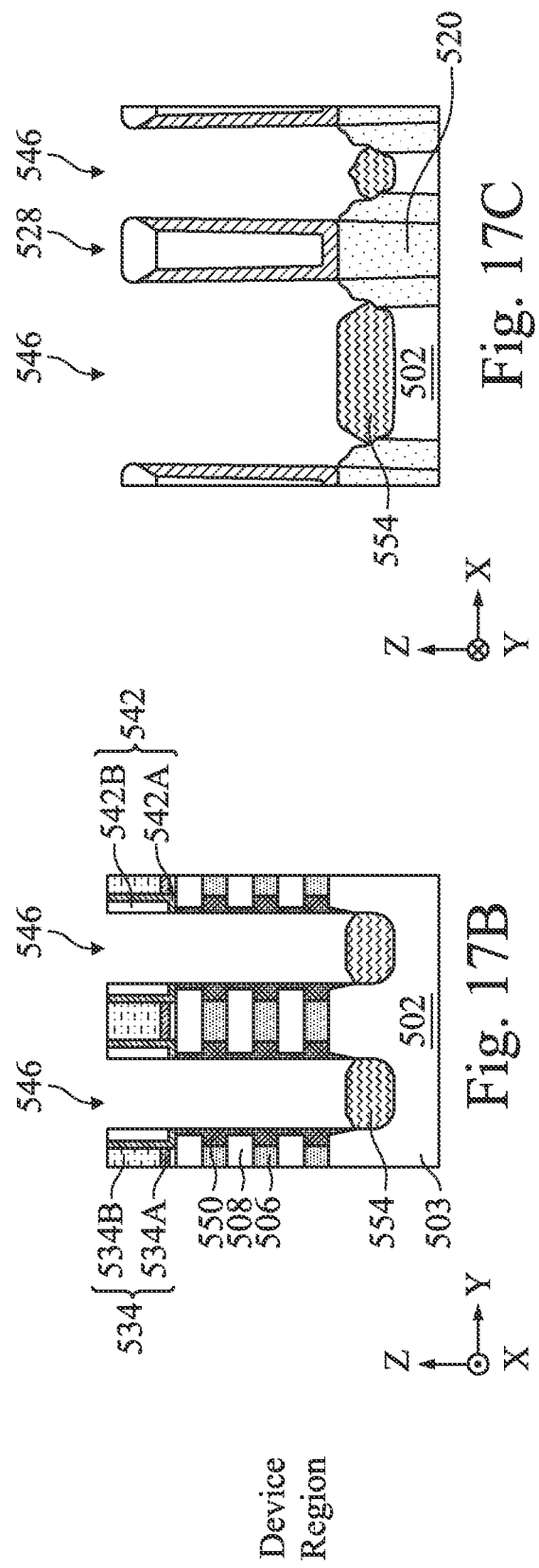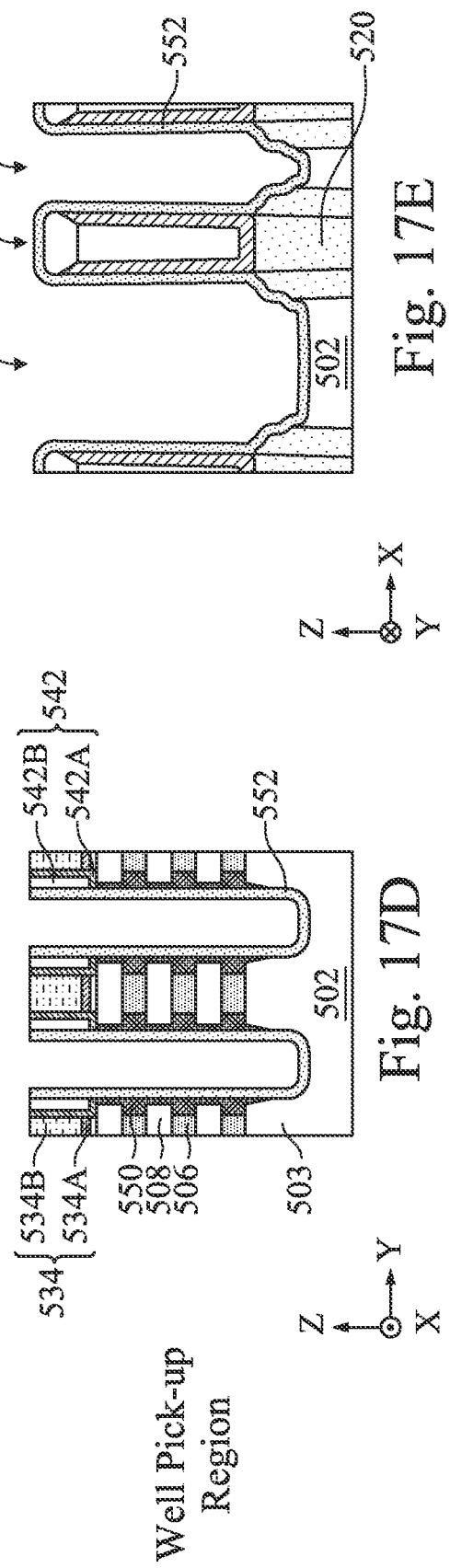

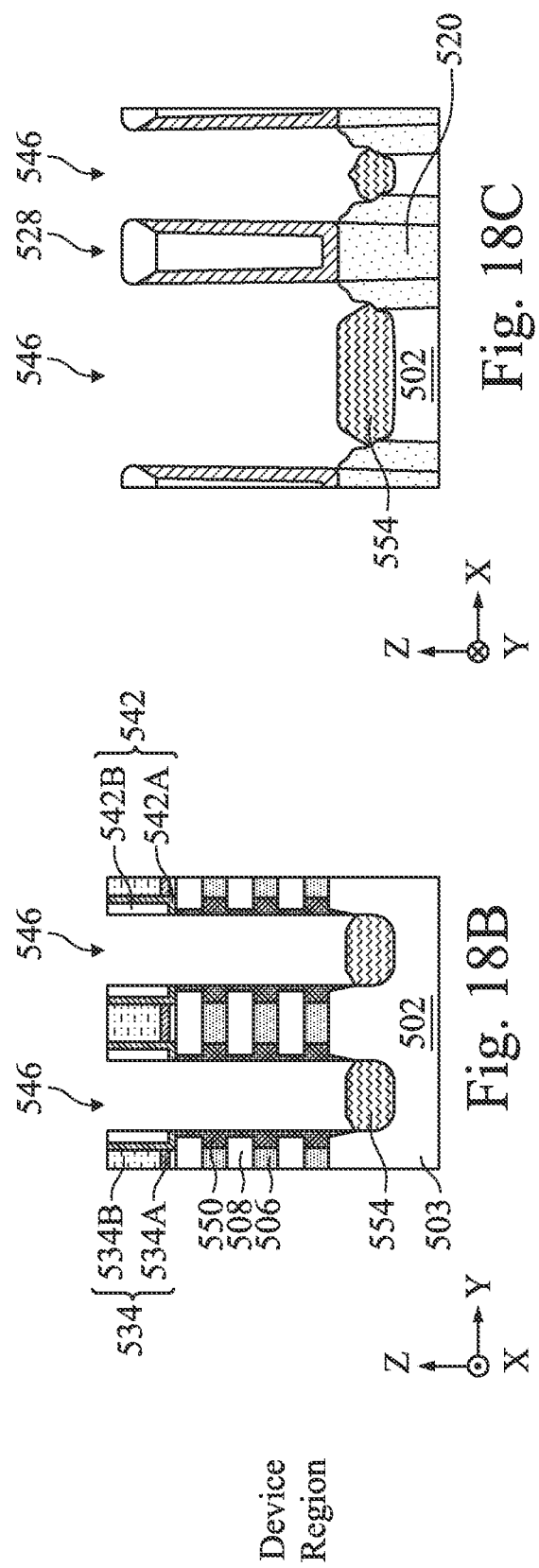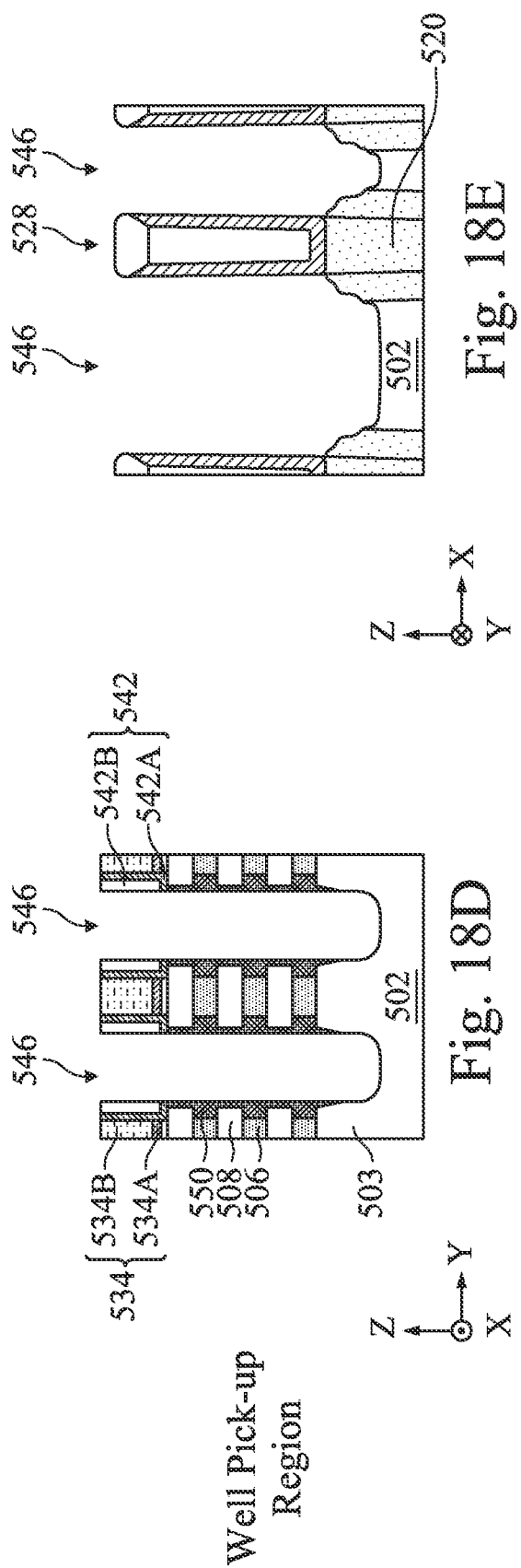

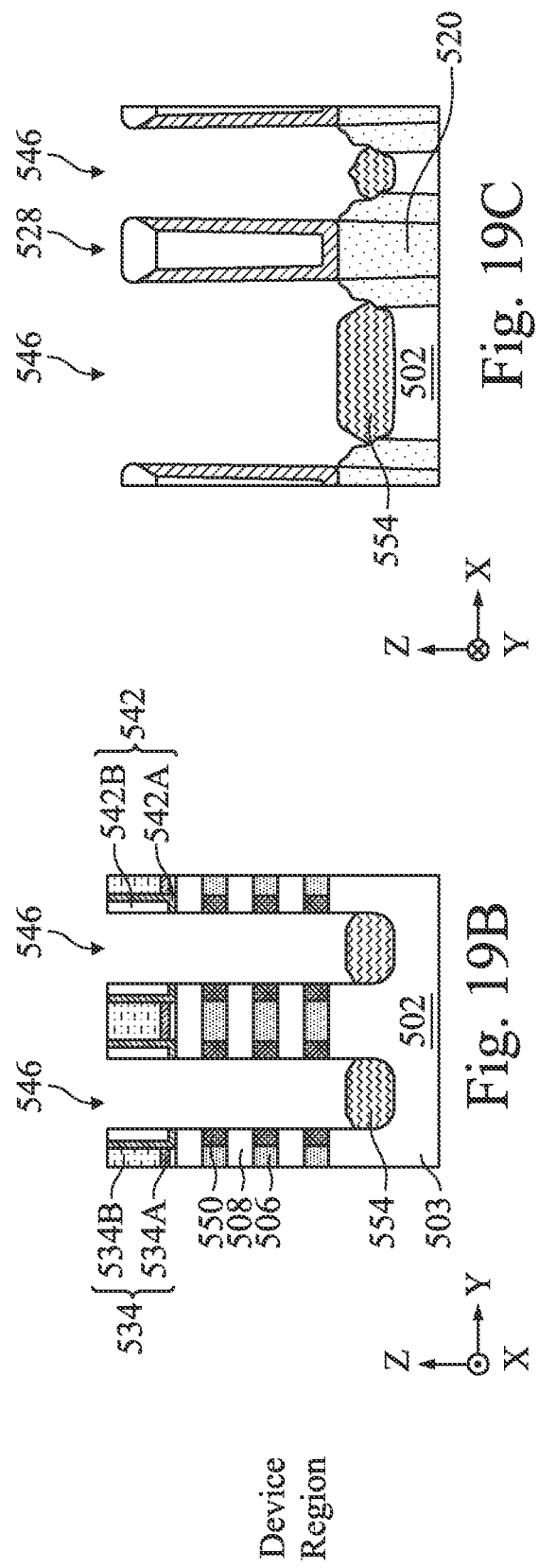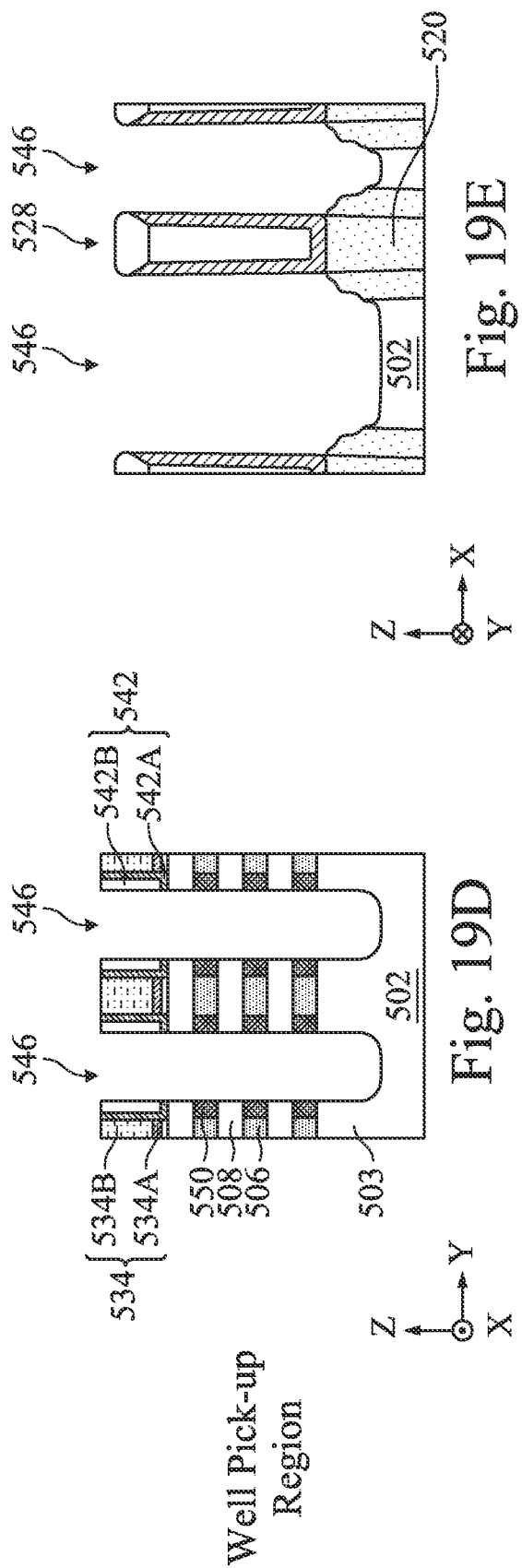

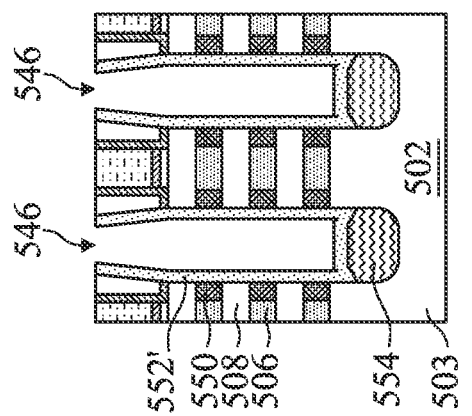
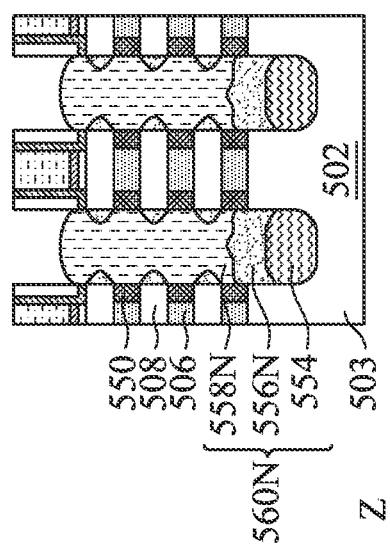
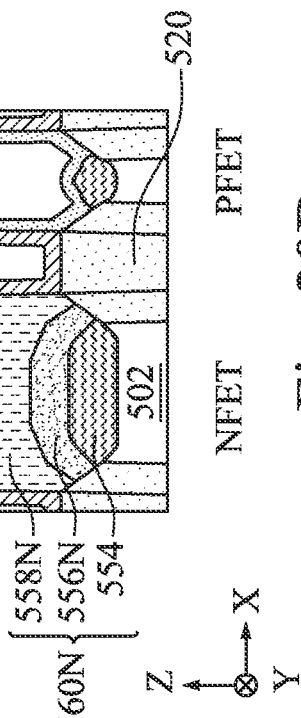
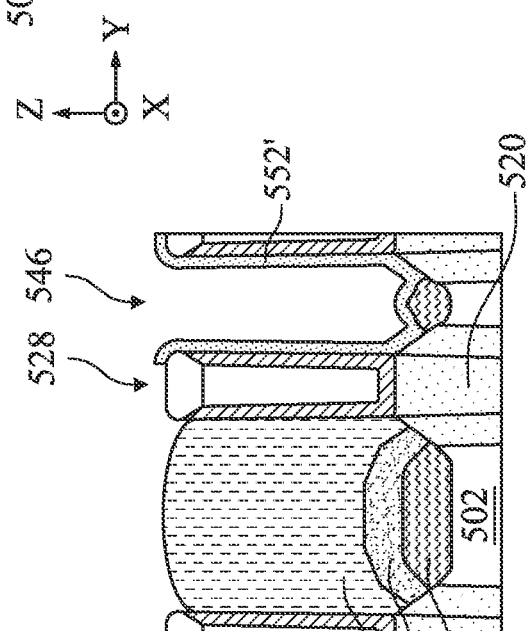
Fig. 20B
Fig. 20C
Fig. 20D

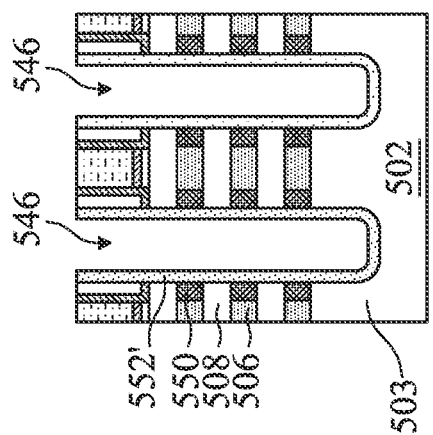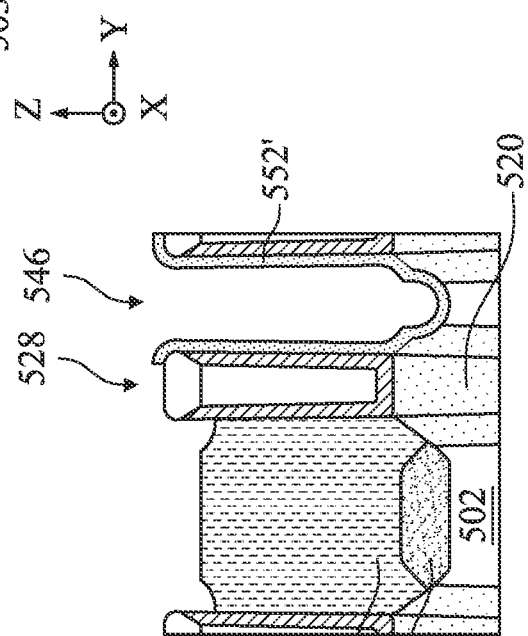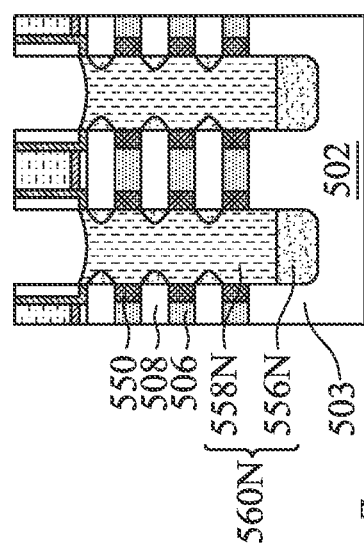
Fig. 20F
Fig. 20G
Fig. 20E

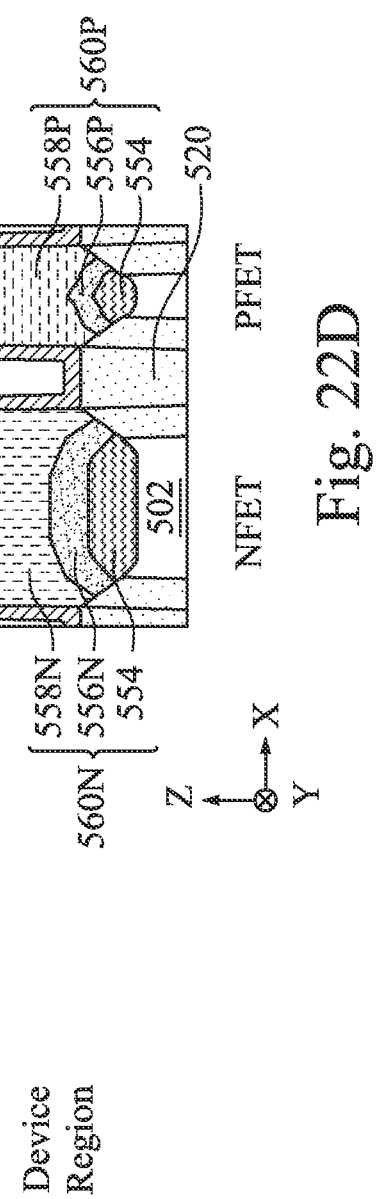
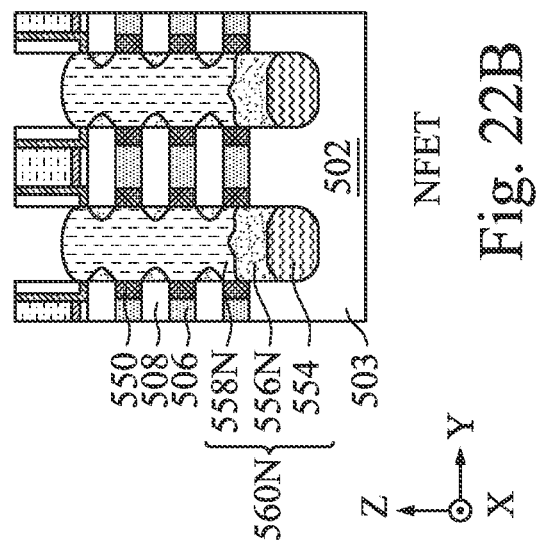

NFET

PFET

Well Pick-up Region

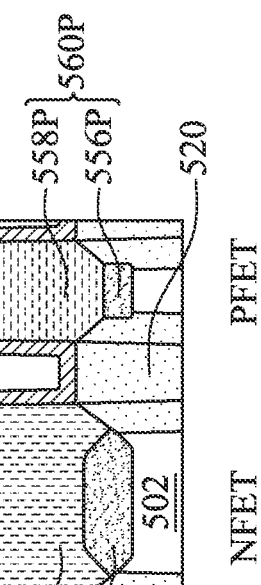
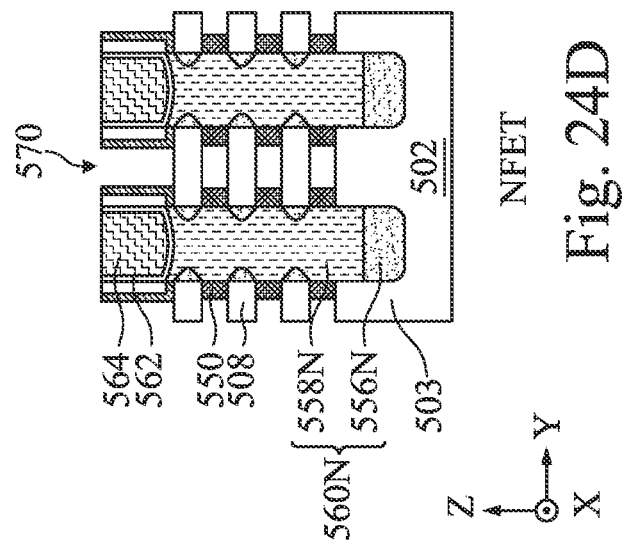
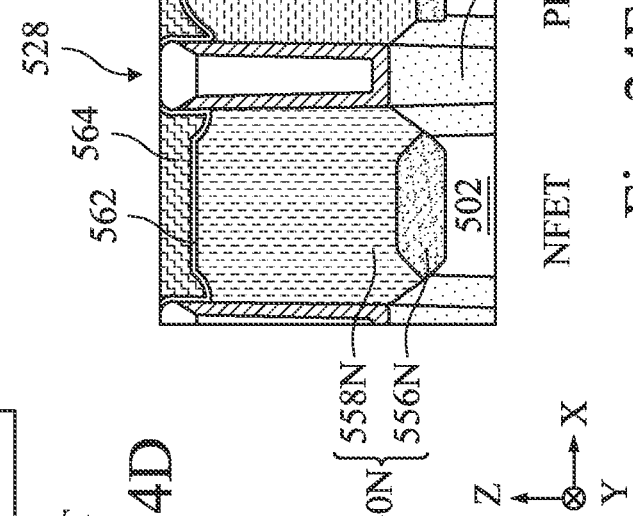

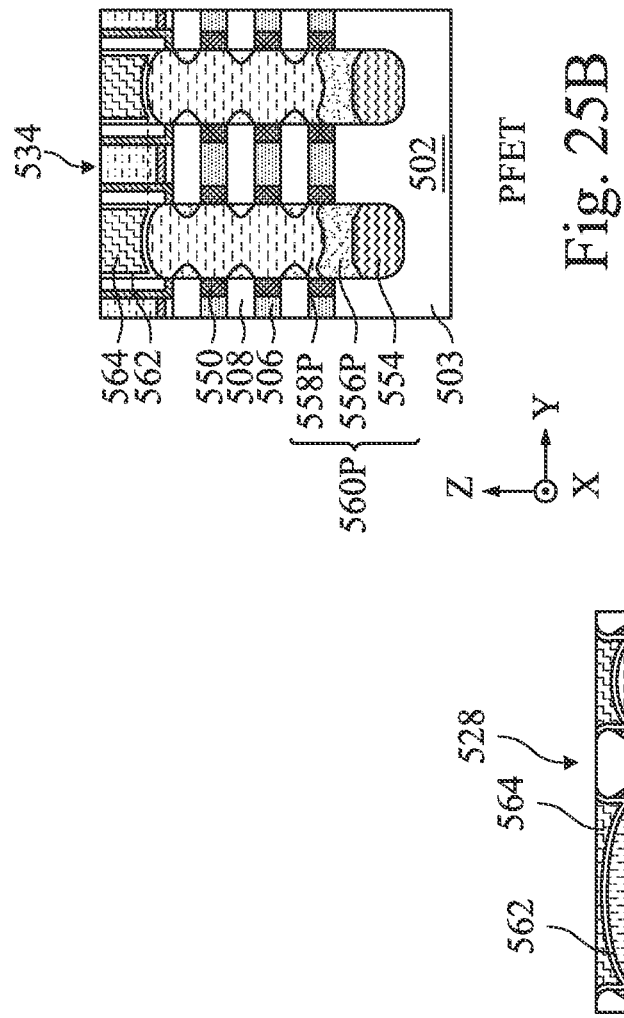
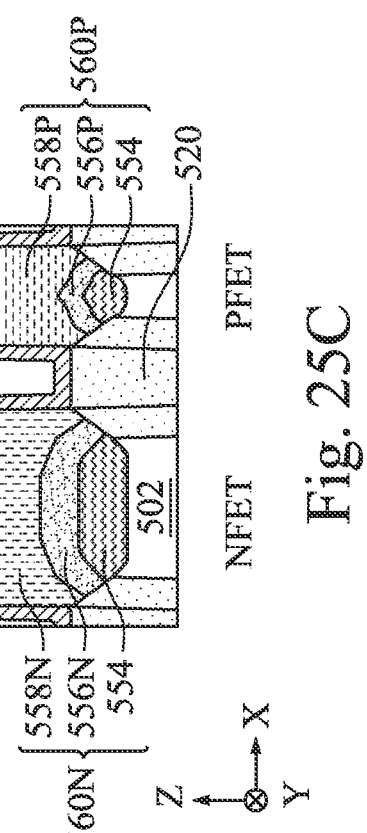
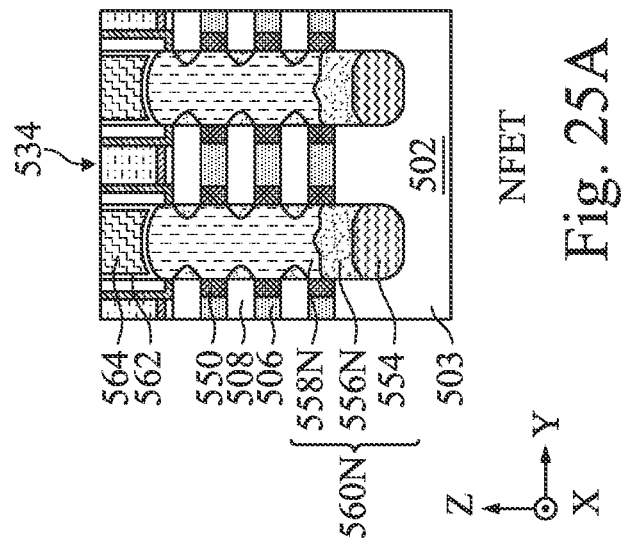
Fig. 25A / Fig. 25B / Fig. 25C

EPITAXIAL FEATURES IN SEMICONDUCTOR DEVICES AND METHOD OF FORMING THE SAME

PRIORITY DATA

This application claims priority to U.S. Provisional Patent Application No. 63/299,192 filed on Jan. 13, 2022, the entire disclosure of which is incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

For example, in memory devices, such as static random-access memory (SRAM), leakage issue becomes more severe in advanced process nodes. SRAM generally refers to a memory or a storage that can retain stored data only when power is applied. Since SRAM cell performance is largely layout dependent (for example, it has been observed that an inner SRAM cell of an SRAM macro will perform differently than an edge SRAM cell of the SRAM macro), well pick-up regions (or areas) and well strap cells have been implemented to stabilize well potential, facilitating uniform charge distribution throughout an SRAM macro, and thus uniform performance among SRAM cells of the SRAM array. However, as circuit geometry shrinks, leakage between epitaxial features of the well strap cells and substrate becomes more severe. This leads to higher pick-up resistance in well pick-up regions, which deteriorates latch-up performance. Accordingly, although existing well strap cells for SRAM arrays have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 5A, 6A, 7A, 8A, 9A, 10A, 11A, 12A, 13A, 14A, 15A, 16A, 17A, 18A, 19A, 20A, 21A, and 22A illustrate perspective views of a semiconductor device during a fabrication process according to the method of FIGS. 4A and 4B, according to aspects of the present disclosure.

FIGS. 5B, 5C, 6B, 6C, 7B, 7C, 8B, 8C, 9B, 9C, 10B, 10C, 11B, 11C, 12B, 12C, 13B, 13C, 14B, 14C, 15B, 15C, 16B, 16C, 16D, 16E, 17B, 17C, 17D, 17E, 18B, 18C, 18D, 18E, 19B, 19C, 19D, 19E, 20B, 20C, 20D, 20E, 20F, 20G, 21B, 21C, 21D, 21E, 21F, 21G, 22B, 22C, 22D, 22E, 22F, 22G, 23A, 23B, 23C, 23D, 23E, 23F, 24A, 24B, 24C, 24D, 24E, 24F, 25A, 25B, 25C, 25D, 25E, and 25F illustrate cross-sectional views of a semiconductor device during a fabrication process according to the method of FIGS. 4A and 4B, according to aspects of the present disclosure.

DETAILED DESCRIPTION

Figure 1:
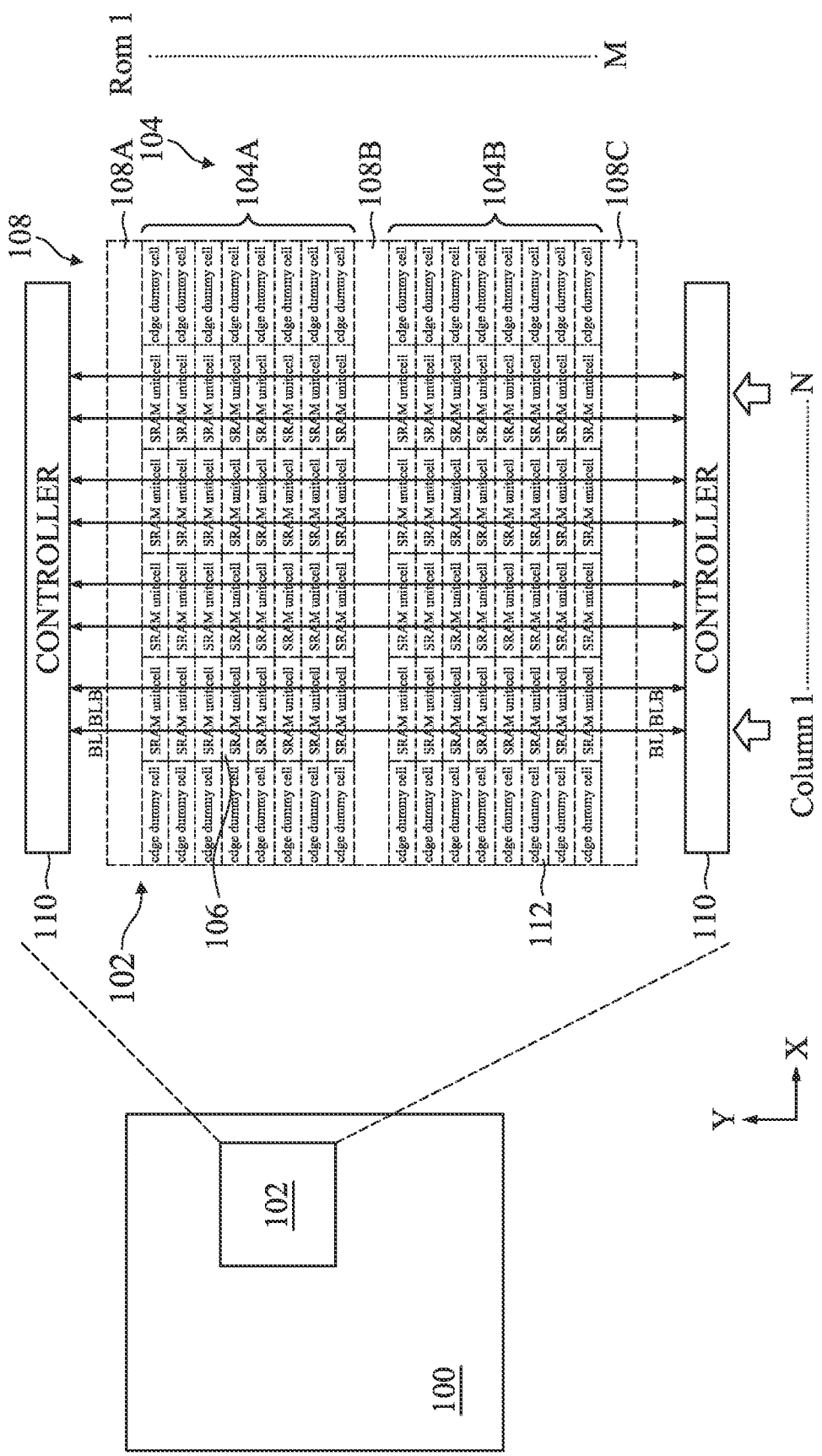
FIG. 1 is a simplified block diagram of an integrated circuit (IC) with an embedded memory macro, according to various aspects of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Still further, when a number or a range of numbers is described with "about," "approximate," and the like, the term is intended to encompass numbers that are within +/-10% of the number described, unless otherwise specified. For example, the term "about 5 nm" encompasses the dimension range from 4.5 nm to 5.5 nm.

The present disclosure is generally related to semiconductor devices and fabrication methods, and more particularly to fabricating different source/drain (S/D) epitaxial features in device regions and well pick-up regions of a memory device. For advanced IC technology nodes, fin-based structures, such as fin-like field effect transistors (FinFETs) or gate-all-around (GAA) transistors, have become a popular and promising candidate for high performance and low leakage applications. Memory arrays, such as static random access memory (SRAM) arrays, often incorporate fin-based multi-gate transistors into memory cells to enhance performance, where each memory cell can store a bit of data. Memory cell performance is largely layout dependent. For example, it has been observed that an inner memory cell of a memory array will perform differently than an edge memory cell of the memory array. In some implementations, inner memory cells and edge memory cells exhibit different threshold voltages (Vt), different on-currents (Ion), and/or a different off-currents (Ioff). Fin-based well strap cells have thus been implemented to stabilize well potential, facilitating uniform charge distribution throughout a memory array, and thus uniform performance among memory cells of the memory array. A fin-based (non-planar based) well strap (also referred to as a well pick-up) electrically connects a well region corresponding with transistors of a memory cell to a voltage node (or voltage line). For example, a fin-based n-type well strap electrically connects an n-well region corresponding with a p-type transistor to a voltage node, such as a voltage node associated with the p-type transistor; a fin-based p-type well strap electrically connects a p-well region corresponding with an n-type transistor to a voltage node, such as a voltage node associated with the n-type transistor.

As IC technologies progress towards smaller technology nodes (for example, 20 nm, 16 nm, 10 nm, 7 nm, and below), increasing impedance between S/D epitaxial features and semiconductor substrate, such as forming an undoped epitaxial layer therebetween, is beneficial to reduce leakage current between S/D epitaxial features and semiconductor substrate, which improves transistor performance in device regions. However, the increased impedance between S/D epitaxial features and semiconductor substrate in turn increases latch-up impedance in the well pick-up regions, which degrades benefits provided by fin-based well straps. The present disclosure thus proposes modifications to S/D epitaxial features in well pick-up regions without an undoped epitaxial layer, which can achieve significant improvements in latch-up performance without sacrificing transistor performance in device regions; while S/D epitaxial features in device regions include an undoped epitaxial layer above the semiconductor substrate, which helps suppressing leakage current into the semiconductor substrate.

Specific examples herein may be presented to gate-all-around (GAA) transistors, as an exemplary type of multi-gate transistors, for forming multi-gate transistors in device regions and well strap cells in well pick-up regions. A GAA transistor includes any device that has its gate structure, or portion thereof, formed on 4-sides of a channel region (e.g., surrounding a portion of a channel region). Devices presented herein also include embodiments that have channel regions disposed in nanosheet channel(s), nanowire channel(s), bar-shaped channel(s), and/or other suitable channel configuration. Presented herein are embodiments of devices that may have one or more channels (e.g., stacked nanostructures in form of nanosheets or nanowires) associated with a single, contiguous gate structure (e.g., a high-k metal gate, also referred to as HKMG). However, one of ordinary skill would recognize that the teaching can apply to a single channel or any number of channels, such as a FinFET device, on account of its fin-like structure. One of ordinary skill may recognize other examples of semiconductor devices that may benefit from aspects of the present disclosure.

FIG. 1 shows a semiconductor device 100 with a memory macro 102. The semiconductor device 100 can be, e.g., a microprocessor, an application specific integrated circuit (ASIC), a field programmable gate array (FPGA), or a digital signal processor (DSP). Further, semiconductor device 100 may be a portion of an IC chip, an SoC, or portion thereof, that includes various passive and active microelectronic devices such as resistors, capacitors, inductors, diodes, p-type field effect transistors (PFETs), n-type field effect transistors (NFETs), MOSFETs, CMOS transistors, BJTs, LDMOS transistors, high voltage transistors, high frequency transistors, other suitable components, or combinations thereof. The exact functionality of semiconductor device 100 is not a limitation to the provided subject matter. In the illustrated embodiment, memory macro 102 is a static random access memory (SRAM) macro, such as a single-port SRAM macro, a dual-port SRAM macro, or other types of SRAM macro. However, the present disclosure contemplates embodiments, where memory macro 102 is another type of memory, such as a dynamic random access memory (DRAM), a non-volatile random access memory (NVRAM), a flash memory, or other suitable memory. FIG. 1 has been simplified for the sake of clarity to better understand the inventive concepts of the present disclosure. Additional features can be added in memory macro 102, and some of the features described below can be replaced, modified, or eliminated in other embodiments of memory macro 102.

Memory macro 102 includes one or more circuit regions 104, such as circuit regions 104A and 104B in the illustrated embodiment. Circuit regions 104 contain all the memory cells 106 of memory macro 102. Circuit regions 104 are also referred to as memory cell regions 104. Memory cells 106 are generally implemented in forms of arrays in circuit regions 104. Each memory cell 106, such as an SRAM memory cell, is configured to store data. Memory cell 106 may be implemented with various PFETs and NFETs such as planar transistors or non-planar transistors. In the illustrated embodiment, memory cells 106 include various FinFETs, GAA transistors, or a combination thereof.

Memory macro 102 also includes one or more well strap regions 108, such as well strap regions 108A, 108B, and 108C oriented lengthwise along an x-direction in the illustrated embodiment. Well strap regions 108A and 108C are located at the edge of memory macro 102 and well strap region 108B is located between circuit regions 104A and 104B. Each of well strap regions 108 does not contain memory cells and is used for implementing well pick-up structures. A well pick-up structure is generally configured to electrically couple a voltage to an n-well of memory cells 106 or a p-well of memory cells 106. Well strap regions 108 are also referred to as well pick-up regions.

Further, memory macro 102 may include various contact features (or contacts), vias, and metal lines for connecting the source, drain, and gate electrodes (or terminals) of the transistors to form an integrated circuit.

Still referring to FIG. 1, memory cells 106 are arranged in column 1 to column N each extending along a first direction (here, in a y-direction) and row 1 to row M each extending along a second direction (here, in an x-direction), where N and M are positive integers. Column 1 to column N each include a bit line pair extending along the first direction, such as a bit line (BL) and a bit line bar (BLB) (also referred to as a complementary bit line), that facilitate reading data from and/or writing data to respective memory cells 106 in true form and complementary form on a column-by-column basis. Row 1 to row M each includes a word line (WL) (not shown) that facilitates access to respective memory cells 106 on a row-by-row basis. Each memory cell 106 is electrically connected to a respective BL, a respective BLB, and a respective WL, which are electrically connected to a controller 110. Controller 110 is configured to generate one or more signals to select at least one WL and at least one bit line pair (here, BL and BLB) to access at least one of memory cells 106 for read operations and/or write operations. Controller 110 includes any circuitry suitable to facilitate read/write operations from/to memory cells 106, including but not limited to, a column decoder circuit, a row decoder circuit, a column selection circuit, a row selection circuit, a read/write circuit (for example, configured to read data from and/or write data to memory cells 106 corresponding to a selected bit line pair (in other words, a selected column)), other suitable circuit, or combinations thereof. In some implementations, controller 110 includes at least one sense amplifier (not shown) configured to detect and/or amplify a voltage differential of a selected bit line pair. In some implementations, the sense amplifier is configured to latch or otherwise store data values of the voltage differential.

A perimeter of memory macro 102 is configured with dummy cells, such as edge dummy cells 112, to ensure uniformity in performance of memory cells 106. Dummy cells are configured physically and/or structurally similar to memory cells 106, but do not store data. For example, dummy cells can include p-type wells, n-type wells, fin structures (including one or more fins), gate structures, source/drain features, and/or contact features. In the illustrated embodiment, row 1 to row M each begins with an edge dummy cell 112 and ends with an edge dummy cell 112, such that row 1 to row M of memory cells 106 are disposed between two edge dummy cells 112.

Figure 2:
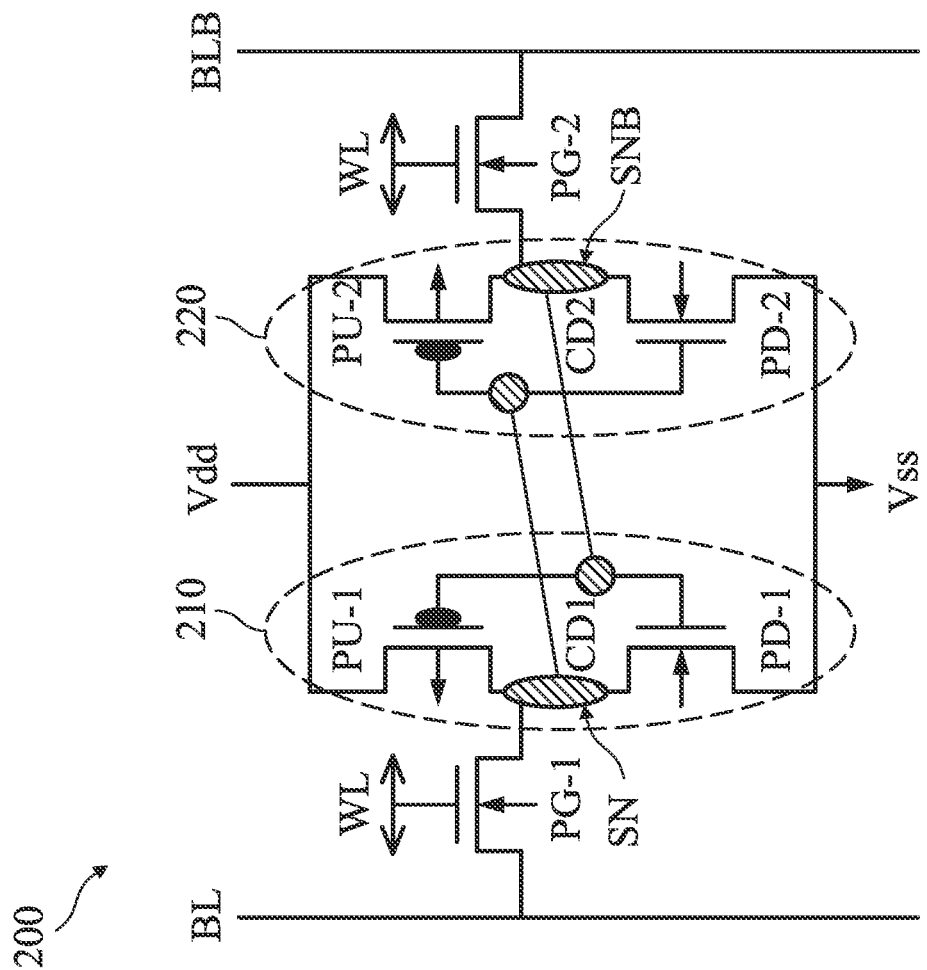
FIG. 2 is a circuit diagram of an SRAM cell, which can be implemented in a memory cell of a memory macro, according to various aspects of the present disclosure.

FIG. 2 is a circuit diagram of an exemplary SRAM cell 200, which can be implemented in a memory cell of a SRAM array, according to various aspects of the present disclosure. In some implementations, SRAM cell 200 is implemented in one or more memory cells 106 of memory macro 102 (FIG. 1). FIG. 2 has been simplified for the sake of clarity to better understand the inventive concepts of the present disclosure. Additional features can be added in single-port SRAM cell 200, and some of the features described below can be replaced, modified, or eliminated in other embodiments of SRAM cell 200.

The exemplary SRAM cell 200 includes six transistors: a pass-gate transistor PG-1, a pass-gate transistor PG-2, a pull-up transistor PU-1, a pull-up transistor PU-2, a pull-down transistor PD-1, and a pull-down transistor PD-2. Single-port SRAM cell 200 is thus alternatively referred to as a 6T SRAM cell. In operation, pass-gate transistor PG-1 and pass-gate transistor PG-2 provide access to a storage portion of SRAM cell 200, which includes a cross-coupled pair of inverters, an inverter 210 and an inverter 220. Inverter 210 includes pull-up transistor PU-1 and pull-down transistor PD-1, and inverter 220 includes pull-up transistor PU-2 and pull-down transistor PD-2. In some implementations, pull-up transistors PU-1, PU-2 are configured as p-type FinFETs, and pull-down transistors PD-1, PD-2 are configured as n-type FinFETs. For example, pull-up transistors PU-1, PU-2 each include a gate structure disposed over a channel region of an n-type fin structure (including one or more n-type fins), such that the gate structure interposes p-type source/drain regions of the n-type fin structure (for example, p-type epitaxial source/drain features), where the gate structure and the n-type fin structure are disposed over an n-type well region; and pull-down transistors PD-1, PD-2 each includes a gate structure disposed over a channel region of a p-type fin structure (including one or more p-type fins), such that the gate structure interposes n-type source/drain regions of the p-type fin structure (for example, n-type epitaxial source/drain features), where the gate structure and the p-type fin structure are disposed over a p-type well region. In some implementations, pass-gate transistors PG-1, PG-2 are also configured as n-type FinFETs. For example, pass-gate transistors PG-1, PG-2 each include a gate structure disposed over a channel region of a p-type fin structure (including one or more p-type fins), such that the gate structure interposes n-type source/drain regions of the p-type fin structure (for example, n-type epitaxial source/drain features), where the gate structure and the p-type fin structure are disposed over a p-type well region.

A gate of pull-up transistor PU-1 interposes a source (electrically coupled with a power supply voltage (VDD)) and a first common drain (CD1), and a gate of pull-down transistor PD-1 interposes a source (electrically coupled with a power supply voltage (VSS)) and the first common drain. A gate of pull-up transistor PU-2 interposes a source (electrically coupled with power supply voltage (VDD)) and a second common drain (CD2), and a gate of pull-down transistor PD-2 interposes a source (electrically coupled with power supply voltage (VSS)) and the second common drain. In some implementations, the first common drain (CD1) is a storage node (SN) that stores data in true form, and the second common drain (CD2) is a storage node (SNB) that stores data in complementary form. The gate of pull-up transistor PU-1 and the gate of pull-down transistor PD-1 are coupled with the second common drain, and the gate of pull-up transistor PU-2 and the gate of pull-down transistor PD-2 are coupled with the first common drain. A gate of pass-gate transistor PG-1 interposes a source (electrically coupled with a bit line BL) and a drain, which is electrically coupled with the first common drain. A gate of pass-gate transistor PG-2 interposes a source (electrically coupled with a complementary bit line BLB) and a drain, which is electrically coupled with the second common drain (CD2). The gates of pass-gate transistors PG-1, PG-2 are electrically coupled with a word line WL. In some implementations, pass-gate transistors PG-1, PG-2 provide access to storage nodes SN, SNB during read operations and/or write operations. For example, pass-gate transistors PG-1, PG-2 couple storage nodes SN, SNB respectively to bit lines BL, BLB in response to voltage applied to the gates of pass-gate transistors PG-1, PG-2 by WLs.

Figure 3:
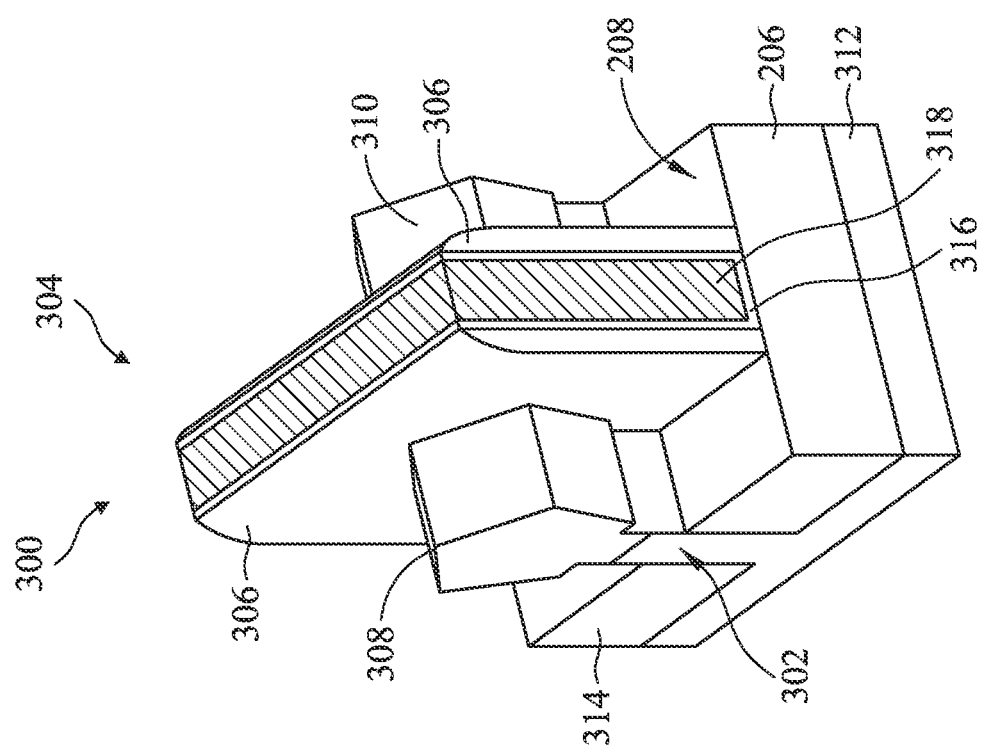
FIG. 3 is a perspective view of a multi-gate transistor, according to one or more aspects of the present disclosure.

FIG. 3 illustrates a perspective view of a fin-based multi-gate transistor 300, which may serve as any of the transistors in the SRAM cell 200 (FIG. 2), including pull-up transistor PU-1, pull-up transistor PU-2, pull-down transistor PD-1, pull-down transistor PD-2, pass-gate transistor PG-1, and pass-gate transistor PG-2. The fin-based multi-gate transistor 300 may also serve as backbones for any of the well pick-up straps in the well pick-up regions 108 (FIG. 1). In some embodiments, fin-based multi-gate transistor 300 is a FinFET. In illustrated embodiments, fin-based multi-gate transistor 300 is a GAA transistor that includes a fin-like structure having vertically-stacked horizontally-oriented channel layers (e.g., nanowires or nanosheets). In some embodiments, fin-based multi-gate transistor 300 includes a fin 302, a gate structure 304, spacers 306, a drain region 308, and a source region 310. The term "fin" as used herein refers to either a continuous fin in a FinFET or a fin-like structure having vertically-stacked channel layers in a GAA transistor. Fin 302 extends above a semiconductor substrate 312. In some embodiments, semiconductor substrate 312 and fin 302 are made of the same material. For example, the substrate is a silicon substrate. In some instances, the substrate includes a suitable elemental semiconductor, such as germanium or diamond; a suitable compound semiconductor, such as silicon carbide, gallium nitride, gallium arsenide, or indium phosphide; or a suitable alloy semiconductor, such as silicon germanium, silicon tin, aluminum gallium arsenide, or gallium arsenide phosphide. In some embodiments, the substrate is a silicon on insulator (SOI) layer substrate or a silicon on sapphire (SOS) substrate. In some embodiments, semiconductor substrate 312 and fin 302 are made of different materials.

In some embodiments, fin 302 may be surrounded by isolating features 314 formed on opposite sides of fin 302. Isolating features 314 may electrically isolate an active region (not shown) of fin-based multi-gate transistor 300 from other active regions. In some embodiments, isolating features 314 are shallow trench isolation (STI), field oxide (FOX), or another suitable electrically insulating structure.

In some embodiments, gate structure 304 includes a gate dielectric 316 and a gate electrode 318 formed over gate dielectric 316. In a FinFET, gate structure 304 is positioned over sidewalls and a top surface of fin 302. In a GAA transistor, gate structure 304 wraps around each of the channel layer (e.g., nanowire or nanosheet) in the fin-like structure. Therefore, a portion of fin 302 overlaps gate structure 304 may serve as a channel region. In some embodiments, gate dielectric 316 is a high dielectric constant (high-k) dielectric material. A high-k dielectric material has a dielectric constant (k) higher than that of silicon dioxide. Examples of high-k dielectric materials include hafnium oxide, zirconium oxide, aluminum oxide, silicon oxynitride, hafnium dioxide-alumina alloy, hafnium silicon oxide, hafnium silicon oxynitride, hafnium tantalum oxide, hafnium titanium oxide, hafnium zirconium oxide, another suitable high-k material, or a combination thereof. In some embodiments, the gate electrode 318 is made of a conductive material, such as aluminum (Al), copper (Cu), tungsten (W), titanium (Ti), tantalum (Ta), or another applicable material.

In some embodiments, spacers 306 of fin-based multi-gate transistor 300 are positioned over sidewalls and a top surface of fin 302. In addition, spacers 306 may be formed on opposite sides of gate structure 304. In some embodiments, spacers 306 are made of silicon nitride, silicon oxynitride, silicon carbide, another suitable material, or a combination thereof.

In some embodiments, portions of fin 302 that are not covered by gate structure 304 and spacers 306 serve as a drain region 308 and a source region 310. In some embodiments, drain region 308 and source region 310 of PFETs, for example, pull-up transistor PU-1 and pull-up transistor PU-2 are formed by implanting the portions of fin 302 that are not covered by gate structure 304 and spacers 306 with a p-type impurity such as boron, indium, or the like. In some embodiments, drain region 308 and source region 310 of NFETs, for example, pass-gate transistor PG-1, pass-gate transistor PG-2, pull-down transistor PD-1, and pull-down transistor PD-2 are formed by implanting the portions of fin 302 that are not covered by gate structure 304 and spacers 306 with an n-type impurity such as phosphorous, arsenic, antimony, or the like.

In some embodiments, drain region 308 and source region 310 are formed by etching portions of fin 302 that are not covered by gate structure 304 and spacers 306 to form recesses, and growing epitaxial regions in the recesses. The epitaxial regions may be formed of Si, Ge, SiP, SiC, SiPC, SiGe, SiAs, InAs, InGaAs, InSb, GaAs, GaSb, InAlP, InP, C, or a combination thereof. Accordingly, drain region 308 and source region 310 may be formed of silicon germanium (SiGe) in some exemplary embodiments, while the remaining fin 302 may be formed of silicon. In some embodiments, p-type impurities are in-situ doped in drain region 308 and source region 310 during the epitaxial growth of drain region 308 and source region 310 of PFETs, for example, pull-up transistor PU-1 and pull-up transistor PU-2 in FIG. 2. In addition, n-type impurities are in-situ doped in drain region 308 and source region 310 during the epitaxial growth of drain region 308 and source region 310 of NFETs, for example, pass-gate transistor PG-1, pass-gate transistor PG-2, pull-down transistor PD-1, and pull-down transistor PD-2 in FIG. 2.

In some alternative embodiments, pass-gate transistors PG-1/PG-2, pull-up transistors PU-1/PU-2, and pull-down transistors PD-1/PD-2 of SRAM cell 200 in FIG. 2 are planar MOS devices.

Figure 4A:
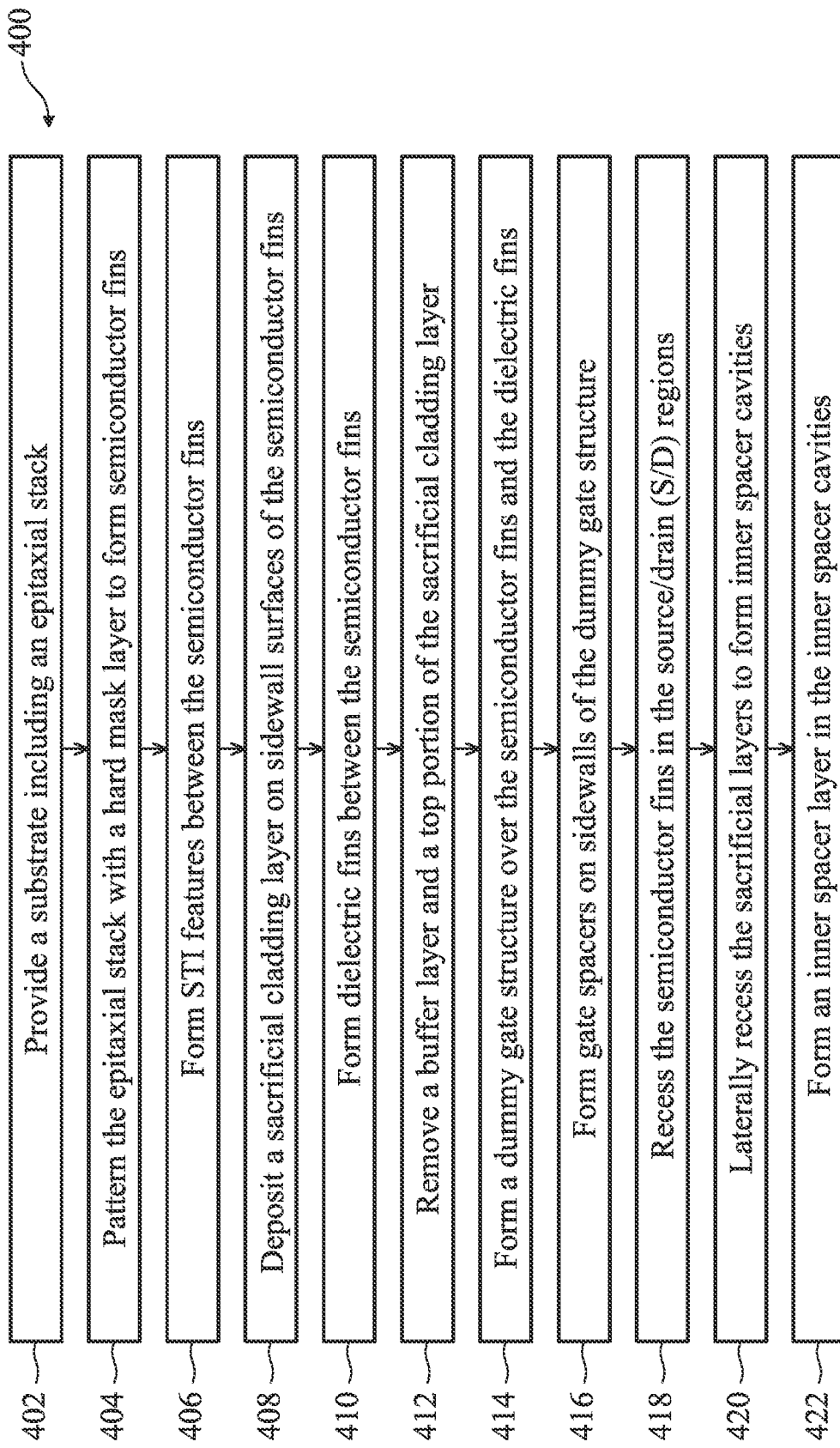
FIGS. 4A and 4B show a flow chart of a method for forming a semiconductor device, according to one or more aspects of the present disclosure.
Figure 4B:
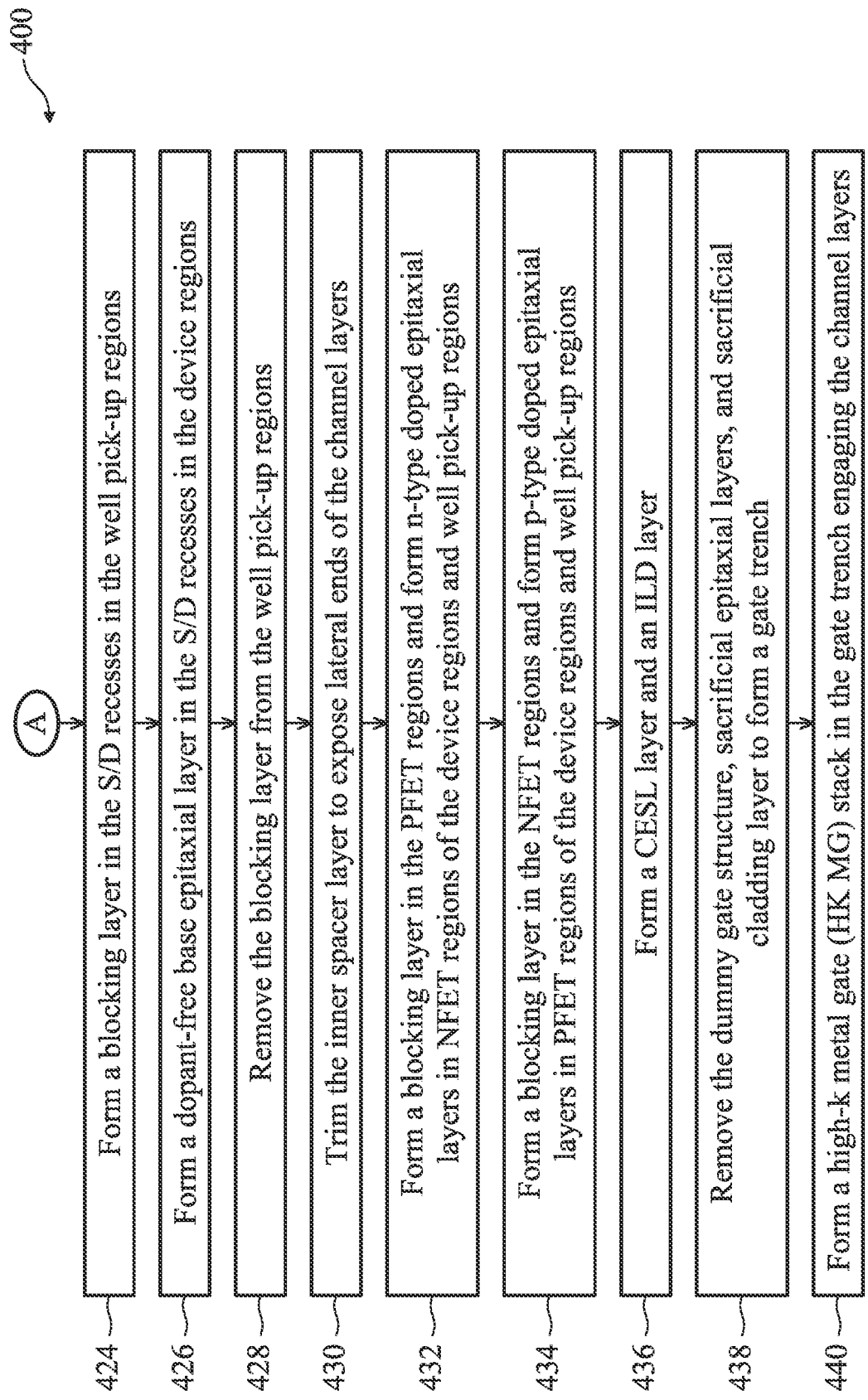

Illustrated in FIGS. 4A and 4B is a method 400 of semiconductor fabrication including fabrication of multi-gate devices in device regions and well pick-up regions of a memory device. The method 400 is merely an example, and is not intended to limit the present disclosure beyond what is explicitly recited in the claims. Additional operations can be provided before, during, and after the method 400, and some operations described can be replaced, eliminated, or moved around for additional embodiments of the method. The method 400 is described below in conjunction with FIGS. 5A-25F.

FIGS. 5A, 6A, 7A, 8A, 9A, 10A, 11A, 12A, 13A, 14A, and 15A represent perspective views of either a device region or a well pick-up region of a semiconductor device 500 according to various stages of the method 400 of FIGS. 4A and 4B.

FIGS. 16A, 17A, 18A, 19A, 20A, 21A, and 22A represent perspective views of a device region of a semiconductor device 500 according to various stages of the method 400 of FIGS. 4A and 4B.

FIGS. 5B, 6B, 7B, 8B, 9B, 10B, 11B, 12B, 13B, 14B, 15B, 16B, 17B, 18B, and 19B are cross-sectional views taken in the Y-Z plane along the B-B line in the corresponding figures numbered with suffix "A", which cut through a channel region and adjacent source/drain regions of a multi-gate device in either NFET region or PFET region.

FIGS. 5C, 6C, 7C, 8C, 9C, 10C, 12C, 13C, 14C, 15C, 16C, 17C, 18C, and 19C are cross-sectional views taken in the X-Z plane along the C-C line in the corresponding figures numbered with suffix "A", which cut through a source/drain (S/D) region of an NFET and an S/D region of a PFET and perpendicular to a lengthwise direction of channel regions of a multi-gate device.

Figure 11A:
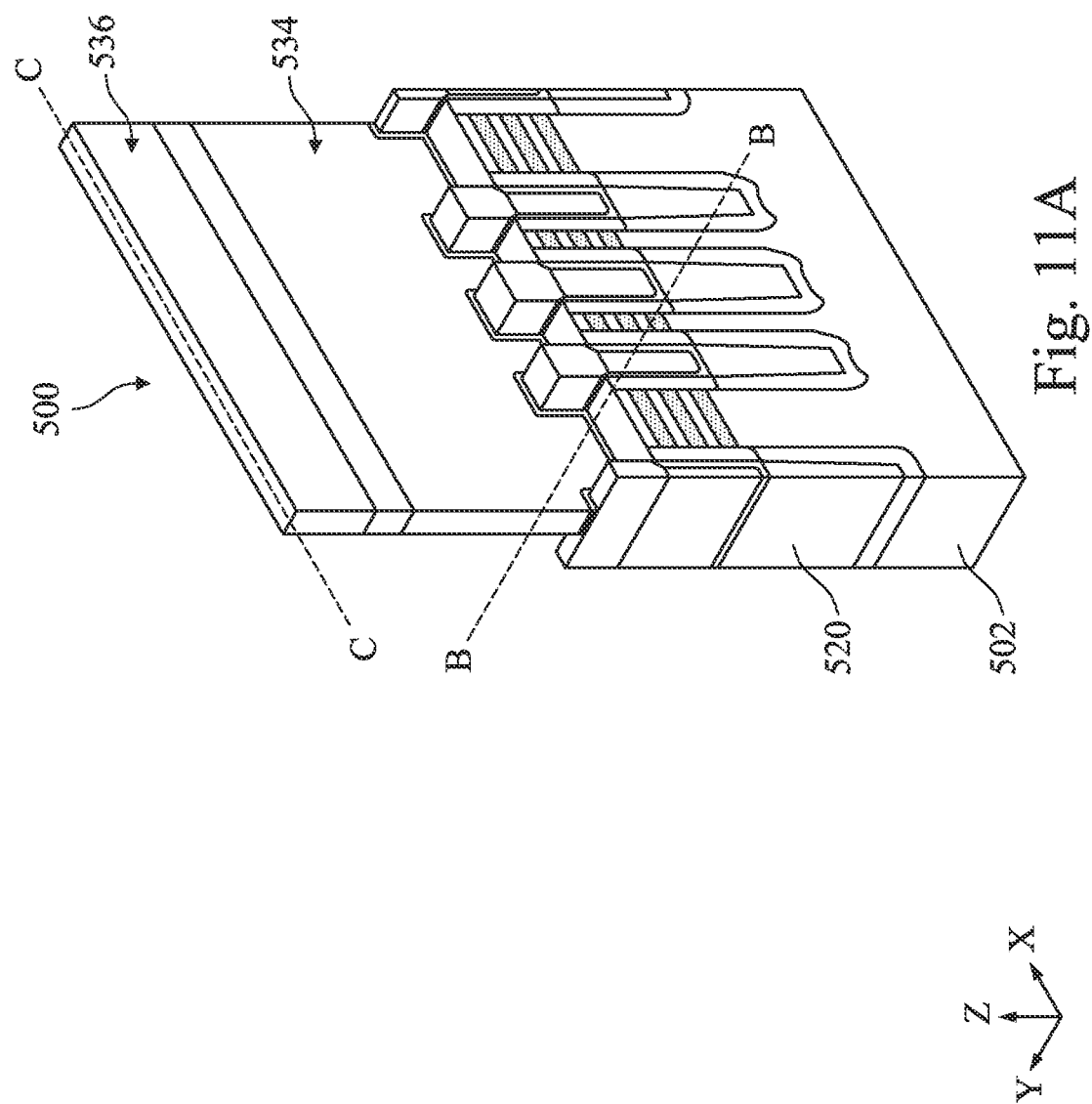
Figure 11C:
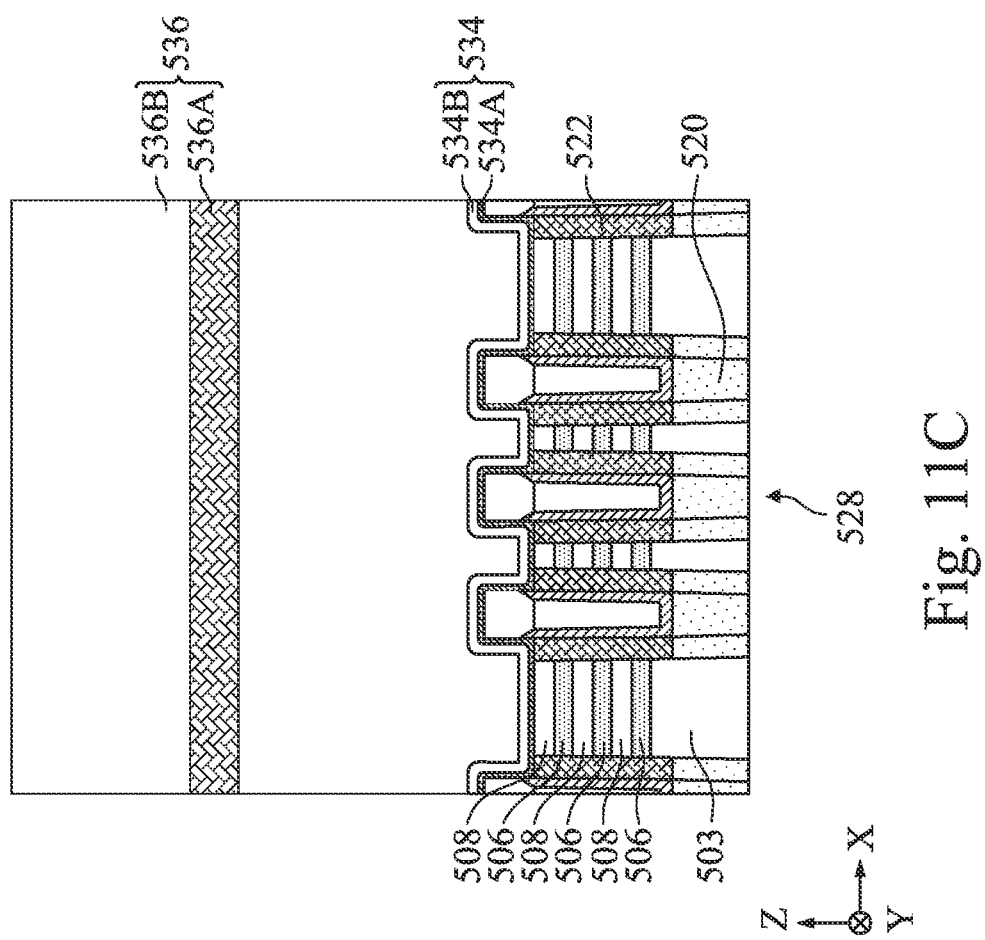

FIG. 11C is a cross-sectional view taken in the X-Z plane along the C-C line in the corresponding figure numbered with suffix "A", which cut through a gate structure of an NFET and a PFET and perpendicular to a lengthwise direction of channel regions of a multi-gate device.

FIGS. 16D, 17D, 18D, and 19D are cross-sectional views taken in the Y-Z plane, which cut through a channel region and adjacent source/drain regions of a multi-gate device in either NFET region or PFET region of a well pick-up region.

Figure 21A:
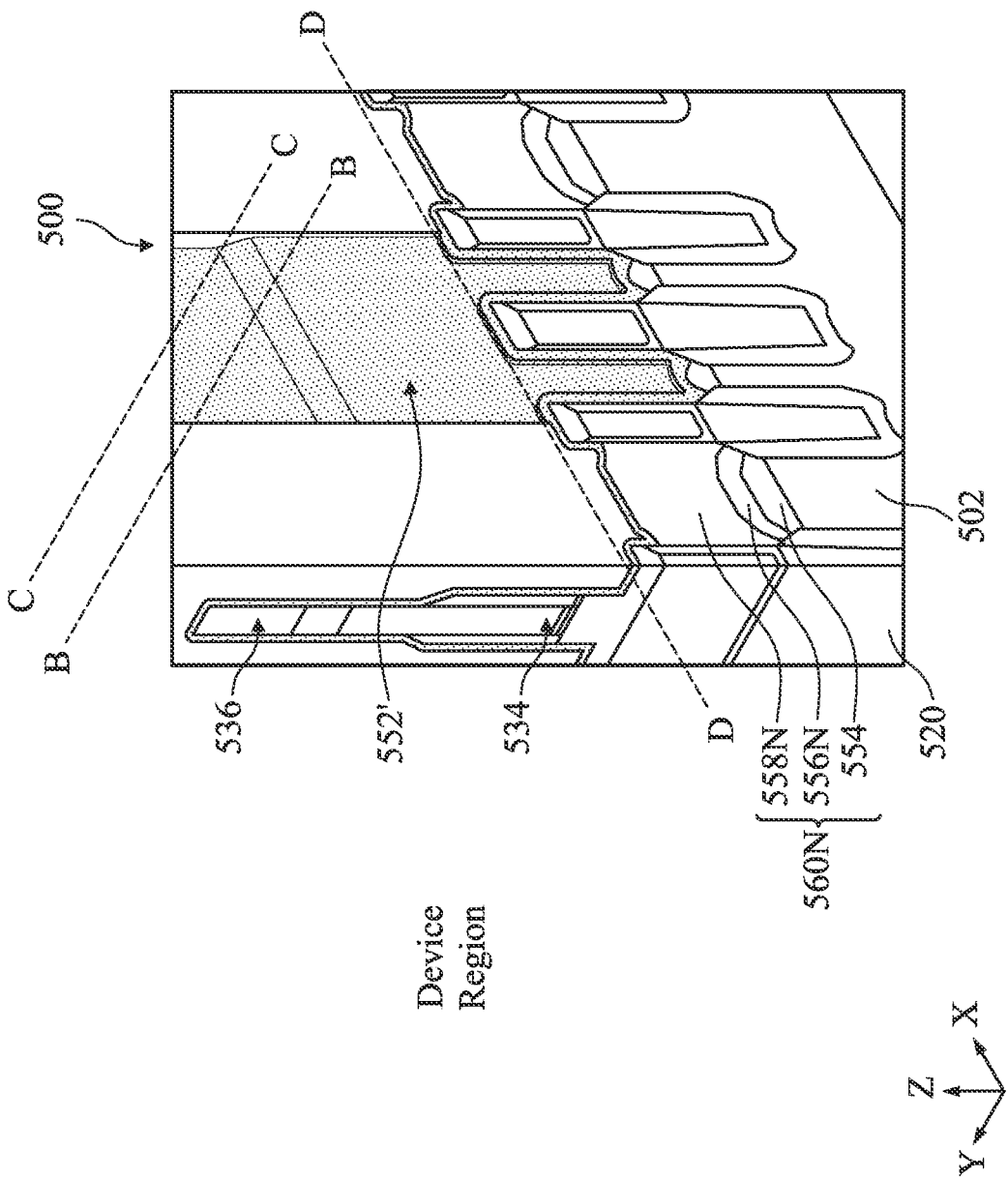
Figure 21B:
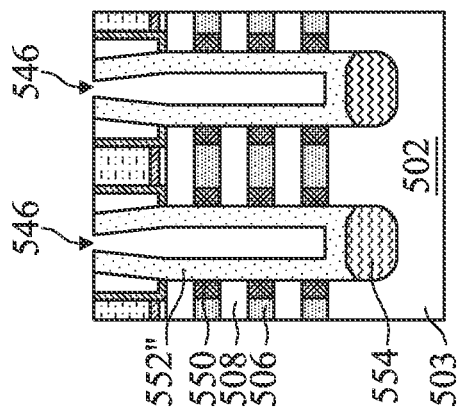

FIGS. 20B, 21B, and 22B are cross-sectional views taken in the Y-Z plane along the B-B line in the corresponding figures numbered with suffix "A", which cut through a channel region and adjacent source/drain regions of a multi-gate device in an NFET region of a device region.

Figure 21C:
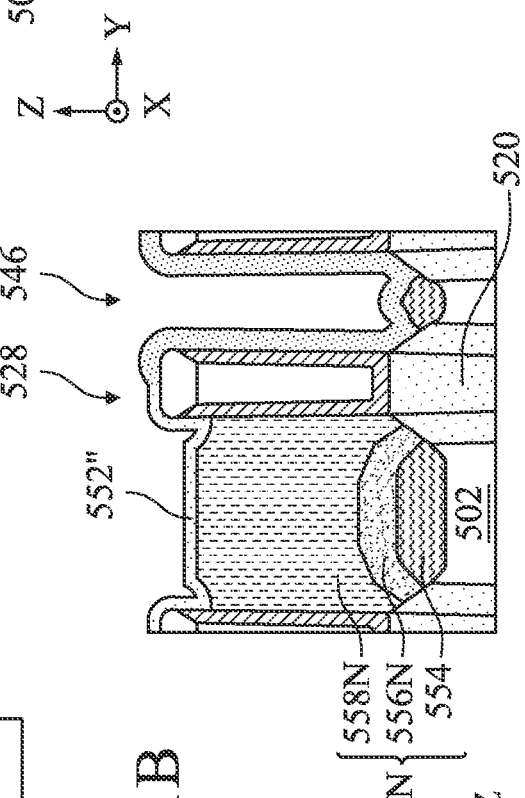

FIGS. 20C, 21C, and 22C are cross-sectional views taken in the Y-Z plane along the C-C line in the corresponding figures numbered with suffix "A", which cut through a channel region and adjacent source/drain regions of a multi-gate device in a PFET region of a device region.

Figure 21D:
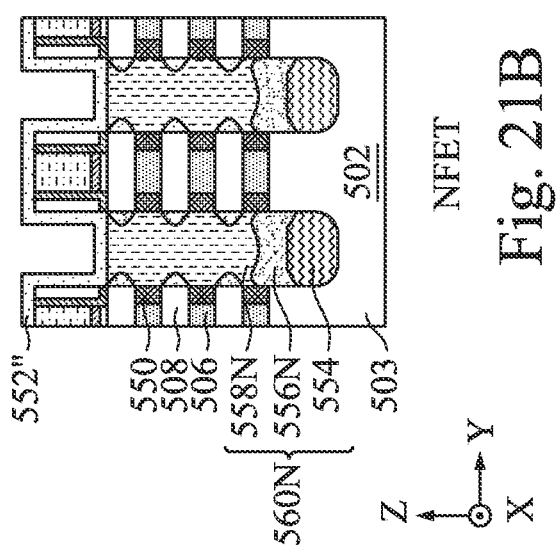

FIGS. 20D, 21D, and 22D are cross-sectional views taken in the X-Z plane along the D-D line in the corresponding figures numbered with suffix "A", which cut through an S/D region of an NFET and an S/D region of a PFET and perpendicular to a lengthwise direction of channel regions of a multi-gate device in a device region.

Figure 21F:
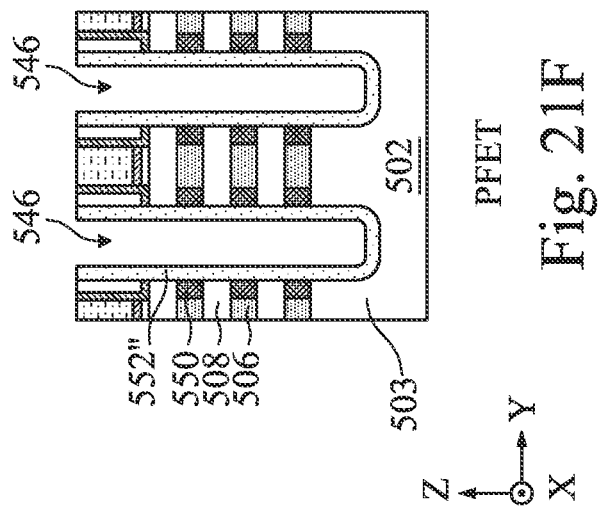
Figure 21E:
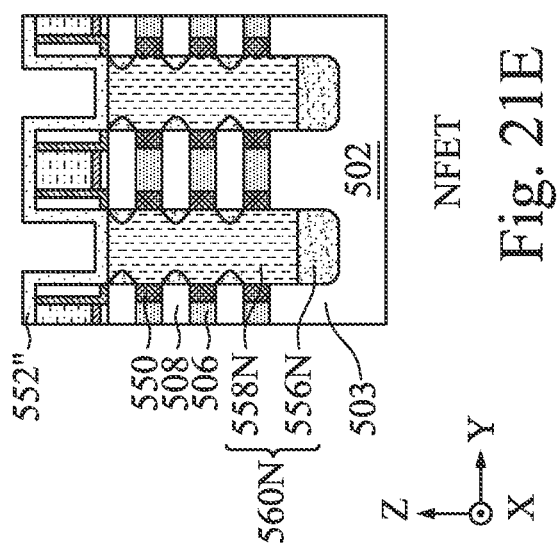
Figure 22A:
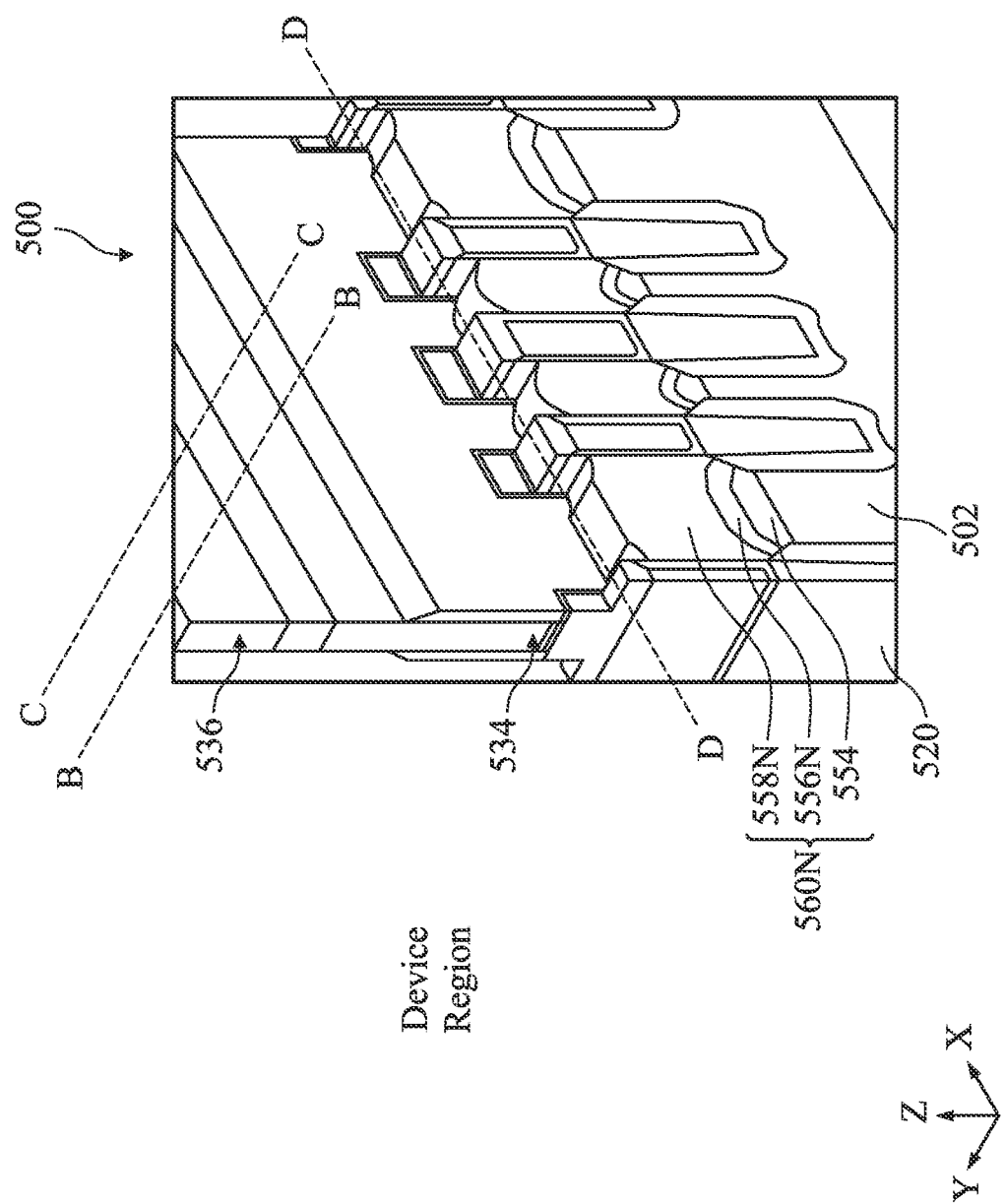
Figure 22F:
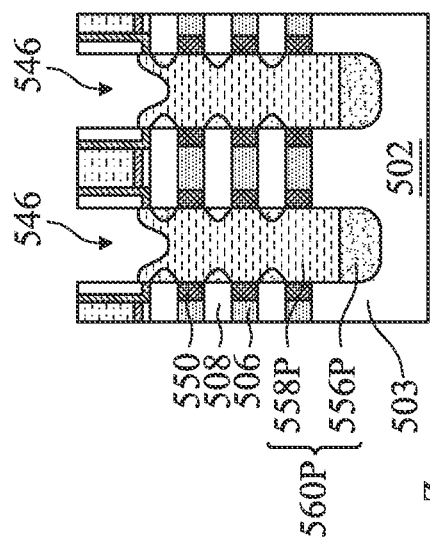
Figure 22G:
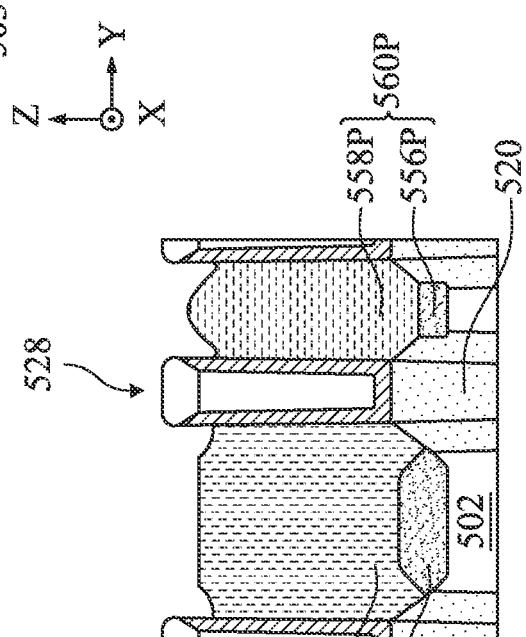
Figure 22E:
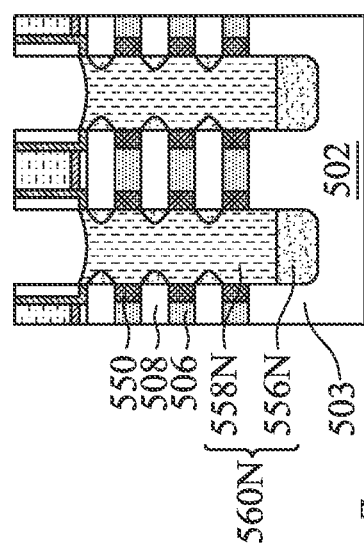

FIGS. 20E, 21E, and 22E are cross-sectional views taken in the Y-Z plane, which cut through a channel region and adjacent source/drain regions of a multi-gate device in an NFET region of a well pick-up region.

FIGS. 20F, 21F, and 22F are cross-sectional views taken in the Y-Z plane, which cut through a channel region and adjacent source/drain regions of a multi-gate device in a PFET region of a well pick-up region.

Figure 21G:
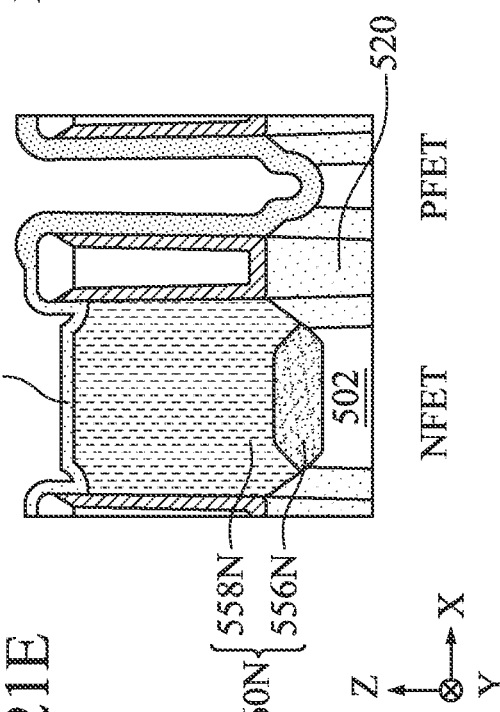

FIGS. 20G, 21G, and 22G are cross-sectional views taken in the X-Z plane, which cut through an S/D region of an NFET and an S/D region of a PFET and perpendicular to a lengthwise direction of channel regions of a multi-gate device in a well pick-up region.

Figure 23A:
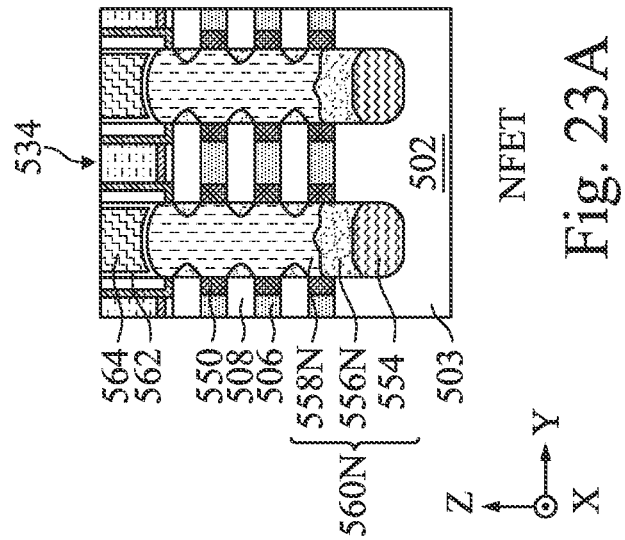
Figure 24A:

FIGS. 23A, 24A, and 25A are cross-sectional views taken in the Y-Z plane, which cut through a channel region and adjacent source/drain regions of a multi-gate device in an NFET region of a device region, according to various stages of the method 400 of FIGS. 4A and 4B.

Figure 23C:
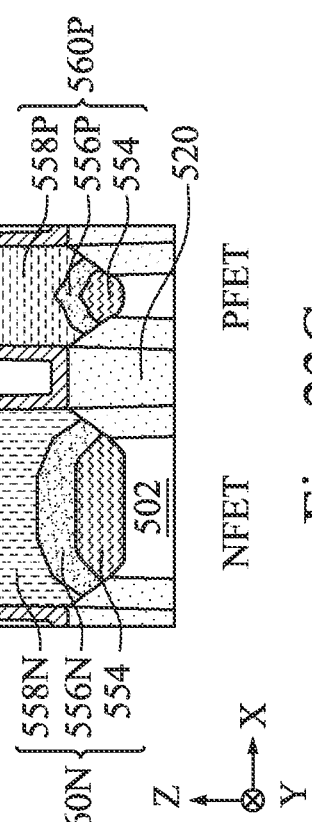
Figure 23B:
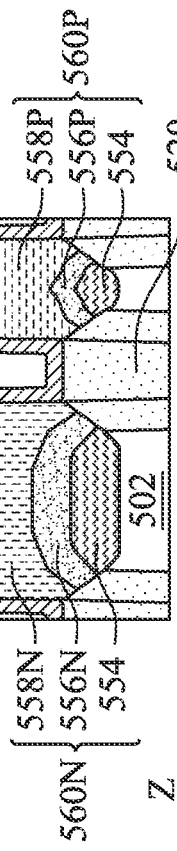
Figure 24B:
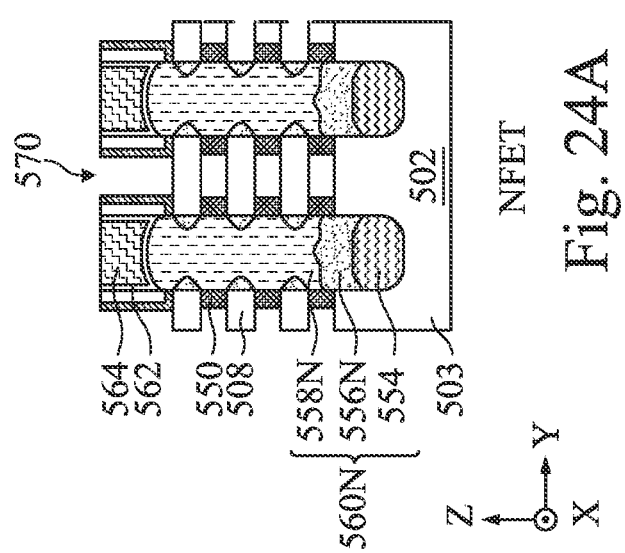

FIGS. 23B, 24B, and 25B are cross-sectional views taken in the Y-Z plane, which cut through a channel region and adjacent source/drain regions of a multi-gate device in a PFET region of a device region, according to various stages of the method 400 of FIGS. 4A and 4B.

Figure 24C:
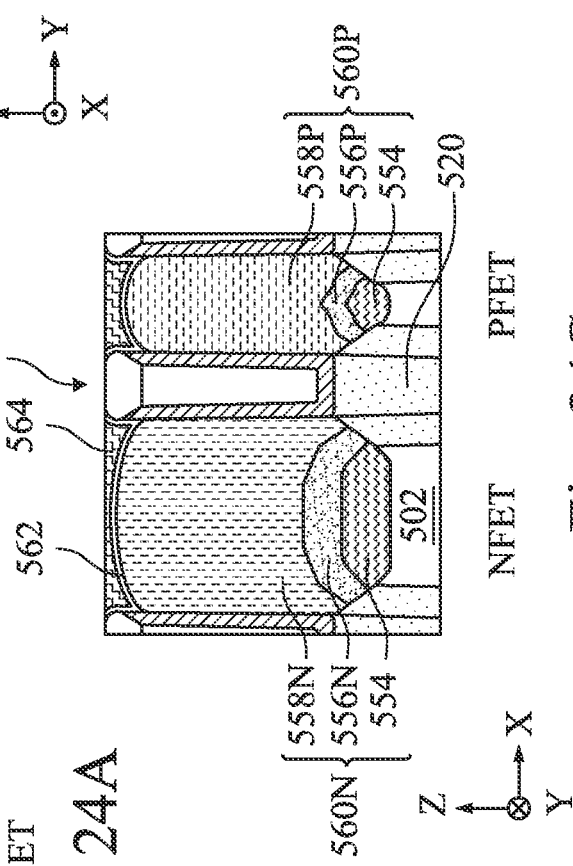

FIGS. 23C, 24C, and 25C are cross-sectional views taken in the X-Z plane, which cut through an S/D region of an NFET and an S/D region of a PFET and perpendicular to a lengthwise direction of channel regions of a multi-gate device in a device region, according to various stages of the method 400 of FIGS. 4A and 4B.

Figure 23D:
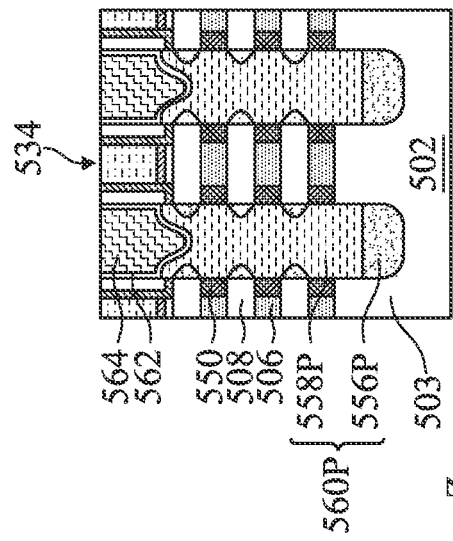
Figure 25E:
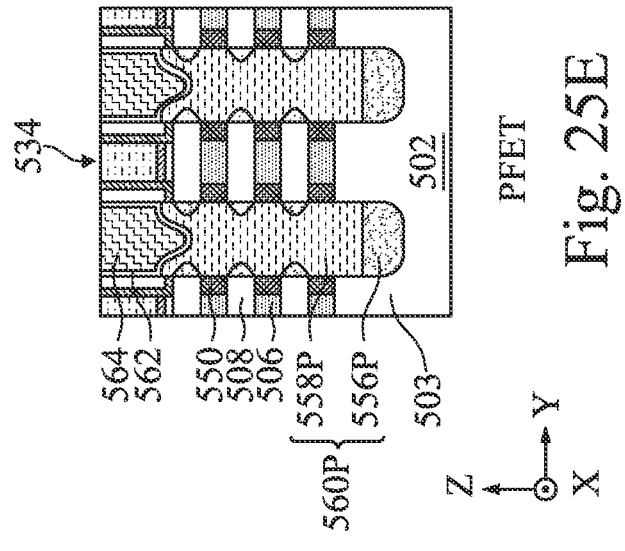
Figure 25D:
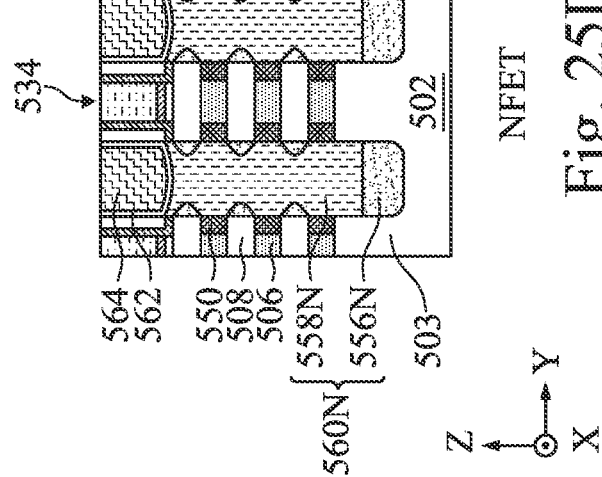

FIGS. 23D, 24D, and 25D are cross-sectional views taken in the Y-Z plane, which cut through a channel region and adjacent source/drain regions of a multi-gate device in an NFET region of a well pick-up region, according to various stages of the method 400 of FIGS. 4A and 4B.

Figure 23E:
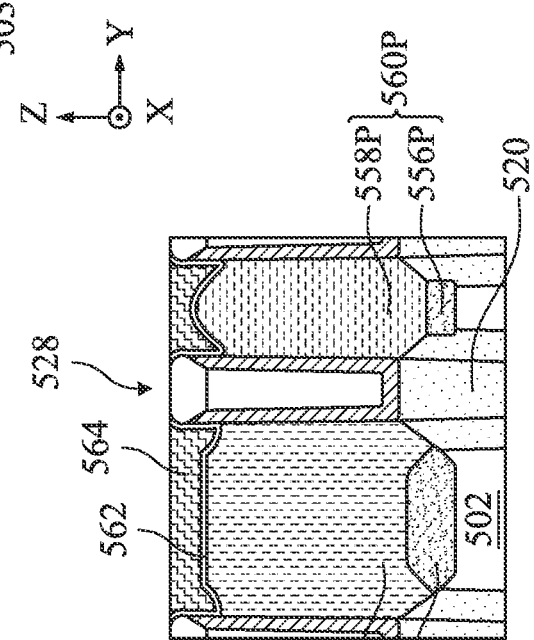

FIGS. 23E, 24E, and 25E are cross-sectional views taken in the Y-Z plane, which cut through a channel region and adjacent source/drain regions of a multi-gate device in a PFET region of a well pick-up region, according to various stages of the method 400 of FIGS. 4A and 4B.

Figure 23F:
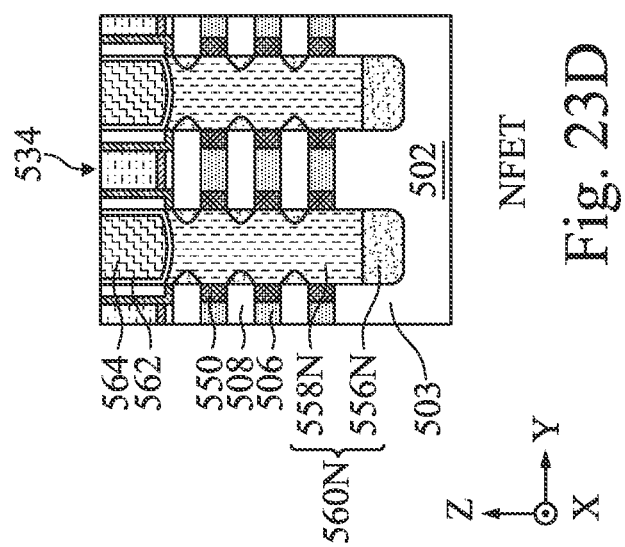
Figure 25F:
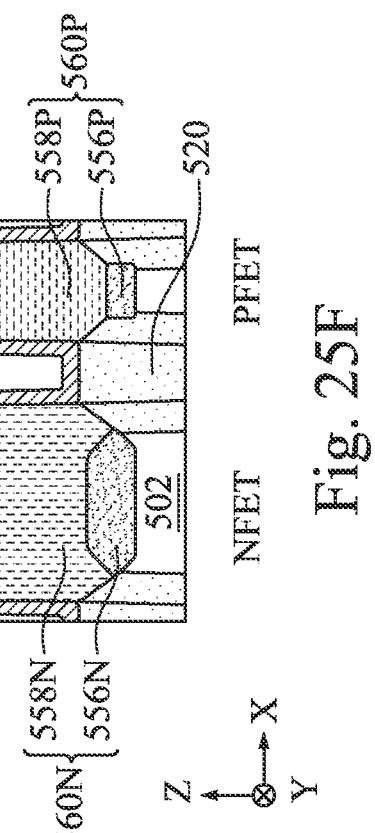

FIGS. 23F, 24F, and 25F are cross-sectional views taken in the X-Z plane, which cut through an S/D region of an NFET and an S/D region of a PFET and perpendicular to a lengthwise direction of channel regions of a multi-gate device in a well pick-up region, according to various stages of the method 400 of FIGS. 4A and 4B.

As with the other method embodiments and exemplary devices discussed herein, it is understood that parts of the semiconductor device 200 may be fabricated by a CMOS technology process flow, and thus some processes are only briefly described herein. Further, the exemplary semiconductor devices may include various other devices and features, such as other types of devices such as additional transistors, bipolar junction transistors, resistors, capacitors, inductors, diodes, fuses, static random access memory (SRAM) and/or other logic circuits, etc., but is simplified for a better understanding of the inventive concepts of the present disclosure. In some embodiments, the exemplary devices include a plurality of semiconductor devices (e.g., transistors), including PFETs, NFETs, etc., which may be interconnected. Moreover, it is noted that the process steps of method 400, including any descriptions given with reference to FIGS. 5A-25F, as with the remainder of the method and exemplary figures provided in this disclosure, are merely exemplary and are not intended to be limiting beyond what is specifically recited in the claims that follow.

Figure 5A:
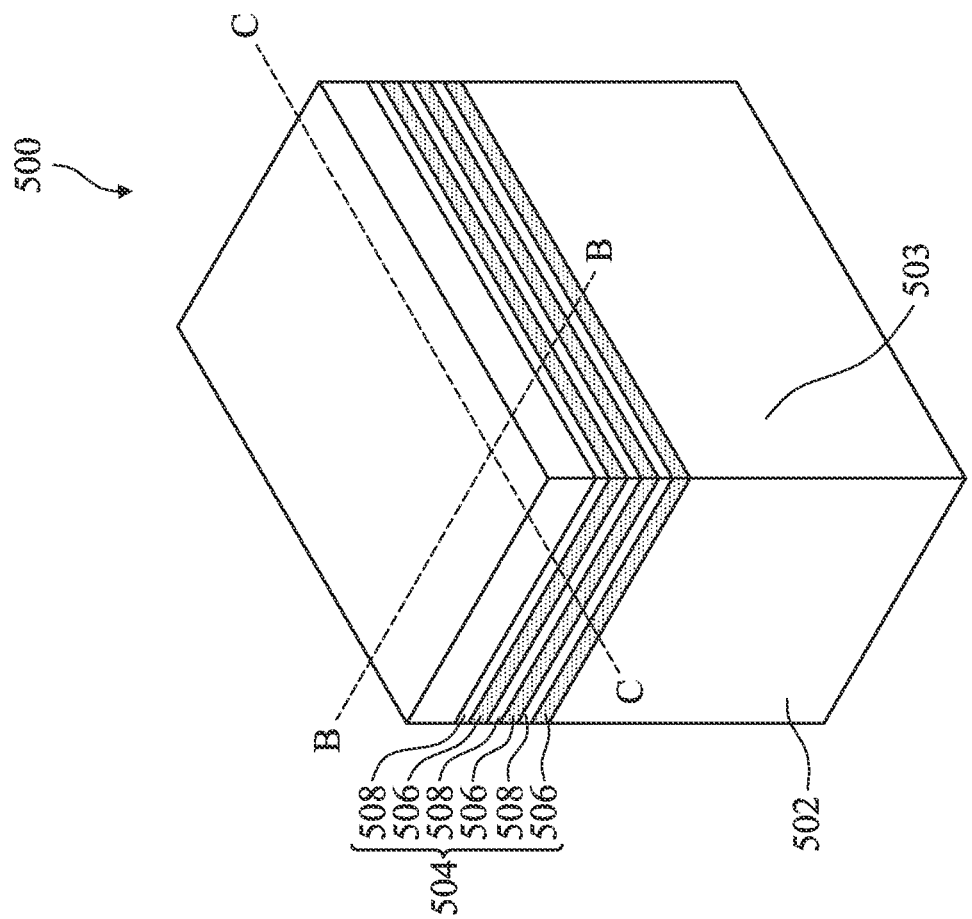
Figure 5C:
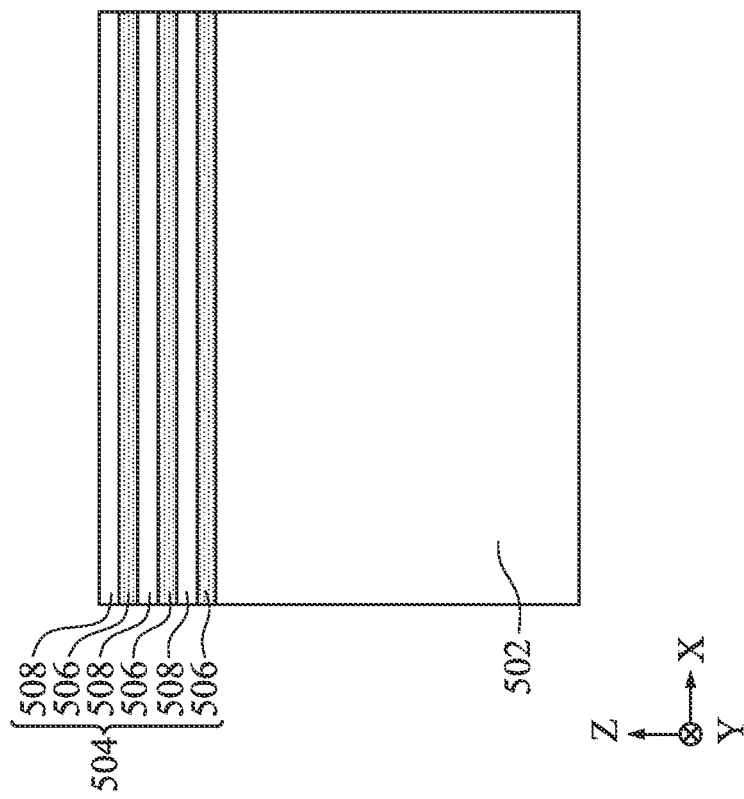
Figure 5B:
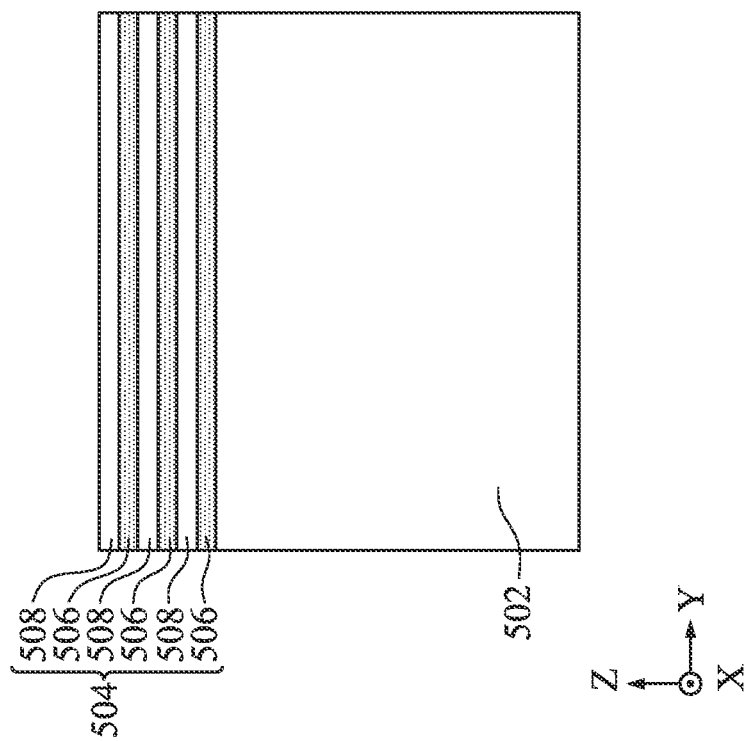
Figure 6A:
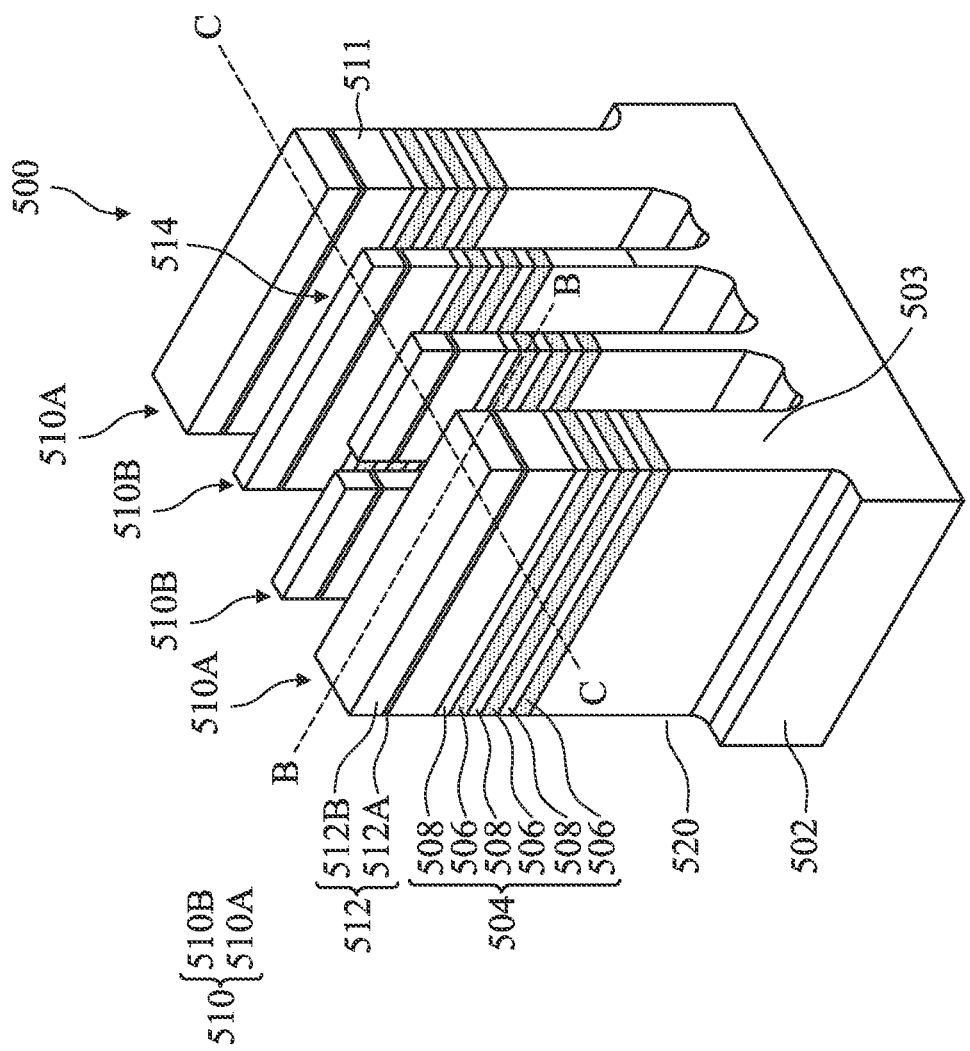
Figures 6B, 6C:
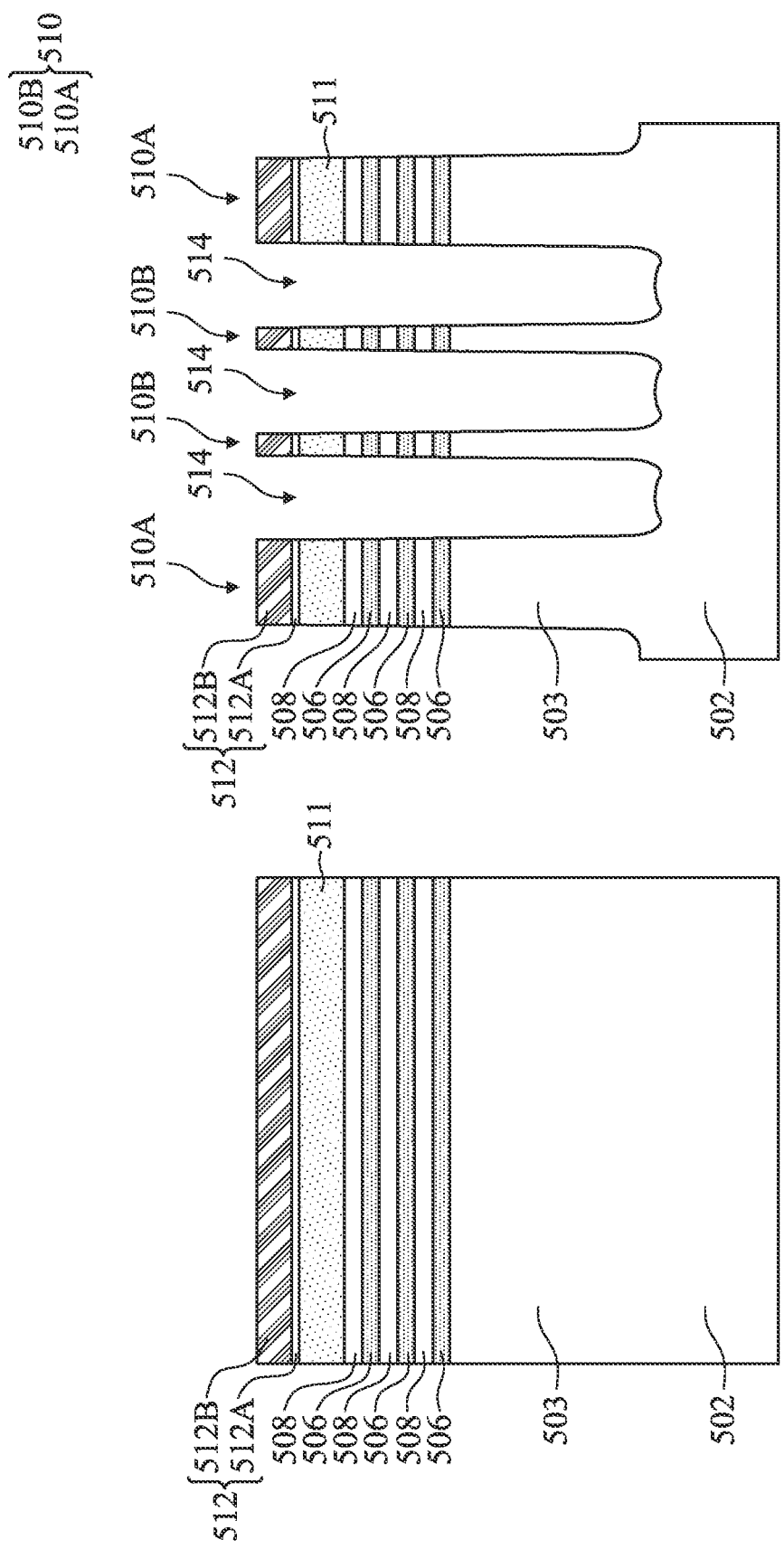

The method 400 at operation 402 (FIG. 4A) provides (or is provided with) a semiconductor device (or device) 500. Referring to FIGS. 5A-C, the device 500 includes a substrate 502 and an epitaxial stack 504 above the substrate 502. In some embodiments, the substrate 502 may be a semiconductor substrate such as a silicon substrate. The substrate 502 may include various layers, including conductive or insulating layers formed on a semiconductor substrate. The substrate 502 may include various doping configurations depending on design requirements as is known in the art. For example, different doping profiles (e.g., n-wells, p-wells) may be formed on the substrate 202 in regions designed for different device types (e.g., n-type field effect transistors (NFET), p-type field effect transistors (PFET)). The suitable doping may include ion implantation of dopants and/or diffusion processes. The substrate 502 may have isolation features (e.g., shallow trench isolation (STI) features) interposing the regions providing different device types. The substrate 502 may also include other semiconductors such as germanium, silicon carbide (SiC), silicon germanium (SiGe), or diamond. Alternatively, the substrate 502 may include a compound semiconductor and/or an alloy semiconductor. Further, the substrate 502 may optionally include an epitaxial layer (epi-layer), may be strained for performance enhancement, may include a silicon-on-insulator (SOI) structure, and/or may have other suitable enhancement features.

The epitaxial stack 504 includes epitaxial layers 506 of a first composition interposed by epitaxial layers 508 of a second composition. The first and second compositions can be different. The epitaxial layers 508 may include the same composition as the substrate 502. In the illustrated embodiment, the epitaxial layers 506 are silicon germanium (SiGe) and the epitaxial layers 508 are silicon (Si). However, other embodiments are possible including those that provide for a first composition and a second composition having different oxidation rates and/or etch selectivity. For example, in some embodiments, either of the epitaxial layers 506, 508 of the first composition or the second composition may include other materials such as germanium, a compound semiconductor such as silicon carbide, gallium arsenide, gallium phosphide, indium phosphide, indium arsenide, and/or indium antimonide, an alloy semiconductor such as SiGe, GaAsP, AlInAs, AlGaAs, InGaAs, GaInP, and/or GaInAsP, or combinations thereof. In some embodiments, the epitaxial layers 506 and 508 are substantially dopant-free, where for example, no intentional doping is performed during the epitaxial growth process. By way of example, epitaxial growth of the epitaxial layers 506 and 508 of the respective first and second compositions may be performed by a molecular beam epitaxy (MBE) process, a metalorganic chemical vapor deposition (MOCVD) process, and/or other suitable epitaxial growth processes. In various embodiments, the substrate 502 is a crystalline substrate, and the epitaxial layers 506 and 508 are crystalline semiconductor layers.

In some embodiments, each epitaxial layer 506 has a thickness ranging from about 4 nanometers (nm) to about 8 nm. The epitaxial layers 506 may be substantially uniform in thickness. In some embodiments, each epitaxial layer 508 has a thickness ranging from about 4 nm to about 8 nm. In some embodiments, the epitaxial layers 508 of the stack are substantially uniform in thickness. As described in more detail below, the epitaxial layers 208 or portions thereof may form channel members (or referred to as channel layers) of the subsequently-formed multi-gate transistors and the thickness is chosen based on device performance considerations. The term channel member(s) (or channel layer(s)) is used herein to designate any material portion for channel(s)

in a transistor with nanoscale, or even microscale dimensions, and having an elongate shape, regardless of the cross-sectional shape of this portion. Thus, this term designates both circular and substantially circular cross-section elongate material portions, and beam or bar-shaped material portions including for example a cylindrical in shape or substantially rectangular cross-section. The epitaxial layers 506 in channel regions(s) may eventually be removed and serve to define a vertical distance between adjacent channel members for a subsequently-formed multi-gate device and the thickness is chosen based on device performance considerations. Accordingly, the epitaxial layers 506 may also be referred to as sacrificial layers, and epitaxial layers 508 may also be referred to as channel layers.

It is noted that three (3) layers of the epitaxial layers 506 and three (3) layers of the epitaxial layers 508 are alternately arranged as illustrated in FIGS. 5A-C, which is for illustrative purposes only and not intended to be limiting beyond what is specifically recited in the claims. It can be appreciated that any number of epitaxial layers can be formed in the epitaxial stack 504; the number of layers depending on the desired number of channels members for the device 500. In some embodiments, the number of epitaxial layers 508 is between 2 and 10. It is also noted that while the epitaxial layers 506, 508 are shown as having a particular stacking sequence, where an epitaxial layer 508 is the topmost layer of the epitaxial stack 504, other configurations are possible. For example, in some cases, an epitaxial layer 506 may alternatively be the topmost layer of the epitaxial stack 504. Stated another way, the order of growth for the epitaxial layers 506, 508, and thus their stacking sequence, may be switched or otherwise be different than what is shown in the figures, while remaining within the scope of the present disclosure.

The method 400 then proceeds to operation 404 (FIG. 1A) where semiconductor fins (also referred to as device fins or fin elements) are formed by patterning. With reference to the example of FIGS. 6A-C, in an embodiment of operation 404, a plurality of semiconductor fins 510 extending from the substrate 502 are formed. In various embodiments, each of the semiconductor fins 510 includes a base portion 503 (also referred to as mesa) formed from a top portion of the substrate 502 and an epitaxial stack portion 504 formed from portions of each of the epitaxial layers of the epitaxial stack including epitaxial layers 506 and 508. The semiconductor fins 510 may be fabricated using suitable processes including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the semiconductor fins 510 by etching initial epitaxial stack 504. The etching process can include dry etching, wet etching, reactive ion etching (RIE), and/or other suitable processes.

In the illustrated embodiment, a buffer silicon layer 511 and a hard mask (HM) layer 512 are formed over the epitaxial stack 504 prior to patterning the semiconductor fins 510. In some embodiments, the buffer silicon layer 511 includes amorphous silicon and is epitaxially grown on the epitaxial stack 504. The buffer silicon layer 511 may have a thickness from about 1 nm to about 5 nm. In some embodiments, the HM layer 512 includes an oxide layer 512A (e.g., a pad oxide layer that may include silicon oxide) and a nitride layer 512B (e.g., a pad nitride layer that may include silicon nitride) formed over the oxide layer 512A. The oxide layer 512A may act as an adhesion layer between the epitaxial stack 504 and the nitride layer 512B and may act as an etch stop layer for etching the nitride layer 512B. In some examples, the HM layer 512 includes thermally grown oxide, chemical vapor deposition (CVD)-deposited oxide, and/or atomic layer deposition (ALD)-deposited oxide. In some embodiments, the HM layer 512 includes a nitride layer deposited by CVD and/or other suitable technique.

The semiconductor fins 510 may subsequently be fabricated using suitable processes including photolithography and etch processes. The photolithography process may include forming a photoresist layer (not shown) over the HM layer 512, exposing the resist to a pattern, performing post-exposure bake processes, and developing the resist to form a masking element including the resist. In some embodiments, patterning the resist to form the masking element may be performed using an electron beam (e-beam) lithography process. The masking element may then be used to protect regions of the substrate 502, and layers formed thereupon, while an etch process forms trenches 514 in unprotected regions through the HM layer 512, through the epitaxial stack 504, and into the substrate 502, thereby leaving the plurality of extending semiconductor fins 510. The trenches 514 may be etched using dry etching, wet etching, RIE, and/or other suitable processes. The trenches 514 may also divide an otherwise continuous semiconductor fin 510 into segments, which is also referred to as a fin-cut process. In the illustrated embodiment, the semiconductor fins 510 include at least two different widths, such as semiconductor fins 510A with a larger width (e.g., from about 20 nm to about 30 nm) and semiconductor fins 510B with a smaller width (e.g., from about 10 nm to about 15 nm). The widths of the semiconductor fins 510A and 510B are chosen based on device performance considerations. The relatively wider semiconductor fins 510A provide stronger current driving capabilities than the semiconductor fins 510B. In some embodiments, the semiconductor fins 510A provide channel layers for NFET transistors and are formed above p-well(s), and the semiconductor fins 510B provide channel layers for PFET transistors and are formed above n-well(s).

Numerous other embodiments of methods to form the semiconductor fins on the substrate may also be used including, for example, defining the fin region (e.g., by mask or isolation regions) and epitaxially growing the epitaxial stack 504 in the form of the semiconductor fins 510. In some embodiments, forming the semiconductor fins 510 may include a trim process to decrease the width of the semiconductor fins 510. The trim process may include wet and/or dry etching processes.

Figure 7C:
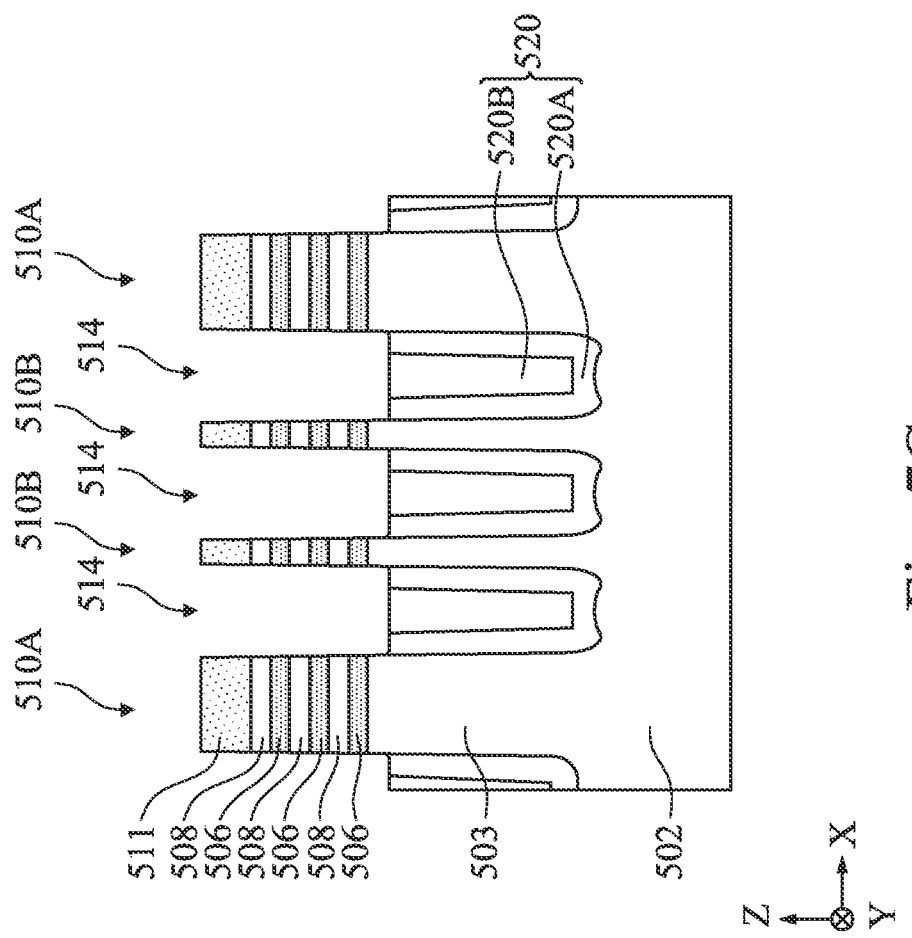
Figure 7B:
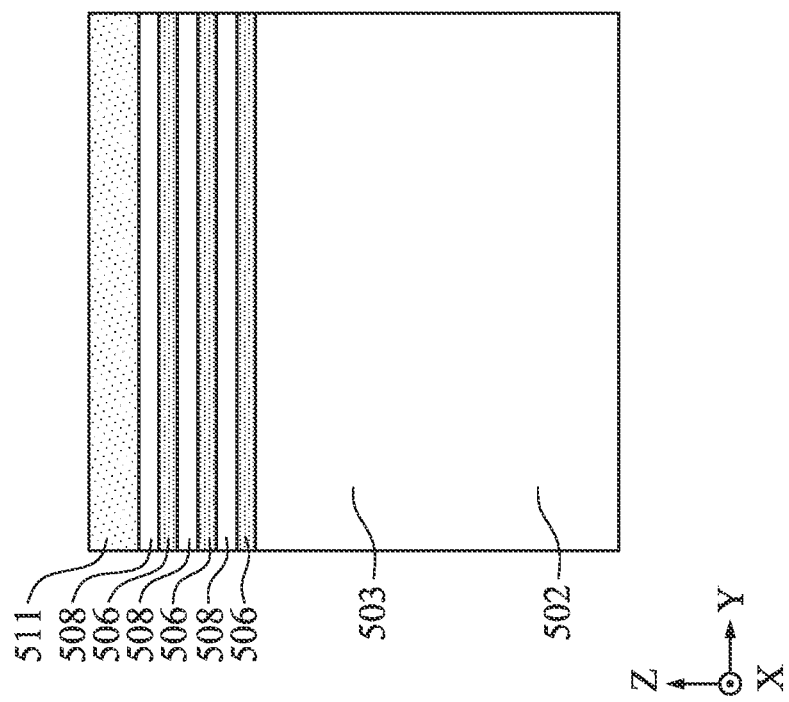

At operation 406, the method 400 (FIG. 1A) forms isolation features, such as shallow trench isolation (STI) features, between the semiconductor fins 510. Referring to FIGS. 7A-C, STI features 520 is disposed on the substrate 502 interposing the semiconductor fins 510. By way of example, in some embodiments, a dielectric layer is first deposited over the substrate 502, filling the trenches 514 with dielectric material. In some embodiments, the dielectric layer may include silicon oxide, silicon nitride, silicon oxynitride, fluorine-doped silicate glass (FSG), a low-k dielectric, combinations thereof, and/or other suitable materials. In various examples, the dielectric layer may be deposited by a CVD process, a SACVD process, a flowable CVD process, an ALD process, a PVD process, and/or other suitable process. In some embodiments, after deposition of the dielectric layer, the device 500 may be annealed, for example, to improve the quality of the dielectric layer. In some embodiments, the dielectric layer may include a multilayer structure, for example, having an oxide liner 520A and a flowable oxide layer 520B.

In some embodiments of forming the isolation (STI) features, after deposition of the dielectric layer, the deposited dielectric material is thinned and planarized, for example by a chemical mechanical polishing (CMP) process. In some embodiments, the HM layer 512 functions as a CMP stop layer. Subsequently, the dielectric layer interposing the semiconductor fins 510 are recessed. Still referring to the example of FIGS. 6A-C, the STI features 520 are recessed providing the semiconductor fins 510 extending above the STI features 520. In some embodiments, the recessing process may include a dry etching process, a wet etching process, and/or a combination thereof. In some embodiments, a recessing depth is controlled (e.g., by controlling an etching time) so as to result in a desired height of the exposed upper portion of the semiconductor fins 510. In the illustrated embodiment, the desired height exposes each of the layers of the epitaxial stack 504. In furtherance of the embodiment, a top surface of the STI features 520 is recessed below the bottommost epitaxial layer 506 and a top portion of the mesa 503 is exposed. The HM layer 512 may also be removed during the recess etching, exposing the buffer silicon layer 511.

Figure 8A:
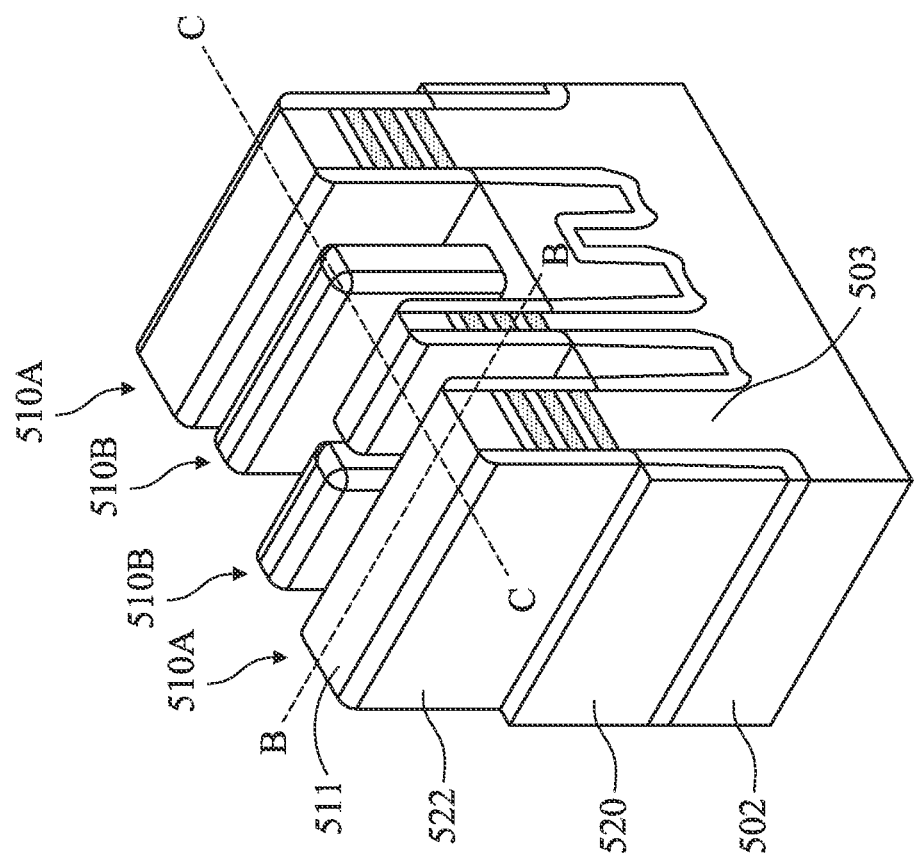
Figure 8C:
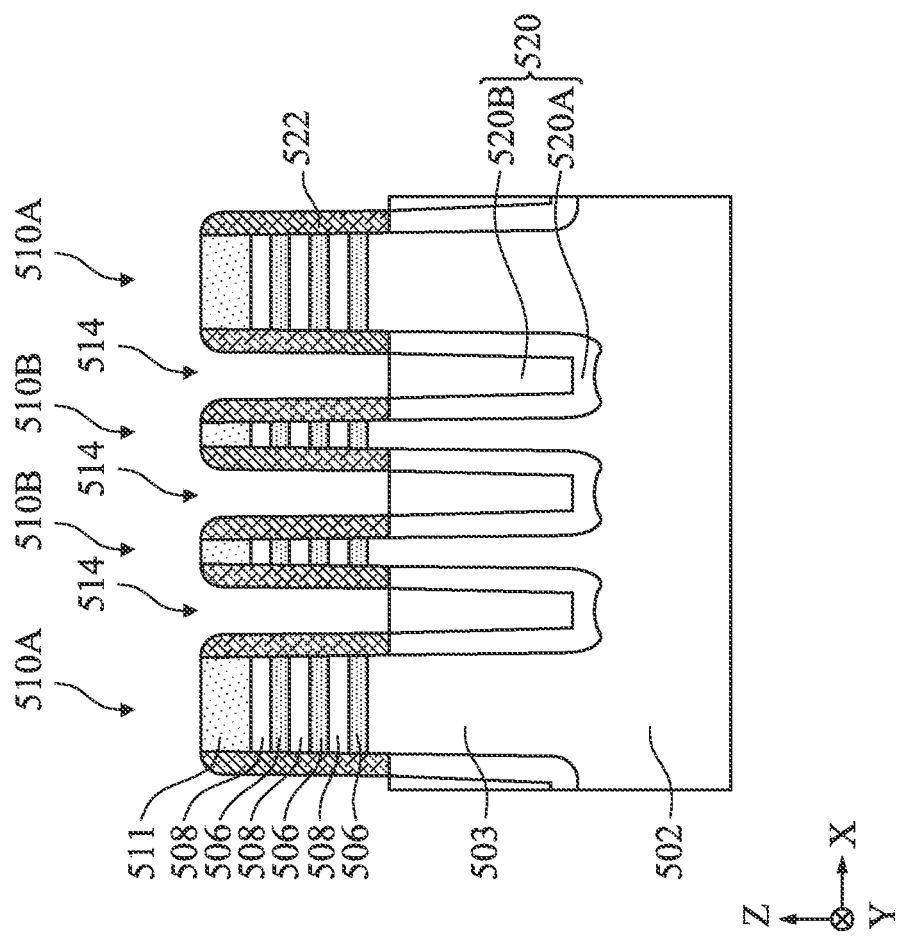
Figure 8B:
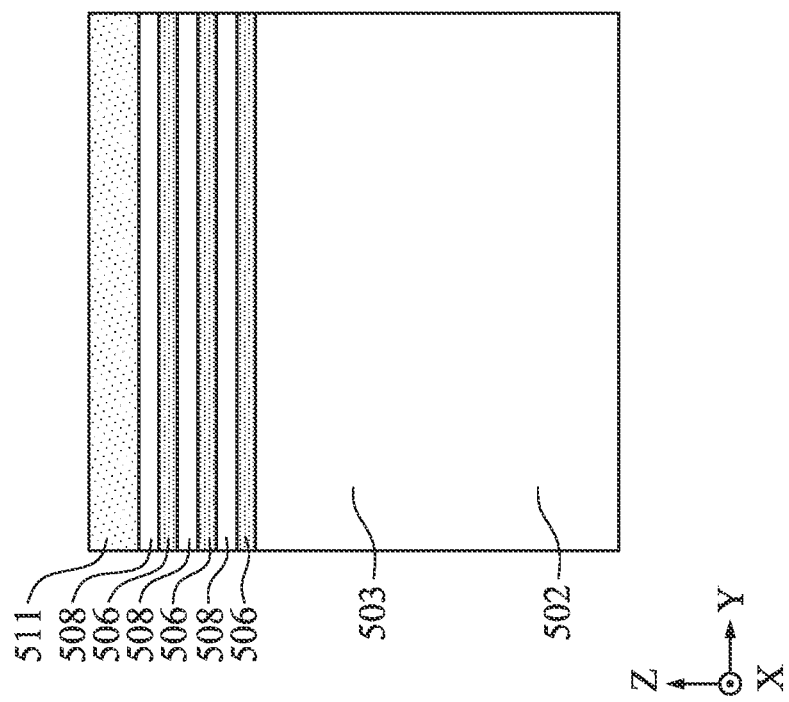

At operation 408, the method 400 (FIG. 1A) deposits a cladding layer on sidewall surfaces of the semiconductor fins 510. Referring to FIGS. 8A-C, in the illustrated embodiment, the cladding layer 522 is selectively deposited over the device 500. In particular, the cladding layer 522 may be selectively and conformally deposited over the exposed surfaces of the semiconductor fins 510. In various embodiments, the cladding layer 522 is not deposited on top surfaces of the STI features 520 between the semiconductor fins 510. For example, the cladding layer 522 may be a semiconductor layer and deposited by an epitaxial growing process, such that the epitaxial growth of the cladding layer 522 is limited to exposed semiconductor surfaces of the semiconductor fins 510, which functions as a seed layer, but not on dielectric material surfaces of the STI features 520. Alternatively, the cladding layer 522 may be deposited as a blanket layer covering the device 500. Subsequently, horizontal portions of the cladding layer 522 are removed in an anisotropic etch process, such as a dry etching process (e.g., RIE etching), leaving remaining portions on sidewall surfaces of the semiconductor fins 510. By way of example, the cladding layer 522 may be deposited by an MBE process, an MOCVD process, an ALD process, and/or other suitable deposition processes. The cladding layer 522 reserves a space for subsequently formed metal gate stack and will be removed in a subsequent processing stage. Therefore, the cladding layer 522 is also referred to as a sacrificial cladding layer.

In some embodiments, the cladding layer 522 includes the same semiconductor material as the epitaxial layers 506, such as silicon germanium (SiGe), but in difference germanium concentrations. For example, the molar ratio of germanium may range from about 15% to about 25% in the epitaxial layers 506, and the molar ratio of germanium may range from about 40% to about 50% in the cladding layer 522. The difference in germanium concentration provides etch selectivity between the cladding layer 522 and the epitaxial layers 506. In some alternative embodiments, the cladding layer 522 includes the same semiconductor material as the epitaxial layers 506, such as silicon germanium (SiGe), including the same germanium concentration. In furtherance of the embodiment, an oxide liner (not shown) may be formed on exposed semiconductor surfaces of the semiconductor fins 510 prior to the deposition of the cladding layer 522. The oxide liner separates the cladding layer 522 from the epitaxial layers 506 and protects the epitaxial layers 506 in subsequent removal of the cladding layer 522. The oxide liner is formed by oxidizing exposed semiconductor surfaces of the semiconductor fins 510. The oxidation process results in the oxide liner having a determined thickness. For example, the oxide liner may have a thickness from about 1 nm to about 3 nm. In some embodiments, the oxidation process comprises a rapid thermal oxidation (RTO) process, high pressure oxidation (HPO), chemical oxidation process, in-situ stream generation (ISSG) process, or enhanced in-situ stream generation (EISSG) process. In some embodiments, the RTO process is performed at a temperature of about 400° C. to about 700° C., using $O_2$ and $O_3$ as reaction gases, for about 1 second to about 30 seconds. In other embodiments, an HPO is performed using a process gas of $O_2$, $O_2+N_2$, $N_2$, or the like, at a pressure from about 1 atm to about 25 atm and a temperature from about 300° C. to about 700° C., for about 1 minute to about 10 minutes. Examples of a chemical oxidation process include wet SPM clean, wet $O_3/H_2O$, or the like. The $O_3$ may have a concentration of about 1 ppm to about 50 ppm.

In some embodiments, the semiconductor material in the cladding layer 522 is in either amorphous form or polycrystalline form, such as amorphous SiGe or polycrystalline SiGe in some embodiments. In yet some embodiments, the cladding layer 522 may have a mixture of semiconductor material in both amorphous form and polycrystalline form, such as 60% SiGe in amorphous form and 40% SiGe in polycrystalline form. The term "amorphous or polycrystalline" is used herein to designate composition in amorphous form, polycrystalline form, or a combination thereof.

Figure 9A:
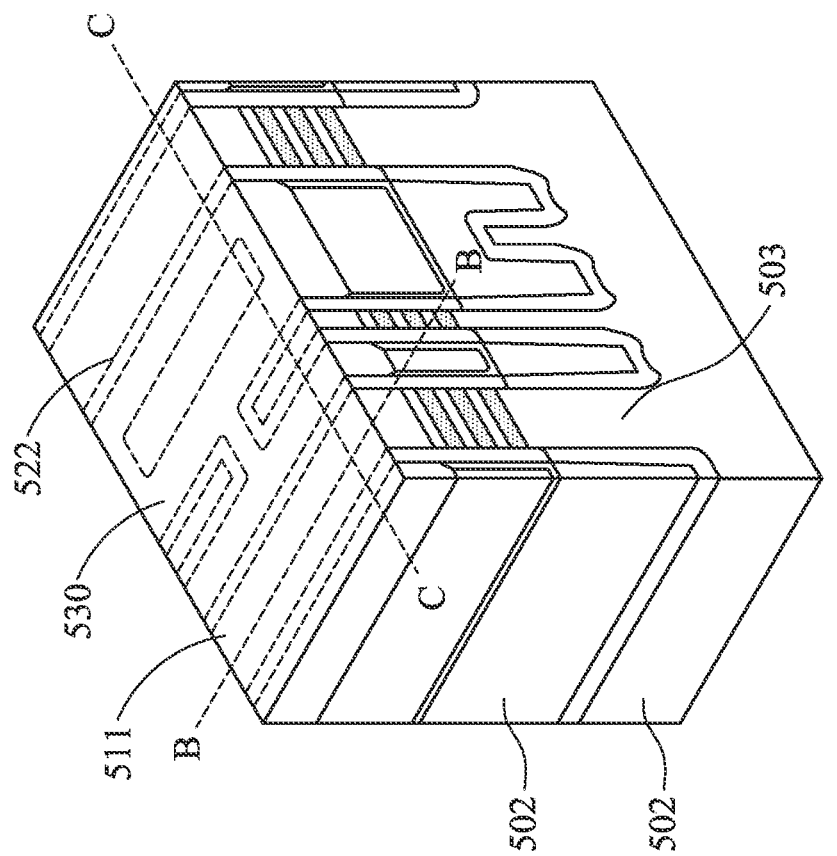
Figure 9C:
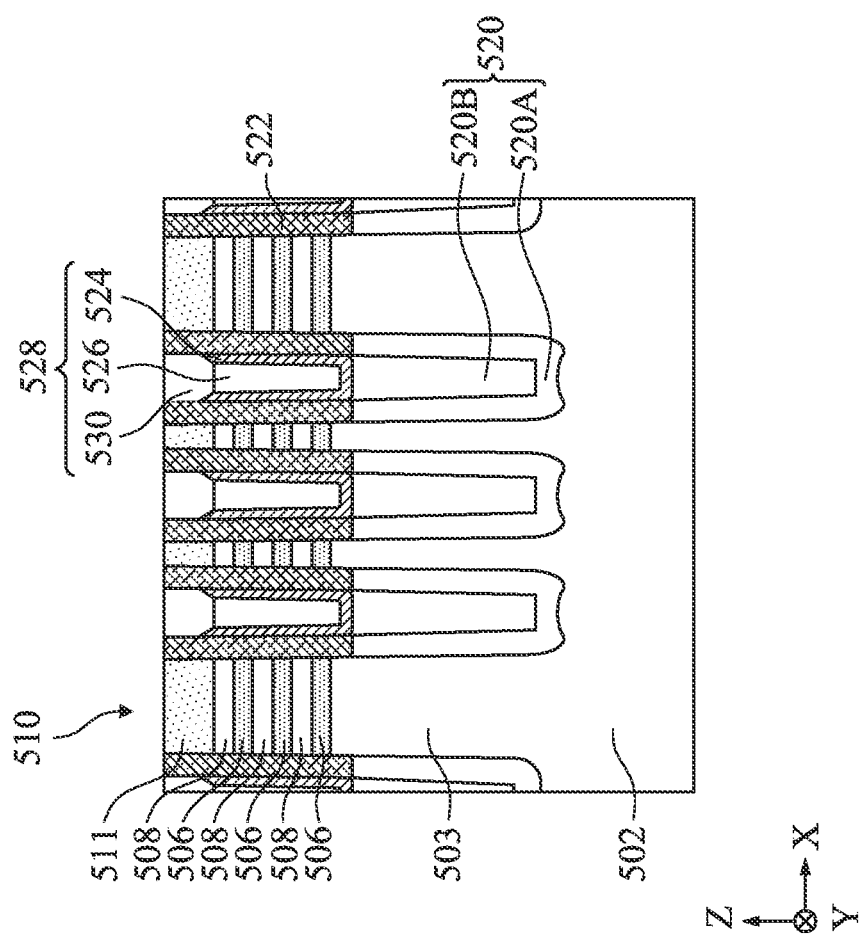
Figure 9B:
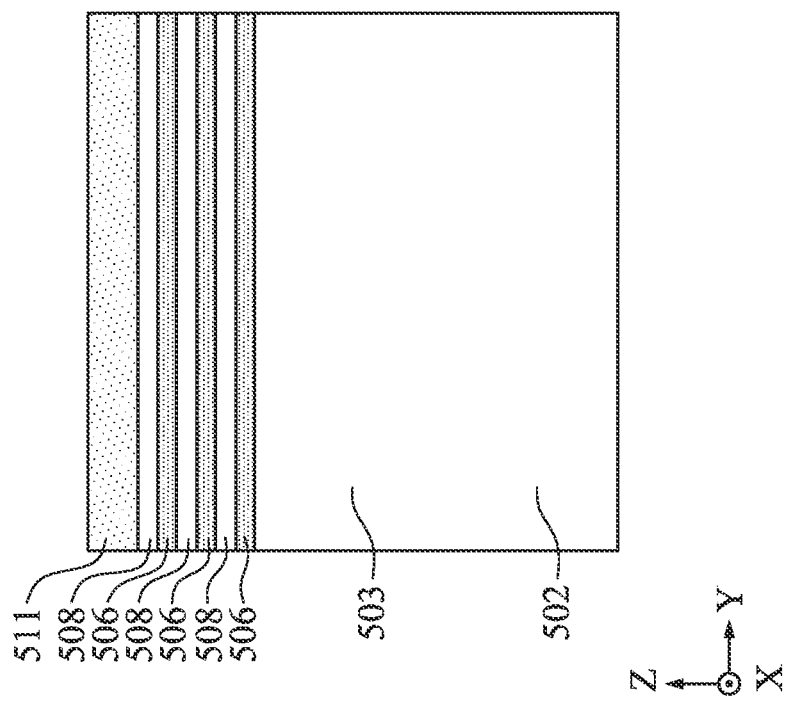

At operation 410, the method 400 (FIG. 4A) forms dielectric fins between adjacent semiconductor fins. Referring to FIGS. 9A-C, in an embodiment of operation 410, a dielectric layer 524 is deposited conformally within the trenches 514 including along sidewalls of the cladding layer 522 and along a top surface of the STI features 520. Thereafter, a dielectric layer 526 is deposited over the dielectric layer 524. In at least some embodiments, the dielectric layers 524 and 526 may collectively define a dielectric fin (or hybrid fin) 528. In some cases, a dielectric fin 528 may further include a high-k dielectric layer formed over the dielectric layers 524 and 526, for example after recessing of the dielectric layers 524 and 526, as discussed below. Generally, and in some embodiments, the dielectric layers 224 and 226 may include SiN, SiCN, SiOC, SiOCN, SiOx, or other appropriate material. In some examples, the dielectric layer 524 may include a low-k dielectric layer, and the dielectric layer 526 may include a flowable oxide layer. In various cases, the dielectric layers 524 and 526 may be deposited by a CVD process, an ALD process, a PVD process, a spin-coating and baking process, and/or other suitable process. In some examples, after depositing the dielectric layers 524 and 526, a CMP process may be performed to remove excess material portions and to planarize a top surface of the device 500.

The method 400 at operation 410 may further include a recessing process, a high-k dielectric layer deposition process, and a CMP process. Still referring to FIGS. 9A-C, in an embodiment of operation 410, a recessing process is performed to remove top portions of the dielectric layers 524 and 526. In some embodiments, the recessing process may include a dry etching process, a wet etching process, and/or a combination thereof. In some embodiments, a recessed depth is controlled (e.g., by controlling an etching time) to result in a desired recessed depth. In some embodiments, the recessing process may optionally remove at least part of the cladding layer 522. After performing the recessing process, and in a further embodiment of operation 410, a high-k dielectric layer 530 is deposited within trenches formed by the recessing process. In some embodiments, the high-k dielectric layer 530 may include $HfO_2$, $ZrO_2$, HfAlOx, HfSiOx, $Y_2O_3$, $Al_2O_3$, or another high-k material. The high-k dielectric layer 530 may be deposited by a CVD process, an ALD process, a PVD process, and/or other suitable process. After deposition of the high-k dielectric layer 530, and in a further embodiment of operation 410, a CMP process is performed to remove excess material portions and to planarize a top surface of the device 500. In some examples, the CMP process exposes the buffer silicon layer 511. Thus, in various cases, a dielectric fin 528 is defined as having a lower portion including the recessed portions of the dielectric layers 524, 526 and an upper portion including the high-k dielectric layer 530. In some examples, a height of the high-k dielectric layer 530 may be about 20 nm to about 30 nm with a width ranging from about 15 nm to about 25 nm. In some cases, a dielectric fin 528 may be alternatively described as a bi-layer dielectric having a high-k upper portion and a low-k lower portion. In some examples, a height ratio of the upper portion to the lower portion may be about 1:20 to about 20:1. The height ratio may be adjusted, for example, by changing the recess depth and thus the height of the high-k dielectric layer 530, as noted above. In the illustrated embodiment, the recessed top surfaces of the dielectric layers 524 and 526 are substantially level (or termed as coplanar) with a top surface of the top epitaxial layer 508.

Figure 10A:
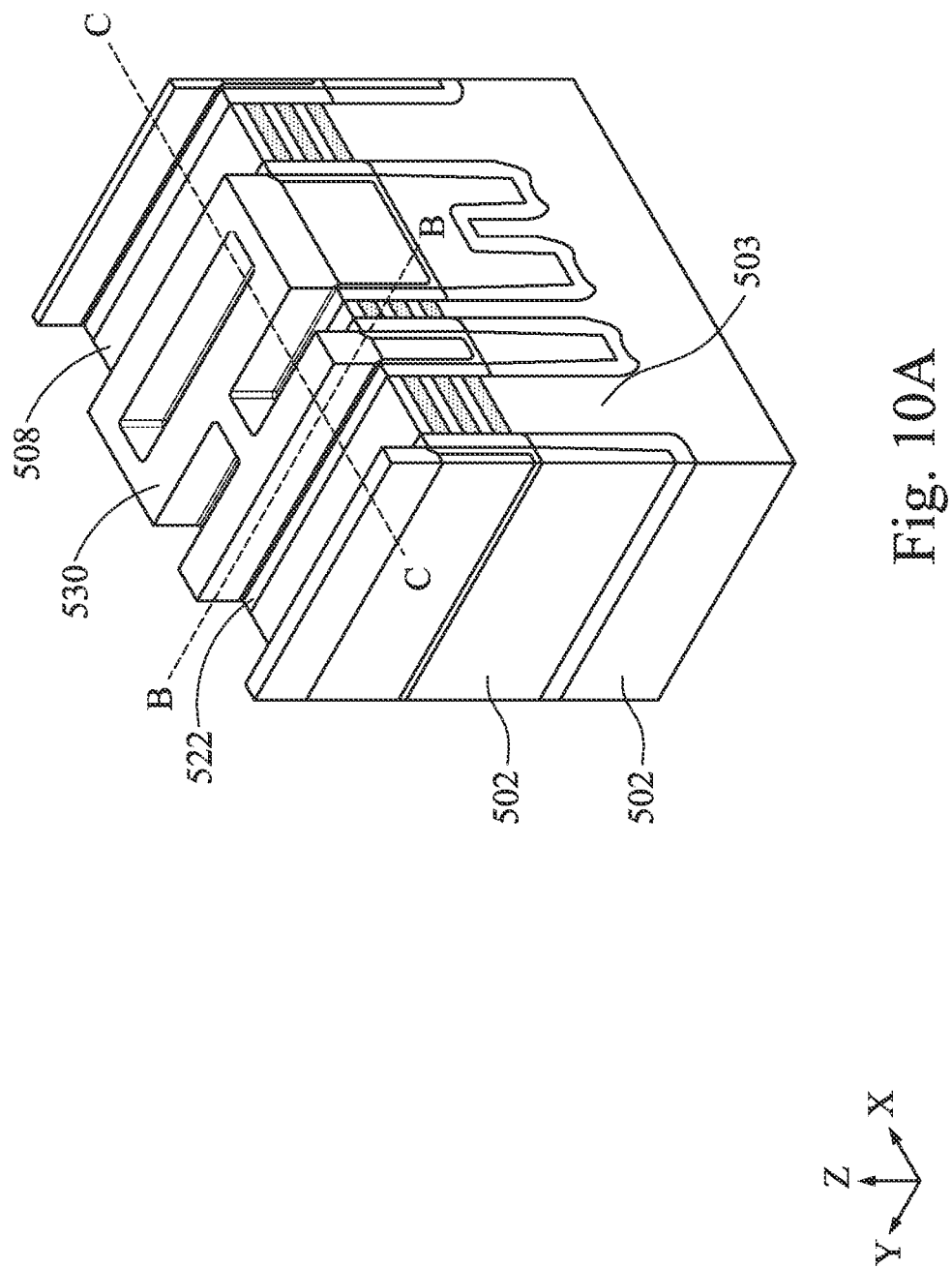
Figure 10C:
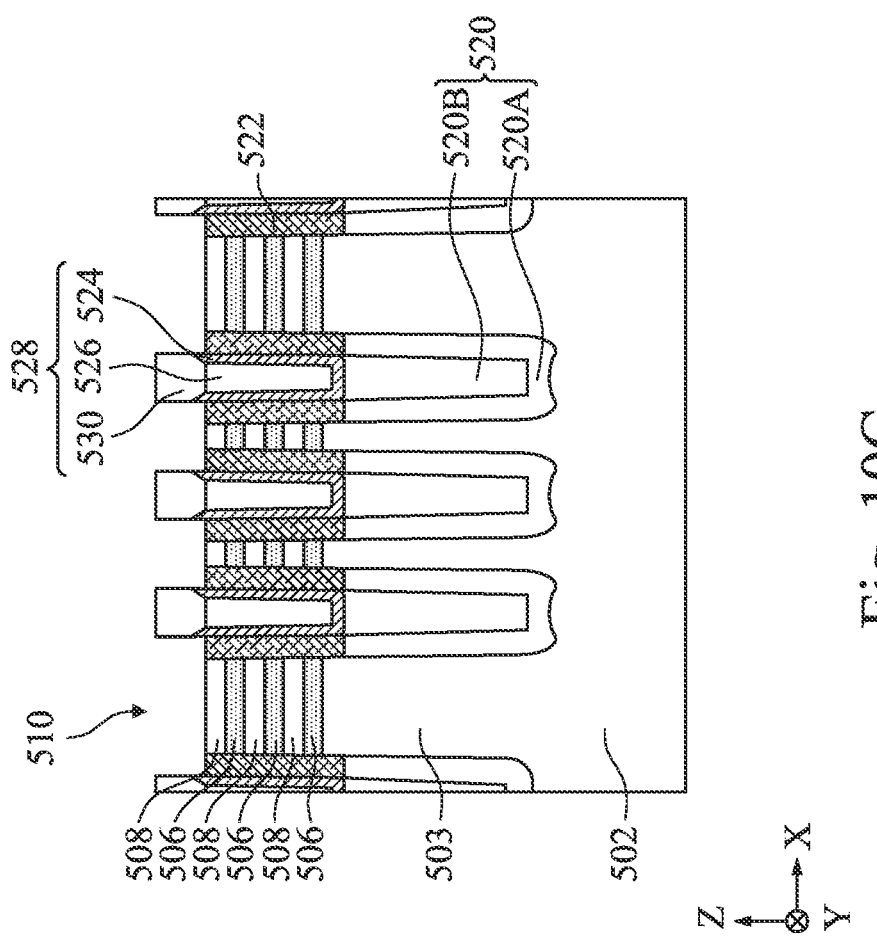
Figure 10B:
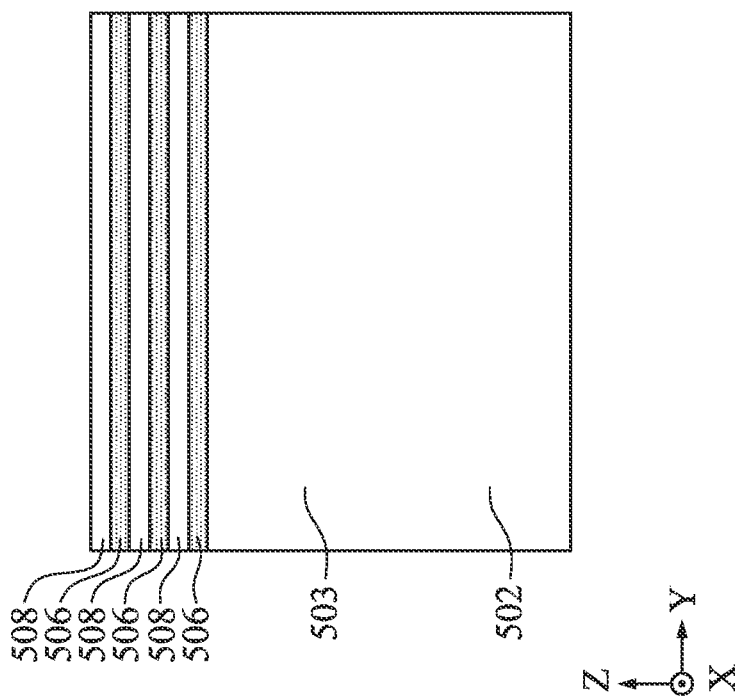

At operation 412, the method 400 (FIG. 1A) removes the buffer silicon layer 511 and a top portion of the cladding layer 522. Referring to FIGS. 10A-C, in an embodiment of operation 412, the buffer silicon layer 511 and a top portion of the cladding layer 522 may initially be etched-back. The topmost epitaxial layer 508 may act as an etch stop layer for etching the buffer silicon layer 511. The top portion of the cladding layer 522 may be removed together with the buffer silicon layer 511 by the same etchant. In some embodiments, a top surface of the etched-back cladding layer 522 is substantially level with top surfaces of the topmost epitaxial layer 508 of the semiconductor fins 510. In some embodiments, the etch-back of the buffer silicon layer 511 and the top portion of the cladding layer 522 may be performed using a wet etch process, a dry etch process, a multiple-step etch process, and/or a combination thereof. The buffer silicon layer 511 may be removed, for example, by a wet etching process using $H_3PO_4$ or other suitable etchants.

Figure 11B:
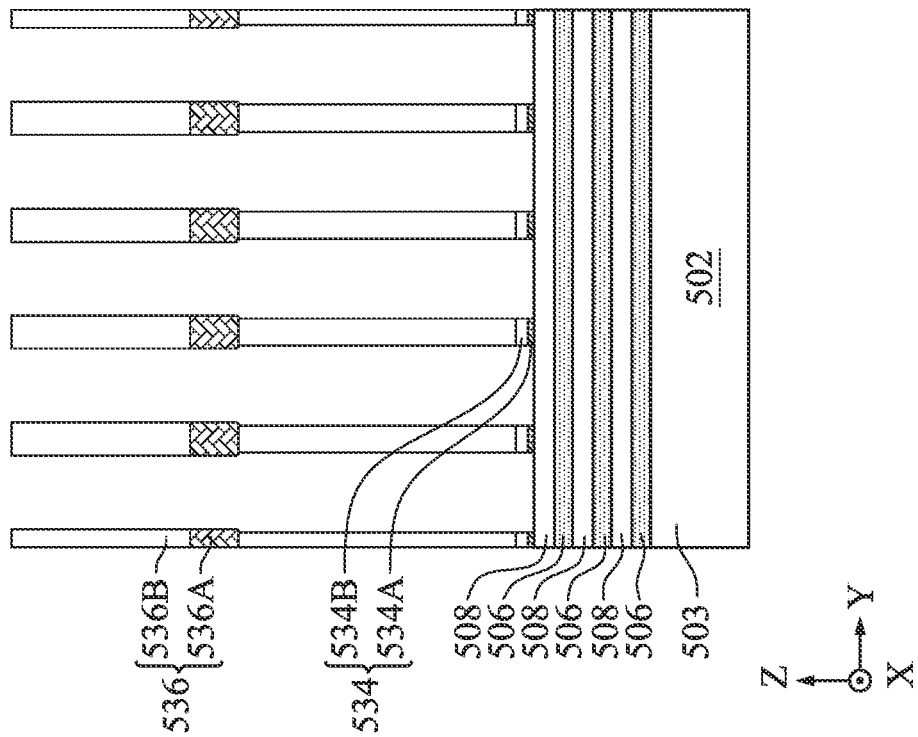

The method 400 then proceeds to operation 414 (FIG. 1A) where a dummy gate structure is formed. While the present discussion is directed to a replacement gate (or gate-last) process whereby a dummy gate structure is formed and subsequently replaced, other configurations may be possible. With reference to FIGS. 11A-C, a dummy gate structure 534 is formed. The dummy gate structure 534 will be replaced by a final gate stack at a subsequent processing stage of the device 500. In particular, the dummy gate structure 534 may be replaced at a later processing stage by a high-k dielectric layer (HK) and metal gate electrode (MG), as will be discussed in more detail below. In some embodiments, the dummy gate structure 534 is disposed over the semiconductor fins 510, the cladding layer 522, and the dielectric fins 528. The portion of the semiconductor fins 510 underlying the dummy gate structure 534 may be referred to as the channel region. The dummy gate structure 534 may also define source/drain (S/D) regions of the semiconductor fins 510, for example, the regions of the semiconductor fin 510 adjacent and on opposing sides of the channel region.

In some embodiments, the dummy gate structure 534 is formed by various process steps such as layer deposition, patterning, etching, as well as other suitable processing steps. Exemplary layer deposition processes include CVD (including low-pressure CVD, plasma-enhanced CVD, and/or flowable CVD), PVD, ALD, thermal oxidation, e-beam evaporation, or other suitable deposition techniques, or combinations thereof. In some embodiments, the dummy gate structure 534 includes a dummy dielectric layer 534A and a dummy electrode layer 534B. In some embodiments, the dummy dielectric layer 534A may include $SiO_2$, silicon nitride, a high-k dielectric material and/or other suitable material. Subsequently, the dummy electrode layer 534B is deposited. In some embodiments, the dummy electrode layer 534B may include polycrystalline silicon (polysilicon). In forming the dummy gate structure for example, the patterning process includes a lithography process (e.g., photolithography or e-beam lithography) which may further include photoresist coating (e.g., spin-on coating), soft baking, mask aligning, exposure, post-exposure baking, photoresist developing, rinsing, drying (e.g., spin-drying and/or hard baking), other suitable lithography techniques, and/or combinations thereof. In some embodiments, the etching process may include dry etching (e.g., RIE etching), wet etching, and/or other etching methods. In some embodiments, the dummy gate structure 534 is patterned through a hard mask 536. The hard mask 536 may include multiple layers, such as an oxide layer 536A and a nitride layer 536B over the oxide layer 536A. In some embodiments, after formation of the dummy gate structure 534, the dummy dielectric layer 534A is removed from the S/D regions of the semiconductor fins 510. The etch process may include a wet etch, a dry etch, and/or a combination thereof. The etch process is chosen to selectively etch the dummy dielectric layer without substantially etching the semiconductor fins 510, the hard mask 536, and the dummy electrode layer.

Figure 12B:
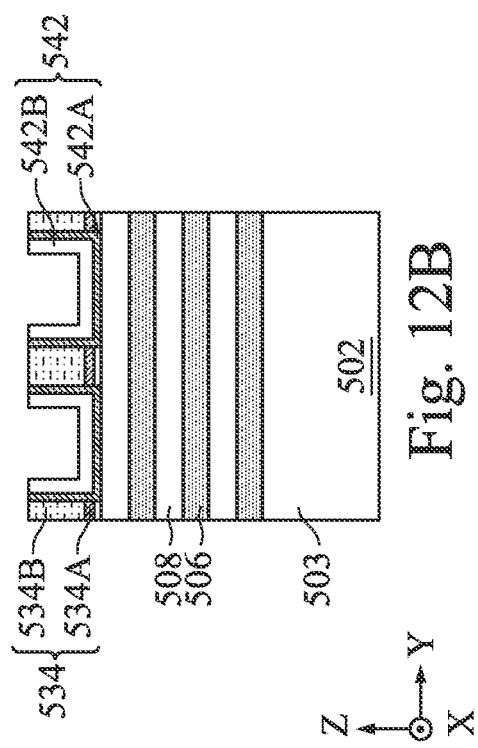
Figure 12C:
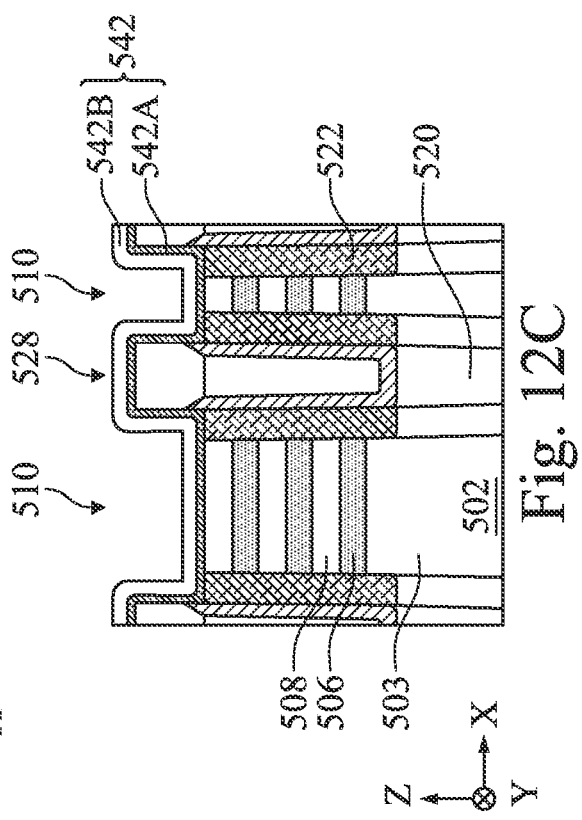
Figure 12A:
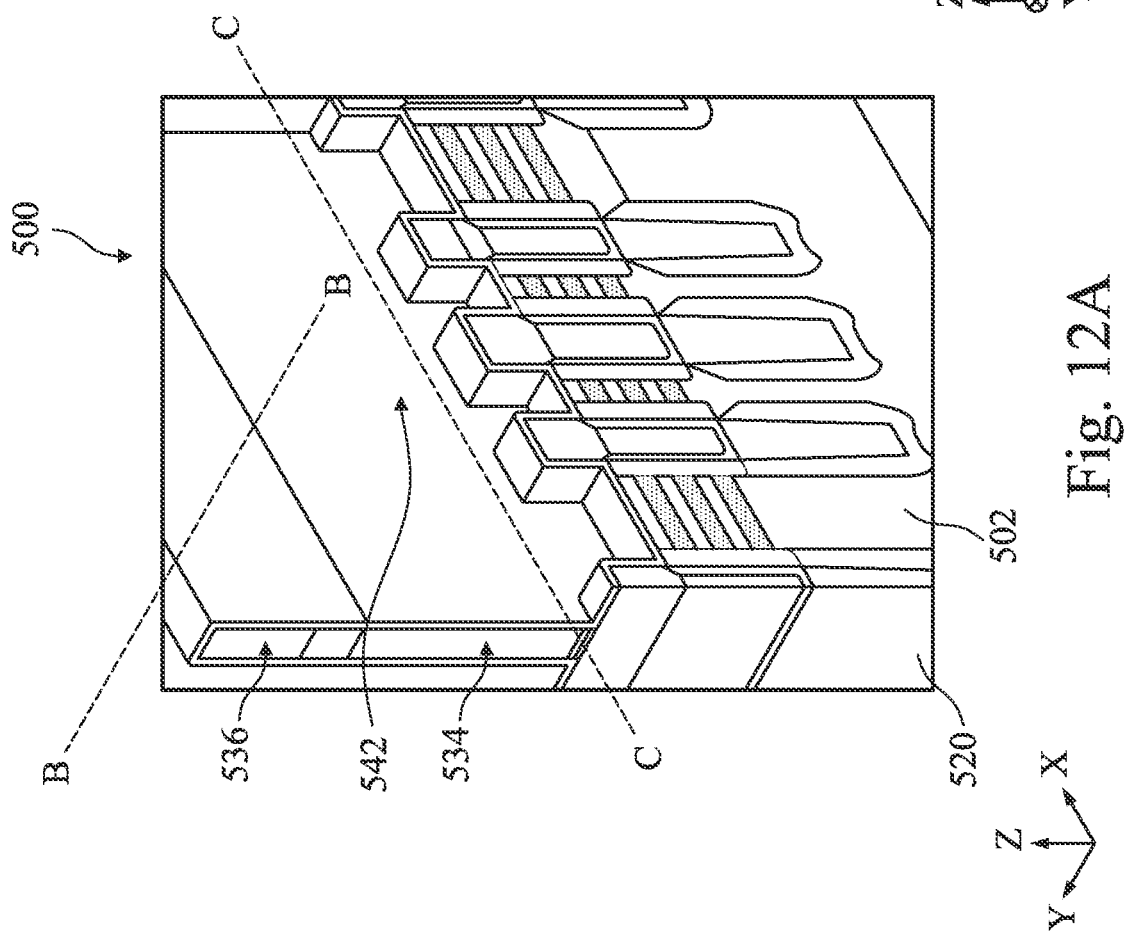

At operation 416, the method 400 (FIG. 1A) forms gate spacers on sidewall surfaces of the dummy gate structure 534. With reference to FIGS. 12A-C, gate spacers 542 are formed. The gate spacers 542 may have a thickness from about 2 nm to about 10 nm. In some examples, the gate spacers 542 may include a dielectric material such as silicon oxide, silicon nitride, silicon carbide, silicon oxynitride, SiCN, silicon oxycarbide, SiOCN, a low-k material, and/or combinations thereof. In some embodiments, the gate spacers 542 include multiple layers, such as a liner spacer layer 542A and a main spacer layer 542B, and the like. By way of example, the gate spacers 542 may be formed by conformally depositing a dielectric material over the device 500 using processes such as a CVD process, a subatmospheric CVD (SACVD) process, a flowable CVD process, an ALD process, a PVD process, or other suitable process. Following the conformal deposition of the dielectric material, portions of the dielectric material used to form the gate spacers 542 may be etched-back to expose portions of the semiconductor fins 510 not covered by the dummy gate structures 234 (e.g., in source/drain regions). In some cases, the etch-back process removes portions of dielectric material used to form the gate spacers 542 along a top surface of the dummy gate structure 534, thereby exposing the hard mask layer 536. In some embodiments, the etch-back process may include a wet etch process, a dry etch process, a multiple-step etch process, and/or a combination thereof. It is noted that after the etch-back process, the gate spacers 542 remain disposed on sidewall surfaces of the dummy gate structure 534. In some examples, the etch-back process may also etch a portion of the high-k dielectric layer 230 of the dielectric fins 228 in the S/D regions that is not covered by the dummy gate structure 234.

At operation 418, the method 400 (FIG. 1A) recesses the semiconductor fins 510 in the S/D regions in forming S/D recesses. With reference to FIGS. 13A-C, a source/drain etch process is performed to form the S/D recesses 546 by removing portions of the semiconductor fins 510 and the cladding layer 522 not covered by the dummy gate structure 534 (e.g., in source/drain regions) and that were previously exposed (e.g., during the gate spacers 542 etch-back process). In particular, the source/drain etch process may serve to remove the exposed epitaxial layer portions 506 and 508 in source/drain regions of the device 500 to expose the base portion 503 of the semiconductor fins 510. In some embodiments, the source/drain etch process may include a dry etching process, a wet etching process, and/or a combination thereof. In some embodiments, a recessed depth is controlled (e.g., by controlling an etching time) such that the top surface of the mesa 503 is recessed to be under the top surface of the STI features 520, such as for about 2 nm to about 5 nm in some examples.

Figure 14B:
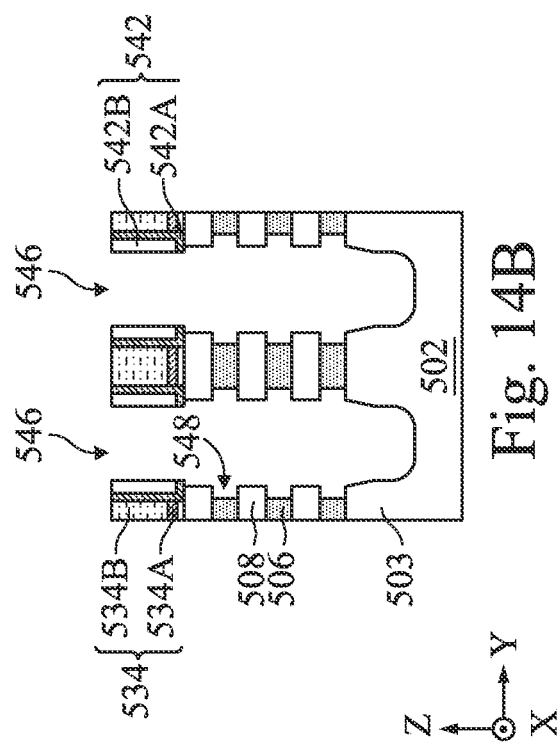
Figure 14C:
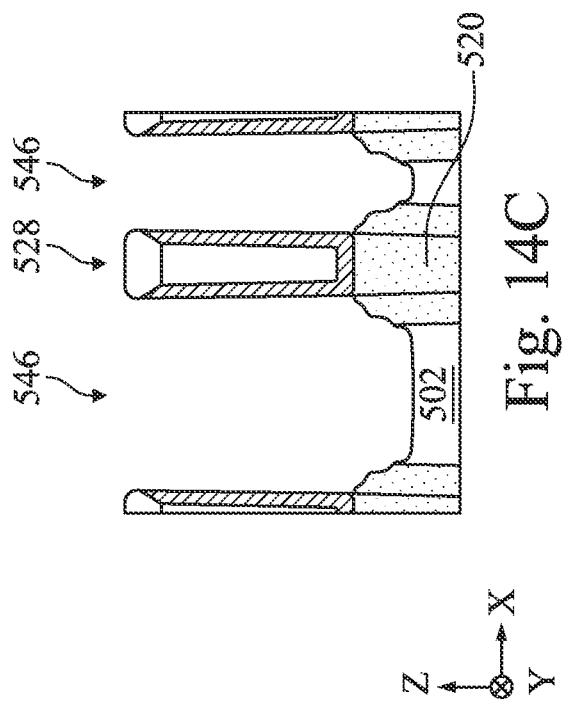
Figure 14A:
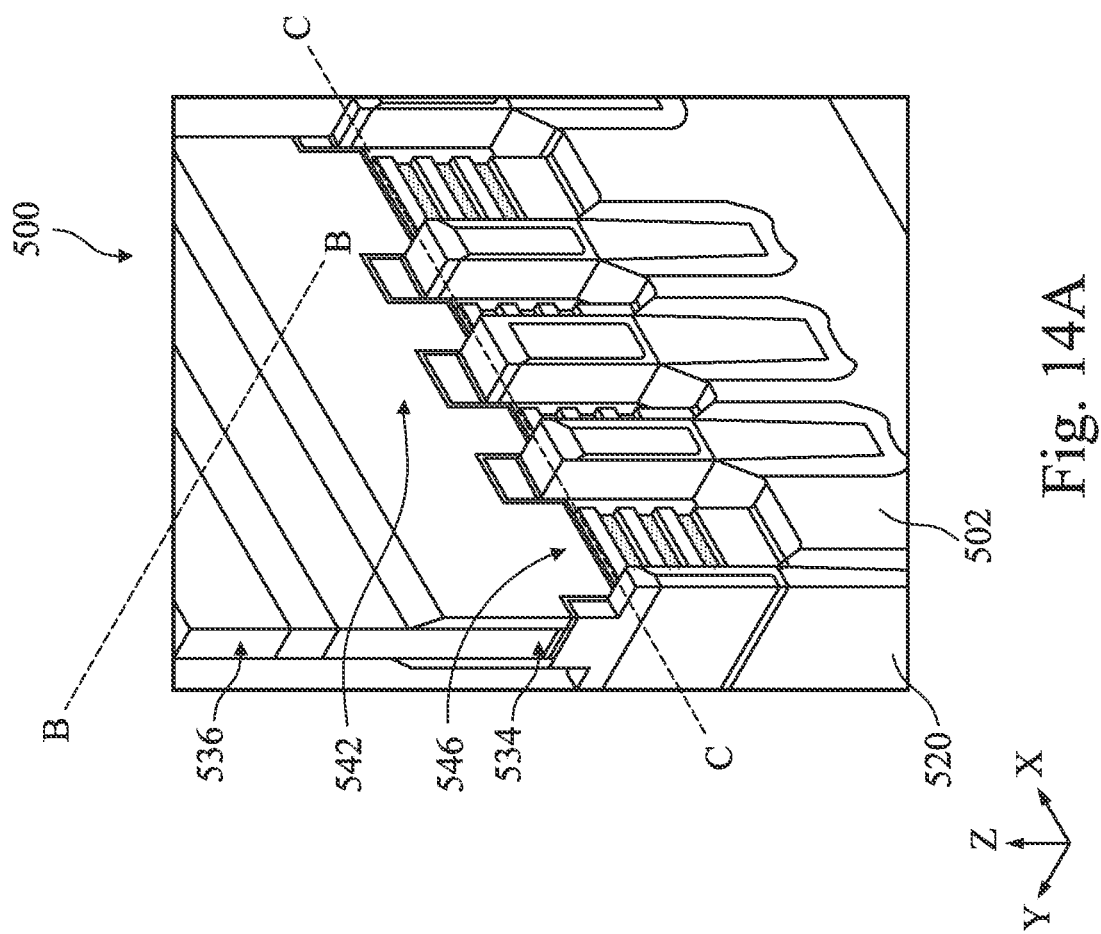

At operation 420, the method 400 (FIG. 4A) forms inner spacer cavities. With reference to FIGS. 14A-C, by laterally recessing the epitaxial layers 506 through S/D recesses 546, inner spacer cavities 548 are formed. In some embodiments of operation 420, a lateral etching (or horizontal recessing) is performed to recess the epitaxial layers 506 to form inner spacer cavities 548. The amount of etching of the epitaxial layers 506 is in a range from about 2 nm to about 10 nm in some embodiments. The lateral etching also recesses the cladding layer 522 in the Y-direction. When the epitaxial layers 506 and the cladding layer 522 are SiGe, the lateral etching process may use an etchant selected from, but not limited to, ammonium hydroxide (NH$_4$OH), tetramethylammonium hydroxide (TMAH), ethylenediamine pyrocatechol (EDP), and potassium hydroxide (KOH) solutions. In some embodiments, recessed sidewalls of the cladding layer 522 are substantially flush with the sidewall surfaces of the dummy gate structure 534. Here, "being substantially flush" means the difference in the relative position is less than about 1 nm.

Figure 15B:
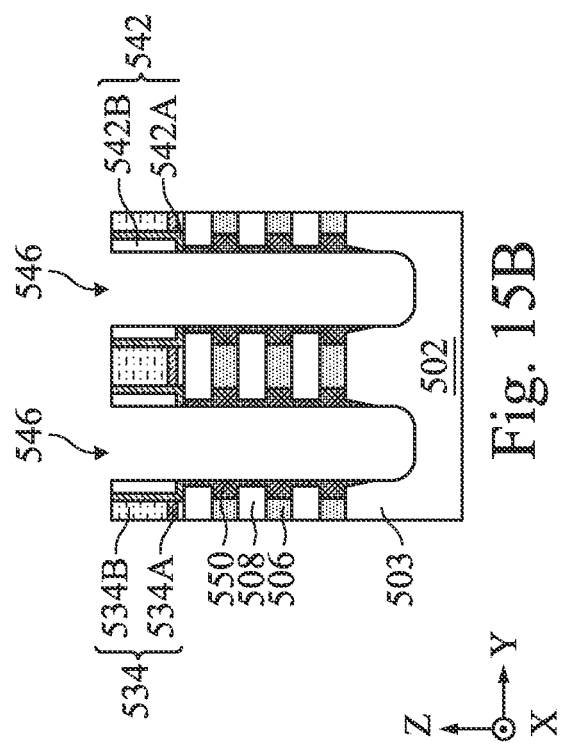
Figure 15C:
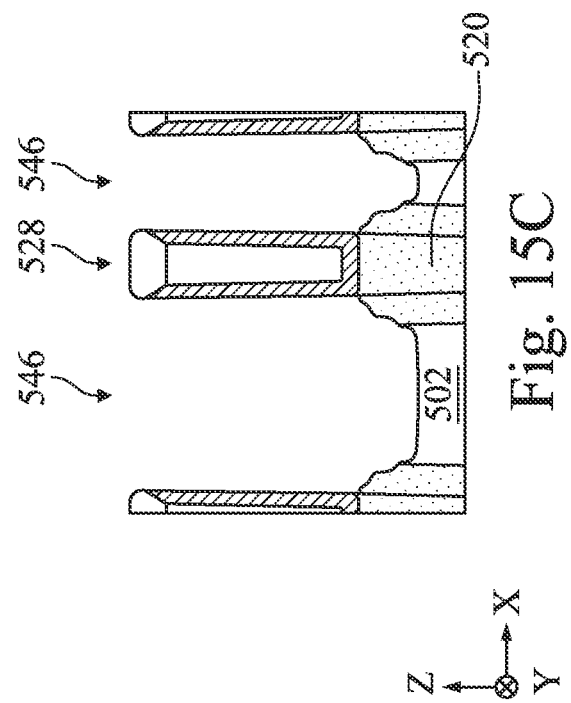
Figure 15A:
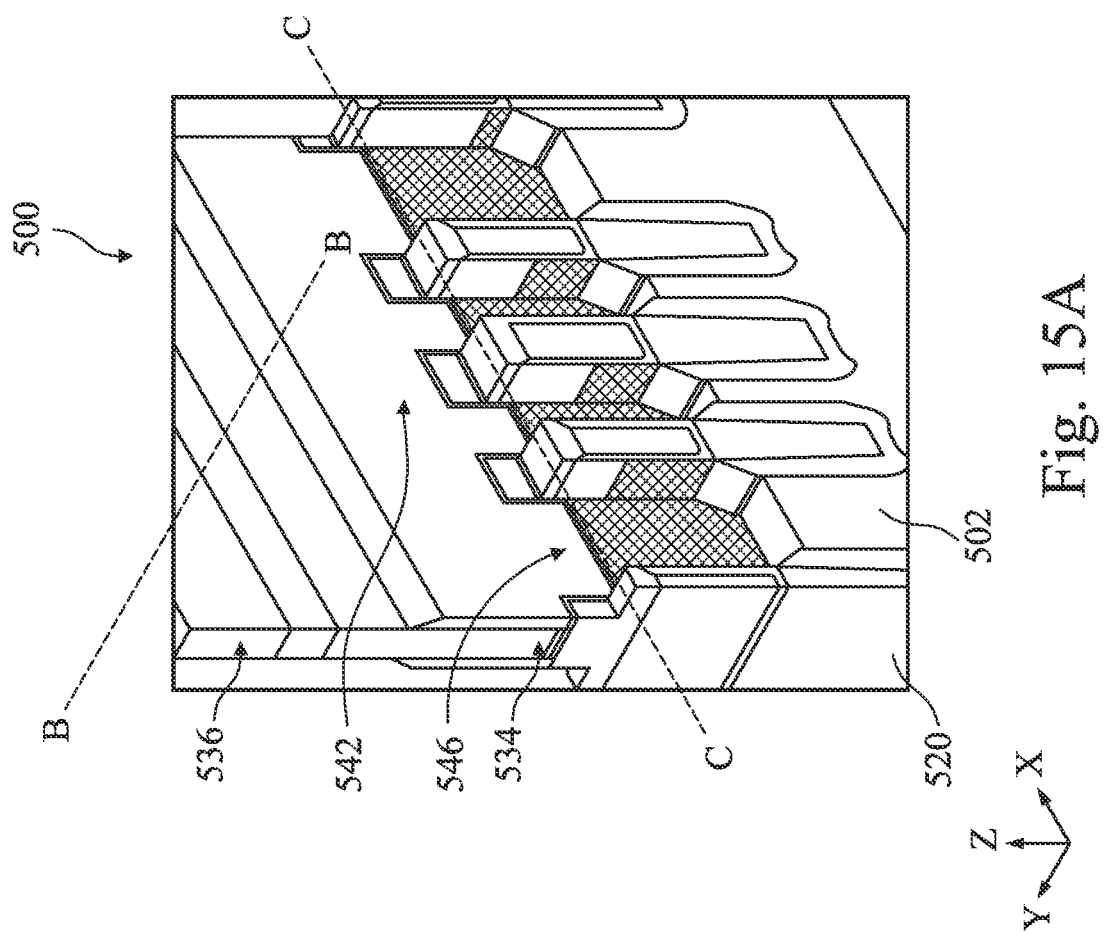
Figure 16A:
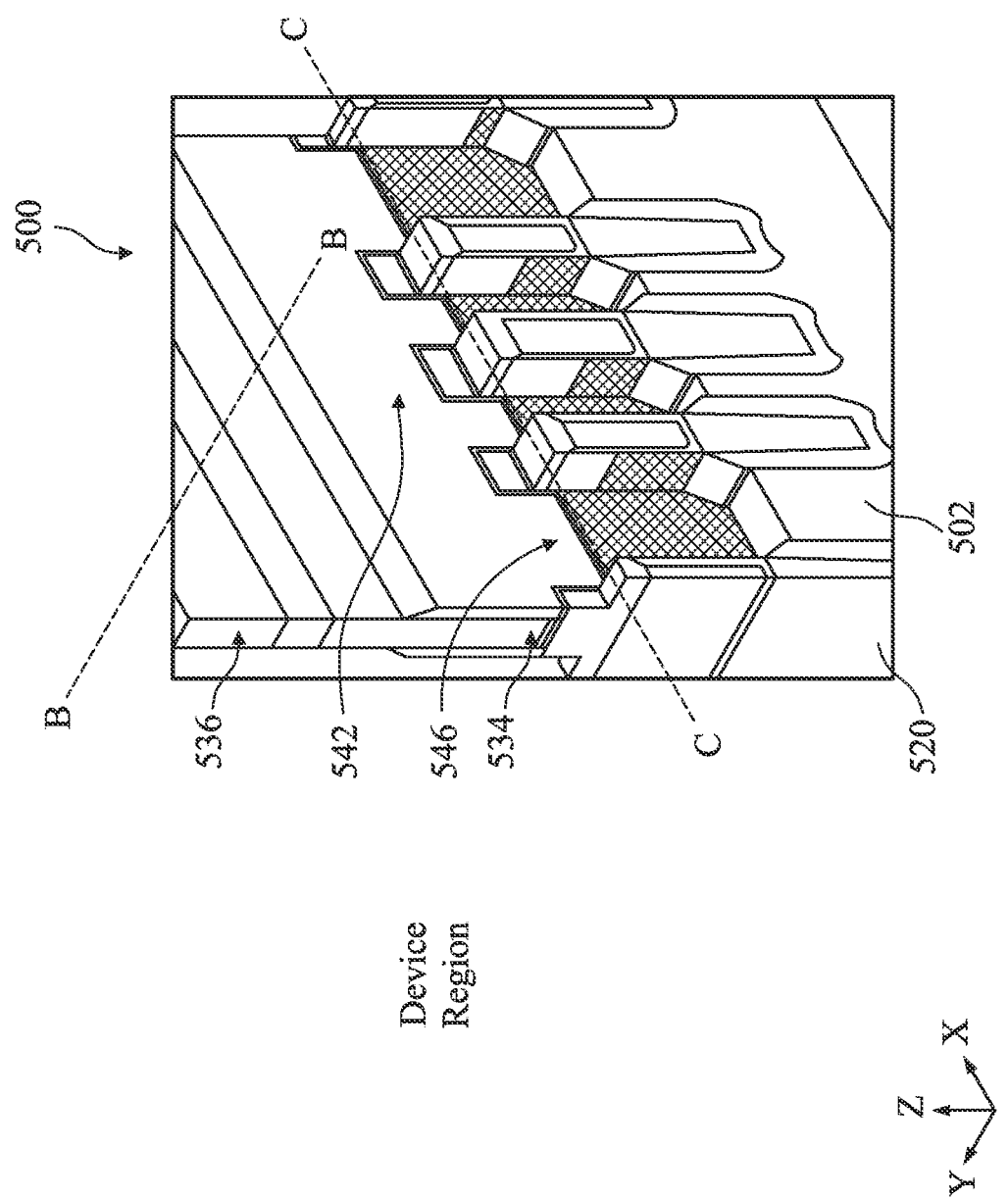

At operation 422, the method 400 (FIG. 4A) forms inner spacers. With reference to FIGS. 15A-C, an inner spacer layer 550 are formed in the inner spacer cavities 548. A length of the inner spacer layer 550 (along the Y-direction) may range from about 3 nm to about 8 nm, in some embodiments. In some embodiments of operation 422, an insulating layer is formed on the lateral ends of the epitaxial layers 506 to fill the inner spacer cavities 548, thereby forming the inner spacer layer 550. The insulating layer may include a dielectric material, such as SiN, SiOC, SiOCN, SiCN, SiO2, and/or other suitable material. In some embodiments, the insulating layer is conformally deposited in the S/D recesses 546, for example, by ALD or any other suitable method. After the conformal deposition of the insulating layer, an etch-back process is performed to partially trim the insulating layer outside of the inner spacer cavities 548. The etch process may be performed by using diluted HF, SiCoNi (including HF and NH$_3$), or the like as the etchant. The etch process thins the insulating layer and exposes a top surface of the substrate 502. At the conclusion of operation 422, a thin layer of the insulating layer remains covering sidewalls of the S/D recesses 546, particularly the lateral ends of the epitaxial layers 508. As described in more detail below, the thin layer of the insulating layer blocks the epitaxial growth of an undoped base epitaxial layer of S/D epitaxial features from sidewalls of the S/D recesses 546 but from bottom surface of the S/D recesses 546.

At operation 424, the method 400 (FIG. 1B) deposits a blocking layer in the S/D recesses 546 in the well pick-up regions. With reference to FIGS. 16A-E, a blocking layer 552 is deposited on sidewalls of the S/D recesses 546 and the top surface of the substrate 502. The blocking layer 552 also covers sidewalls and top surface of the dielectric fins 528. As described in more detail below, the blocking layer 552 blocks the epitaxial growth of an undoped base epitaxial layer of S/D epitaxial features from the well pick-up regions. As the dimensions of the device 500 decrease, various sacrificial features introduced during the fabrication processes, such as resist material and hard mask material may remain in the S/D recesses 546 and become difficult to remove, which may deteriorate device performance. Therefore, material and deposition method for forming the blocking layer 552 is not arbitrarily picked, but to exhibit high etch selectivity and strong gap filling capability. In an embodiment, the blocking layer 552 is a dielectric layer that includes a metal oxide, such as alumina (Al$_2$O$_3$), and is blanket deposited using an ALD method on exposed surfaces of the device 500. Subsequently, the blocking layer 552 is removed from the device regions in a lithography process. In various embodiments, the blocking layer 552 may include silicon nitride, lanthanum oxide, silicon (such as polysilicon), silicon carbonitride, silicon oxy carbonitride, aluminum nitride, aluminum oxynitride, a combination thereof, or other suitable materials. In some embodiments, the blocking layer 552 may be deposited using ALD, CVD, a thermal process (such as a furnace process), a PVD process, or other suitable processes, and may be deposited at a temperate in a range of about 100° C. to about 400° C. and pressure in a range of about 1 torr to 100 torr. A thickness of the blocking layer 552 may range from about 2 nm to about 10 nm in some embodiments.

Figure 17A:
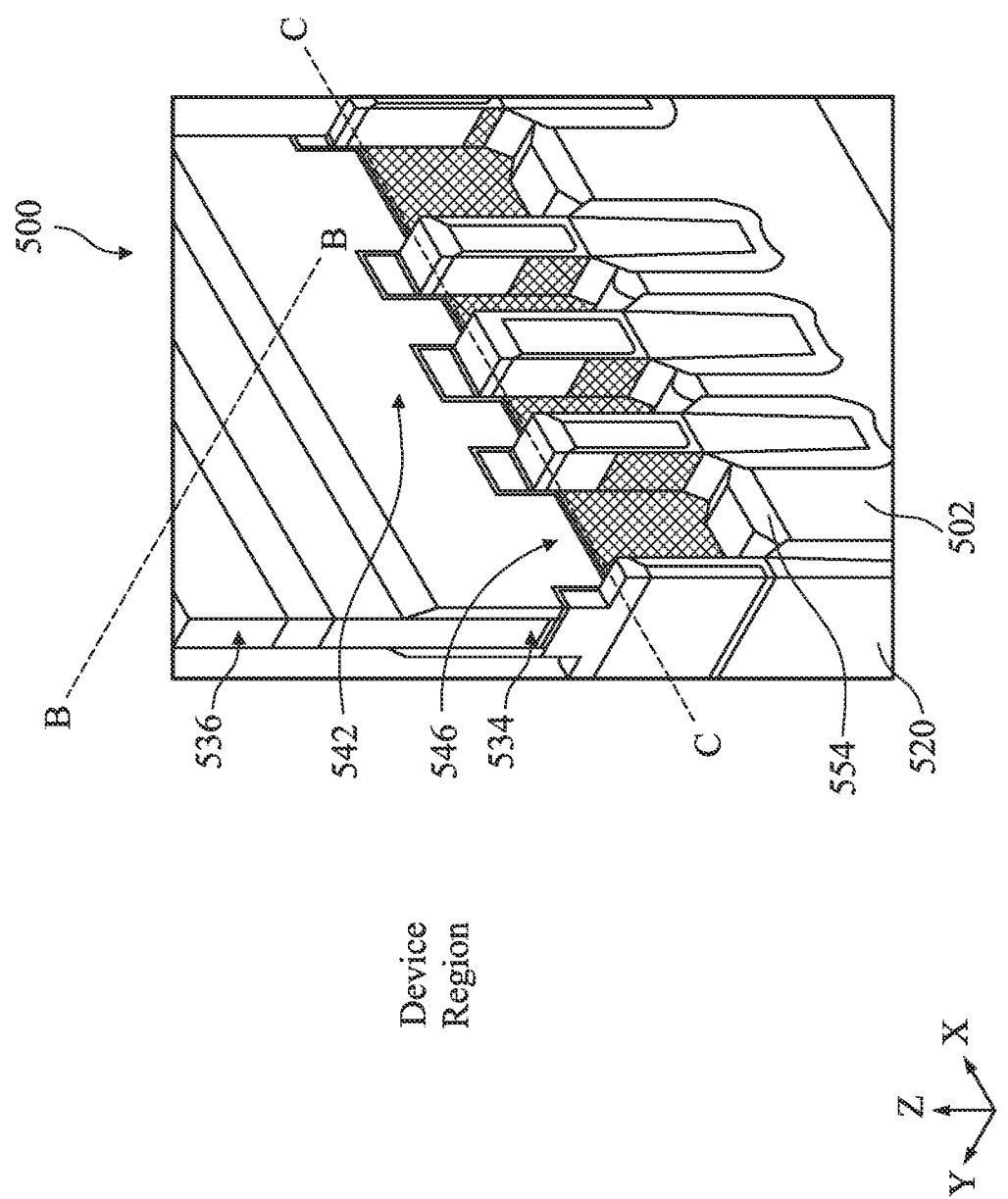
Figure 18A:
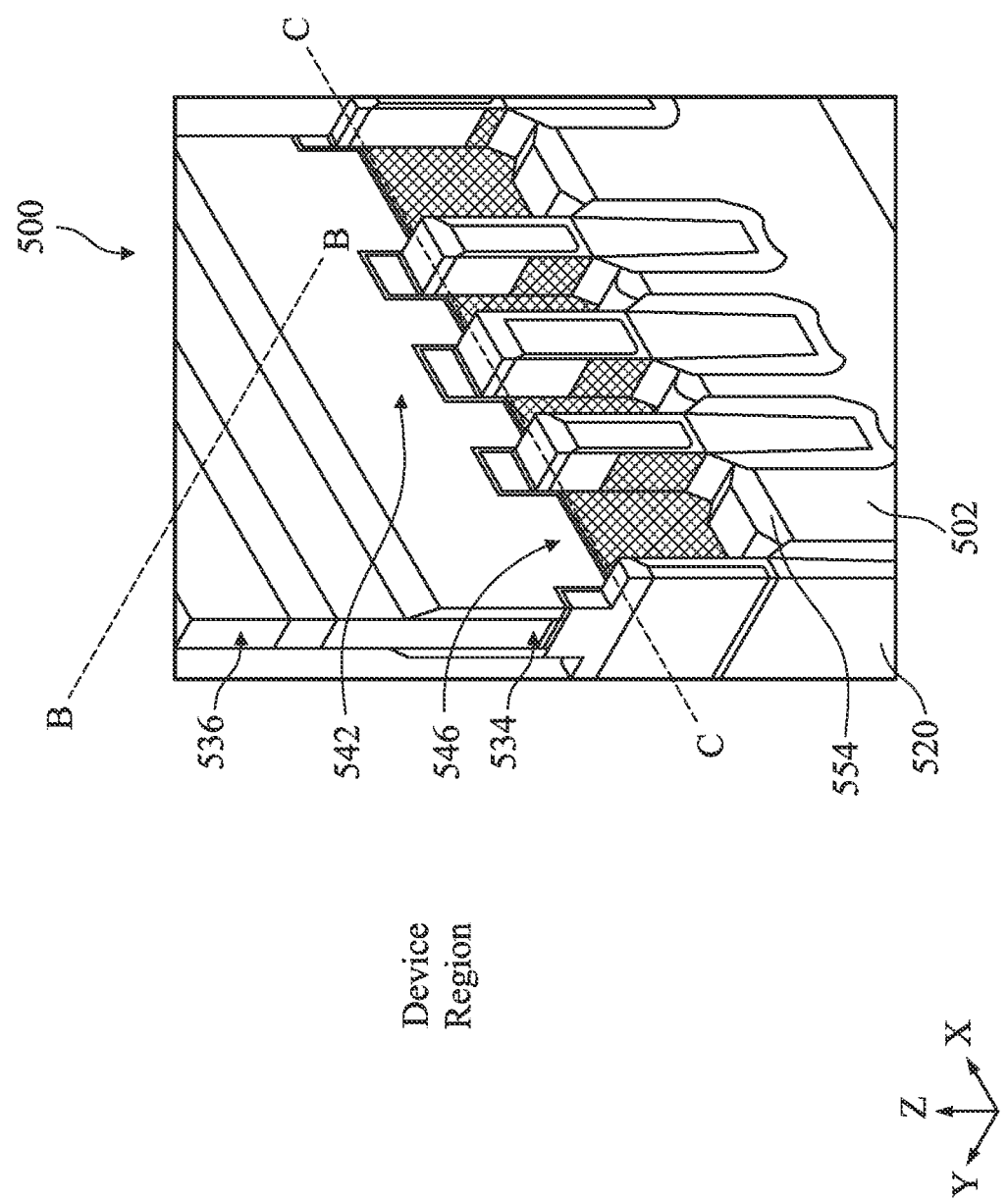
Figure 19A:
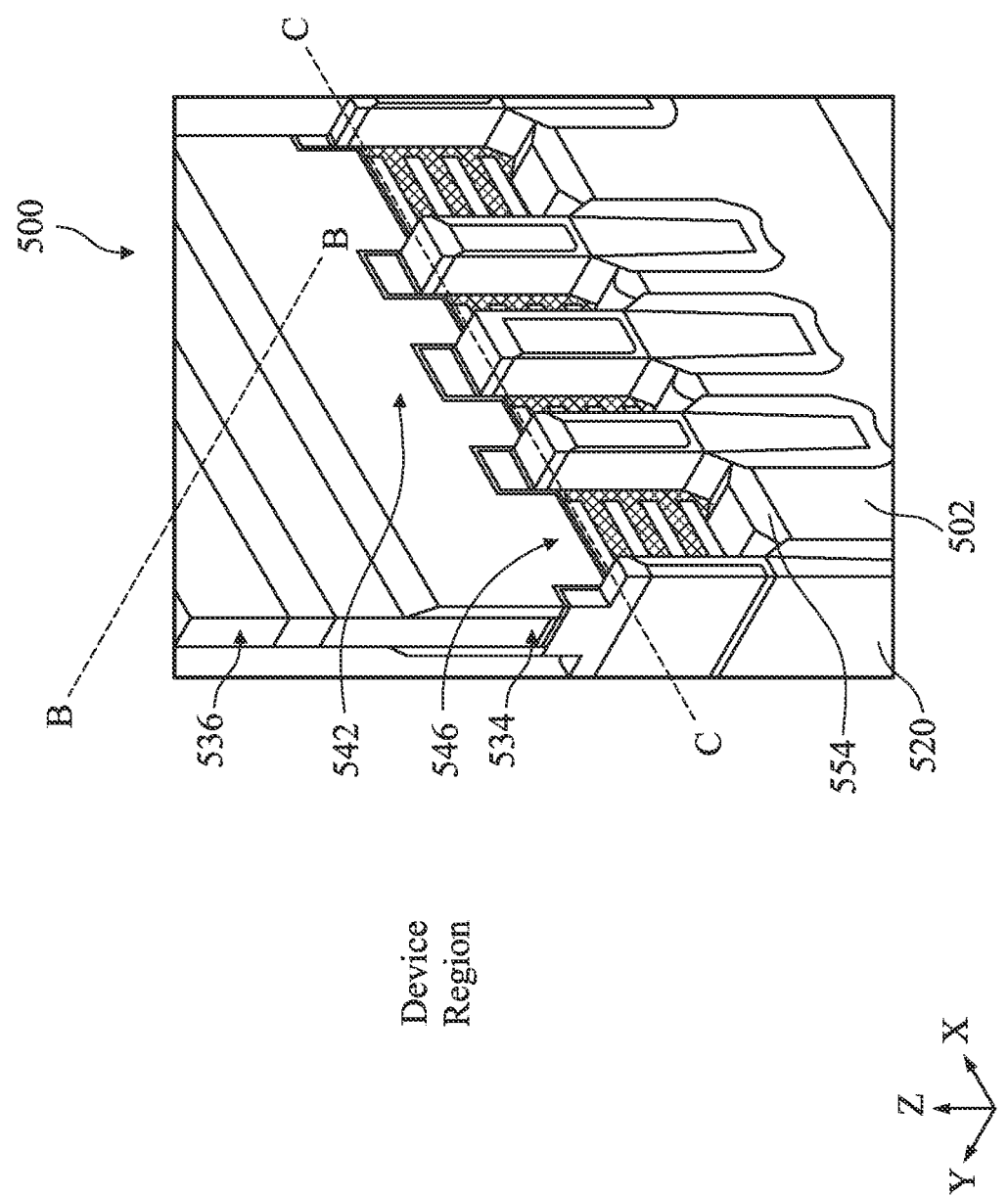
Figure 20A:
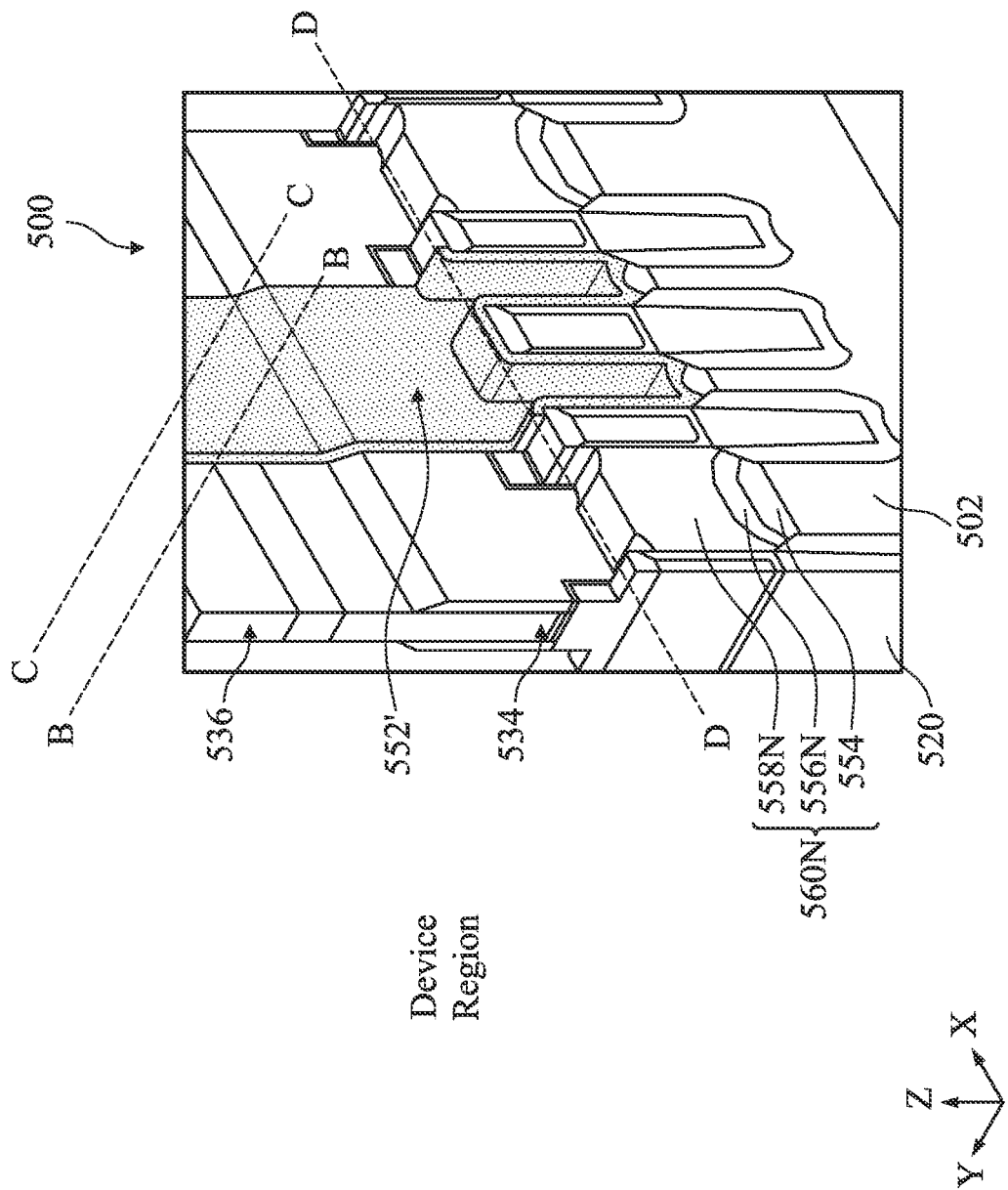

At operation 426, the method 400 (FIG. 4B) forms a base epitaxial layer 554 at the bottom of the S/D recesses 546 in the device regions. With references to FIGS. 17A-E, a base epitaxial layer 554 is epitaxially grown from the top surface of the substrate 502 exposed in the S/D recesses 546 in the device regions. Further, the base epitaxial layer 554 is epitaxially grown from both the n-type regions for forming NFETs and the p-type regions for forming PFETS in the device regions. By way of example, epitaxial growth of the base epitaxial layer 554 may be performed by vapor-phase epitaxy (VPE), ultra-high vacuum CVD (UHV-CVD), molecular beam epitaxy (MBE), and/or other suitable processes. In some embodiments, the base epitaxial layer 554 include the same material as the substrate 502, such as silicon (Si). In some alternative embodiments, the base epitaxial layer 554 includes a different semiconductor material than the substrate 502, such as silicon germanium (SiGe). As shown in FIGS. 17B and 17C, the base epitaxial layer 554 may exhibit faceted growth when it raises above the top surface of the substrate 502. The thin layer of the inner spacer layer 550 limits the epitaxial growth of the base epitaxial layer 554 from the bottom of the S/D recesses 546. In the illustrated embodiment, the growth of the base epitaxial layer 554 is under time control such that the top surface of the base epitaxial layer 554 is below a top surface of the mesa 503 and also below a top surface of the STI feature 520. In some embodiments, the base epitaxial layer 554 is dopant-free, where for example, no intentional doping is performed during the epitaxial growth process. As a comparison, in one instance, the substrate 502 is lightly doped with p-type dopant in the n-type regions for forming NFETs or doped with n-type dopant in the p-type regions for forming PFETs and thus has a higher doping concentration than the base epitaxial layer 554. The well pick-up regions are free of the base epitaxial layer 554. The dopant-free base epitaxial layer 554 provides a high resistance path from the S/D epitaxial features to the semiconductor substrate in the device regions, such that the leakage current in the device regions is suppressed. In some embodiments, the base epitaxial layer 554 has a thickness (measured in Z direction) from about 10 nm to about 20 nm. If the thickness of the base epitaxial layer 554 is less than about 10 nm, the leakage current from the S/D regions to the semiconductor substrate may become too strong that deteriorates device performance. If the thickness of the base epitaxial layer 554 is larger than about 20 nm, the large thickness may squeeze space in the S/D recesses 546, making subsequent deposition of doped epitaxial layers in the S/D recesses 546 difficult.

At operation 428, the method 400 (FIG. 1B) removes the blocking layer 552 from well pick-up regions. With references to FIGS. 18A-E, the blocking layer 552 is removed in an etching process, such than the inner spacer layer 550, sidewalls and top surface of the dielectric fins 528 and STI feature 520, and top surface of the substrate 502 are exposed in the well pick-up regions. In the illustrated embodiment, a thin layer of the inner spacer layer 550 still covers lateral ends of the epitaxial layers 508 in both the device regions and well pick-up regions. The removal of the blocking layer 552 may include dry etching, wet etching, reactive ion etching (RIE), and/or other suitable processes. In some embodiments, the blocking layer 552 is etched by ammonium hydroxide ($NH_4OH$), tetramethylammonium hydroxide (TMAH), ethylenediamine pyrocatechol (EDP), or potassium hydroxide (KOH) solutions. In one example, the etching process includes a wet etching process with etchant of $NH_4OH:H_2O_2$ in a ratio ranging from about 1:10 to 1:30 for a duration of 50 seconds to about 100 seconds.

At operation 430, the method 400 (FIG. 1B) removes the thin layer of the inner spacer layer 550 that is outside of the inner spacer cavities 548. With references to FIGS. 19A-E, the thin layer of the inner spacer layer 550 outside of the inner spacer cavities 548 is removed in an etching process, such that lateral ends of the epitaxial layers 508 are exposed in both the device regions and well pick-up regions. The etch process may be performed by using diluted HF, SiCoNi (including HF and $NH_3$), or the like as the etchant. The remaining portions of inner spacer layer 550 in the inner spacer cavities 548 are also referred to as inner spacers 550. As described in more detail below, exposing lateral ends of the epitaxial layers 508 facilitates epitaxial growth of S/D epitaxial features from sidewalls of the S/D recesses 546.

At operation 432, the method 400 (FIG. 1B) forms n-type doped epitaxial layers in NFET regions of both the device regions and well pick-up regions. With references to FIGS. 20A-G, a blocking layer 552' is formed covering the PFET regions in both the device regions and well pick-up regions. The material compositions and forming of the blocking layer 552' may be substantially similar to the blocking layer 552. In one embodiment, the blocking layer 552' is a dielectric layer, such as a layer of aluminum oxide ($Al_2O_3$), blanket deposited by an ALD method over the device 500 and subsequently removed from the NFET regions in a lithography process. The blocking layer 552' limits the growth of n-type doped epitaxial layers in NFET regions. Alternatively, in some embodiments, the blocking layer 552' may be formed in the NFET regions and p-type doped epitaxial layers are first formed in PFET regions of both the device regions and well pick-up regions.

Still referring to FIGS. 20A-G, n-type S/D epitaxial features (also referred to as NEPI) 560N are formed in the S/D recesses 546 in both the device regions and well pick-up regions. The n-type S/D epitaxial features 560N in the device regions include the base epitaxial layer 554 that is dopant free, a first n-type doped epitaxial layer 556N over the base epitaxial layer 554, and a second n-type doped epitaxial layer 558N over the first n-type doped epitaxial layer 556N. The n-type S/D epitaxial features 560N in the well pick-up regions include the first n-type doped epitaxial layer 556N over the substrate 502 and the second n-type doped epitaxial layer 558N over the first n-type doped epitaxial layer 556N. The first n-type doped epitaxial layer 556N makes contact with the lateral ends of the epitaxial layers 508 and in contact with the inner spacers 550. The second n-type doped epitaxial layer 558N caps the first n-type doped epitaxial layer 556N and also in contact with the inner spacers 550. In some embodiments, a bottom portion of the first n-type doped epitaxial layer 556N may have a thickness (measured in Z direction) from about 10 nm to about 15 nm and a thickness on the lateral ends of the epitaxial layers 508 (measured in Y direction) from about 3 nm to about 4 nm.

In an embodiment, forming the n-type doped epitaxial layers 556N and 558N includes epitaxially growing the semiconductor layers by an MBE process, a chemical vapor deposition process, and/or other suitable epitaxial growth processes. In a further embodiment, the n-type doped epitaxial layers 556N and 558N are in-situ or ex-situ doped with an n-type dopant. In some embodiments, the first n-type doped epitaxial layer 556N includes the same dopant species as the second n-type doped epitaxial layer 558N. For example, each of the n-type doped epitaxial layers 556N and 558N may include silicon doped with phosphorous or arsenic. In some embodiments, the first n-type doped epitaxial layer 556N includes a different dopant species from the second n-type doped epitaxial layer 558N. For example, the first n-type doped epitaxial layer 556N may include silicon doped with arsenic, and the second n-type doped epitaxial layer 558N may include silicon doped with phosphorous.

In various embodiments, the dopant concentration is increasingly grading from the first n-type doped epitaxial layer 556N to the second n-type doped epitaxial layer 558N, which facilitate subsequent silicidation process (e.g., nickel silicide formation) for landing S/D contacts on the S/D features. Further, the first n-type doped epitaxial layer 556N and the second n-type doped epitaxial layer 558N may include a constant distribution of dopant concentration individually in some embodiments. For example, the second n-type doped epitaxial layer 558N includes a constant distribution where the dopant concentration is constant from its bottommost to its topmost but larger than that of the first n-type doped epitaxial layer 556N.

Referring to FIGS. 20B and 20E, due to the base epitaxial layer 554 in the device regions, the first n-type doped epitaxial layer 556N has a convex top surface that is above top surfaces of the mesa 503 and the STI feature 520, and the second n-type doped epitaxial layer 558N has a convex top surface that is above the top surfaces of the topmost epitaxial layer 508 and the dielectric layer 526 for about 5 nm to about 10 nm. As a comparison, without the base epitaxial layer 554 in the well pick-up regions, the first n-type doped epitaxial layer grows directly from the substrate 502 and has a substantially flat top surface that is below the top surfaces of the mesa 503 and the STI feature 520, and the second n-type doped epitaxial layer 558N has a concave top surface that is below the top surfaces of the topmost epitaxial layer 508 and the dielectric layer 526 for about 0 nm to about 5 nm.

At operation 434, the method 400 (FIG. 1B) forms p-type doped epitaxial layers in PFET regions of both the device regions and well pick-up regions. With references to FIGS. 21A-G, a blocking layer 552" is formed covering the NFET regions in both the device regions and well pick-up regions. The material compositions and forming of the blocking layer 552" may be substantially similar to the blocking layer 552. In one embodiment, the blocking layer 552" is a dielectric layer, such as a layer of aluminum oxide ($Al_2O_3$), blanket deposited by an ALD method over the device 500 (blocking layer 552" in the NFET regions and blocking layers 552' and 552" stacked in the PFET regions) and subsequently removed from the PFET regions in a lithography process. The blocking layer 552" limits the growth of p-type doped epitaxial layers in NFET regions. Alternatively, in some embodiments, the blocking layer 552" may be formed in the PFET regions and n-type doped epitaxial layers are subsequently formed in NFET regions of both the device regions and well pick-up regions, if p-type doped epitaxial layers have been formed at operation 432, alternatively.

With references to FIGS. 22A-G, p-type S/D epitaxial features (also referred to as PEPI) 560P are formed in the S/D recesses 246 in both the device regions and well pick-up regions. The p-type S/D epitaxial features 560P in the device regions include the base epitaxial layer 554 that is dopant free, a first p-type doped epitaxial layer 556P over the base epitaxial layer 554, and a second p-type doped epitaxial layer 558P over the first p-type doped epitaxial layer 556P. The p-type S/D epitaxial features 560P in the well pick-up regions include the first p-type doped epitaxial layer 556P over the substrate 502 and the second p-type doped epitaxial layer 558P over the first p-type doped epitaxial layer 556P. The first p-type doped epitaxial layer 556P makes contact with the lateral ends of the epitaxial layers 508 and in contact with the inner spacers 550. The second p-type doped epitaxial layer 558P caps the first p-type doped epitaxial layer 556P and also in contact with the inner spacers 550. In some embodiments, a bottom portion of the first p-type doped epitaxial layer 556P may have a thickness (measured in Z direction) from about 10 nm to about 15 nm and a thickness on the lateral ends of the epitaxial layers 508 (measured in Y direction) from about 3 nm to about 4 nm.

In an embodiment, forming the p-type doped epitaxial layers 556P and 558P includes epitaxially growing the semiconductor layers by an MBE process, a chemical vapor deposition process, and/or other suitable epitaxial growth processes. In a further embodiment, the p-type doped epitaxial layers 556P and 558P are in-situ or ex-situ doped with a p-type dopant. In some embodiments, the first p-type doped epitaxial layer 556P includes the same dopant species as the second p-type doped epitaxial layer 558P. For example, each of the p-type doped epitaxial layers 556P and 558P may include silicon germanium (SiGe) doped with boron. In some embodiments, the first p-type doped epitaxial layer 556P includes a different dopant species from the second p-type doped epitaxial layer 558P. For example, the first p-type doped epitaxial layer 556P may include SiGe doped with boron, and the second p-type doped epitaxial layer 558P may include SiGe doped with $BF_2$.

In various embodiments, the dopant concentration is increasingly grading from the first p-type doped epitaxial layer 556P to the second p-type doped epitaxial layer 558P, which facilitate subsequent silicidation process (e.g., nickel silicide formation) for landing S/D contacts on the S/D features. Further, the first p-type doped epitaxial layer 556P and the second p-type doped epitaxial layer 558P may include a constant distribution of dopant concentration individually in some embodiments. For example, the second p-type doped epitaxial layer 558P includes a constant distribution where the dopant concentration is constant from its bottommost to its topmost but larger than that of the first p-type doped epitaxial layer 556P.

Referring to FIGS. 22B and 22E, due to the base epitaxial layer 554 in the device regions, the first p-type doped epitaxial layer 556P has a convex top surface that is above top surfaces of the mesa 503 and the STI feature 520, and the second p-type doped epitaxial layer 558P has a convex top surface that is above the top surfaces of the topmost epitaxial layer 508 and the dielectric layer 526 for about 5 nm to about 10 nm. As a comparison, without the base epitaxial layer 554 in the well pick-up regions, the first p-type doped epitaxial layer grows directly from the substrate 502 and has a substantially flat top surface that is below the top surfaces of the mesa 503 and the STI feature 520, and the second p-type doped epitaxial layer 558P has a concave top surface that is below the top surfaces of the topmost epitaxial layer 508 and the dielectric layer 526 for about 0 nm to about 5 nm.

At operation 436, the method 400 (FIG. 1B) forms a contact etch stop layer (CESL) and an inter-layer dielectric (ILD) layer. With reference to FIGS. 23A-F, a CESL 562 is deposited over the S/D features 560N and 560P, and an ILD layer 564 is deposited over the CESL 562. In some embodiments of operation 436, the CESL 562 includes a silicon nitride layer, silicon oxide layer, a silicon oxynitride layer, and/or other materials known in the art. The CESL 562 may be formed by plasma-enhanced chemical vapor deposition (PECVD) process and/or other suitable deposition or oxidation processes. In some embodiments, the ILD layer 564 includes materials such as tetraethylorthosilicate (TEOS) oxide, un-doped silicate glass, or doped silicon oxide such as borophosphosilicate glass (BPSG), fused silica glass (FSG), phosphosilicate glass (PSG), boron doped silicon glass (BSG), and/or other suitable dielectric materials. The ILD layer 564 may be deposited by a PECVD process or other suitable deposition technique. In some embodiments, after formation of the ILD layer 564, the semiconductor device 500 may be subject to a high thermal budget process to anneal the ILD layer. In some examples, after depositing the ILD layer, a planarization process may be performed to remove excessive dielectric materials. For example, a planarization process includes a chemical mechanical planarization (CMP) process which removes portions of the ILD layer 564 (and CESL 562, if present) overlying the dummy gate structure 534 and planarizes a top surface of the semiconductor device 500.

At operation 438, the method 400 (FIG. 1B) removes the dummy gate structure 534 and the epitaxial layers 506 to form a gate trench 570, such as shown in FISG. 24A-F. Operation 438 may include one or more etching processes that are selective to the material in the dummy gate structure 534. For example, recessing the dummy gate structure 534 may be performed using a selective etch process such as a selective wet etch, a selective dry etch, or a combination thereof. A final gate structure (e.g., a high-k metal gate stack)

may be subsequently formed in the gate trench 570, as will be described below. The epitaxial layers 506 from the semiconductor fins 510 and the cladding layer 522 are also removed from the gate trench 570. The resultant structure is shown in FIGS. 24A-24F. In an embodiment, the epitaxial layers 506 and the cladding layer 522 both include SiGe and the epitaxial layers 508 are silicon, allowing for the selective removal of the epitaxial layers 506 and the cladding layer 522. In an embodiment, the epitaxial layers 506 and the cladding layer 522 are removed by a selective wet etching process. In some embodiments, the selective wet etching includes an APM etch (e.g., ammonia hydroxide-hydrogen peroxide-water mixture). In some embodiments, the selective removal includes SiGe oxidation followed by a SiGeOx removal. For example, the oxidation may be provided by $O_3$ clean and then SiGeOx removed by an etchant such as $NH_4OH$.

The method 400 then proceeds to operation 440 (FIG. 1B) where a gate structure is formed. The gate structure may be the gate of one or more multi-gate transistors. The gate structure may be a high-k metal gate (HK MG) stack, however other compositions are possible. In some embodiments, the gate structure forms the gate associated with the multi-channels provided by the plurality of channel members (e.g., nanosheets or nanowires having gaps therebetween) in the channel region. The resultant structure is shown in FIGS. 25A-F. In an embodiment of operation 440, a HK MG stack 572 is formed within the gate trench 570 of the device 500 provided by the release of the epitaxial layers 508, described above with reference to prior operation 438. In various embodiments, the HK MG stack 572 includes an interfacial layer, a high-K gate dielectric layer formed over the interfacial layer, and a gate electrode layer formed over the high-k gate dielectric layer. High-k gate dielectrics, as used and described herein, include dielectric materials having a high dielectric constant, for example, greater than that of thermal silicon oxide (~3.9). The gate electrode layer used within HK MG stack may include a metal, metal alloy, or metal silicide. Additionally, the formation of the HK MG stack may include depositions to form various gate materials, one or more liner layers, and one or more CMP processes to remove excessive gate materials and thereby planarize a top surface of the semiconductor device 500. Interposing the HK MG stack 572 and the S/D features 560N or 560P are the inner spacers 550, providing isolation.

The HK MG stack 572 includes portions that interpose each of the epitaxial layers (channel members) 508, which form channels of the multi-gate device 500. In some embodiments, the interfacial layer of the HK MG stack 572 may include a dielectric material such as silicon oxide ($SiO_2$), HfSiO, or silicon oxynitride (SiON). The interfacial layer may be formed by chemical oxidation, thermal oxidation, atomic layer deposition (ALD), chemical vapor deposition (CVD), and/or other suitable method. The high-k gate dielectric layer of the HK MG stack 572 may include a high-K dielectric such as hafnium oxide ($HfO_2$). Alternatively, the high-k gate dielectric layer of the HK MG stack 572 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $Si_3N_4$, oxynitrides (SiON), combinations thereof, or other suitable material. The high-k gate dielectric layer may be formed by ALD, physical vapor deposition (PVD), CVD, oxidation, and/or other suitable methods. In some embodiments, the high-k gate dielectric layer is deposited conformally on sidewalls of the dielectric fin 528, the inner spacers 550, and top surfaces of the STI features 520.

The gate electrode layer of the HK MG stack 572 may include a single layer or alternatively a multi-layer structure, such as various combinations of a metal layer with a selected work function to enhance the device performance (work function metal layer), a liner layer, a wetting layer, an adhesion layer, a metal alloy or a metal silicide. By way of example, the gate electrode layer of HK MG stack 572 may include Ti, Ag, Al, TiAlN, TaC, TaCN, TaSiN, Mn, Zr, TiN, TaN, Ru, Mo, Al, WN, Cu, W, Re, Ir, Co, Ni, other suitable metal materials or a combination thereof. In various embodiments, the gate electrode layer of the HK MG stack 572 may be formed by ALD, PVD, CVD, e-beam evaporation, or other suitable process. Further, the gate electrode layer may be formed separately for NFET and PFET transistors which may use different metal layers (e.g., for providing an n-type or p-type work function).

The device 500 may undergo further processing to form various features and regions known in the art. For example, subsequent processing may form contact openings, contact metal, as well as various contacts/vias/lines and multilayers interconnect features (e.g., metal layers and interlayer dielectrics), configured to connect the various features to form a functional circuit that may include one or more multi-gate devices. In furtherance of the example, a multi-layer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 400, and some process steps described above may be replaced or eliminated in accordance with various embodiments of the method 400.

One of ordinary skill may recognize although FIGS. 5A-25F illustrate GAA devices as embodiments, other examples of semiconductor devices may benefit from aspects of the present disclosure, such as FinFET devices.

Although not intended to be limiting, one or more embodiments of the present disclosure provide many benefits to a semiconductor device and the formation thereof. For example, embodiments of the present disclosure provide reduced well pick-up resistance in well pick-up regions of a memory macro with doped epitaxial layers for forming S/D features, while implementing undoped base epitaxial layers in device region to suppress leakage currents. Well pick-up resistance reduction in about 1 to 2 orders has be observed by introducing the illustrated improvements in well pick-up regions, which in turn improves device latch-up performance without sacrificing transistor performance in the device regions. Further, embodiments of the present disclosure can be readily integrated into existing semiconductor manufacturing processes.

In one exemplary aspect, the present disclosure is directed to a method. The method includes forming a first fin protruding from a substrate in a first region of the substrate and a second fin protruding from the substrate in a second region of the substrate, recessing a portion of the first fin, thereby forming a first recess, recessing a portion of the second fin, thereby forming a second recess, depositing a blocking layer in the second recess, growing a base epitaxial layer in the first recess, wherein the base epitaxial layer is dopant free, removing the blocking layer from the second recess, and growing a doped epitaxial layer in the first recess and the second recess, wherein the doped epitaxial layer abuts the first fin in the first region and the second fin in the second region. In some embodiments, the first region is a device region and the second region is a well pick-up region. In some embodiments, in the first region the doped epitaxial layer is above a top surface of the first fin, and in the second region the doped epitaxial layer is below a top surface of the second fin. In some embodiments, the doped epitaxial layer has a convex top surface in the first region and a concave top surface in the second region. In some embodiments, in the first region the base epitaxial layer separates the doped epitaxial layer from contacting the substrate, and in the second region the doped epitaxial layer is in contact with the substrate. In some embodiments, the base epitaxial layer is in contact with the substrate. In some embodiments, prior to the growing of the base epitaxial layer, the method further includes depositing a dielectric layer in the first recess and the second recess, the dielectric layer covering the substrate and sidewalls of the first and second fins, and partially etching the dielectric layer, thereby exposing the substrate in the first recess and the second recess. In some embodiments, prior to the growing of the doped epitaxial layer, the method further includes trimming the dielectric layer, thereby exposing the sidewalls of the first and second fins, the doped epitaxial layer being in contact with the exposed sidewalls of the first and second fins. In some embodiments, the base epitaxial layer and the doped epitaxial layer includes a same semiconductor material with the substrate. In some embodiments, the base epitaxial layer includes Si and the doped epitaxial layer includes SiGe.

In another exemplary aspect, the present disclosure is directed to a method. The method includes forming a first source/drain (S/D) recess for an n-type transistor in a first region of a substrate, forming a second S/D recess for a p-type transistor in the first region, forming a third S/D recess for an n-type transistor in a second region of the substrate, forming a fourth S/D recess for a p-type transistor in the second region, depositing a first blocking layer in the third and fourth S/D recesses, growing a first epitaxial layer in the first and second S/D recesses, the first epitaxial layer being dopant free, removing the first blocking layer from the third and fourth S/D recesses, depositing a second blocking layer in the second and fourth S/D recesses, growing a second epitaxial layer in the first and third S/D recesses, the second epitaxial layer being doped with a first dopant, removing the second blocking layer from the second and fourth S/D recesses, depositing a third blocking layer in the first and third S/D recesses, growing a third epitaxial layer in the second and fourth S/D recesses, the third epitaxial layer being doped with a second dopant that is different from the first dopant, and removing the third blocking layer from the first and third S/D recesses. In some embodiments, the first region is a memory cell region of a memory device, and the second region is a well pick-up region of the memory device. In some embodiments, the first epitaxial layer and the second epitaxial layer both include Si. In some embodiments, the third epitaxial layer includes SiGe. In some embodiments, each of the first, second, and third blocking layers includes $Al_2O_3$. In some embodiments, a top surface of the second epitaxial layer in the first S/D recess is higher than a top surface of the second epitaxial layer in the third S/D recess. In some embodiments, the epitaxial layer includes a convex top surface in the second S/D recess and a concave top surface in the fourth S/D recess.

In yet another exemplary aspect, the present disclosure is directed to a semiconductor device. The semiconductor device includes a plurality of first channel members vertically stacked above a substrate, a first gate structure wrapping around each of the first channel members, a first epitaxial feature abutting the first channel members, a base epitaxial feature stacked between the substrate and the first epitaxial feature, a plurality of second channel members vertically stacked above the substrate, a second gate structure wrapping around each of the second channel members, and a second epitaxial feature abutting the second channel members and in contact with the substrate, the base epitaxial feature having a dopant concentration smaller than either of the first epitaxial feature or the second epitaxial feature. In some embodiments, the base epitaxial feature is substantially dopant free. In some embodiments, a top surface of the first epitaxial feature is above a top surface of a topmost first channel member, and a top surface of the second epitaxial feature is below a top surface of a topmost second channel member.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a first fin protruding from a substrate in a first region of the substrate and a second fin protruding from the substrate in a second region of the substrate;
    recessing a portion of the first fin, thereby forming a first recess;
    recessing a portion of the second fin, thereby forming a second recess;
    after the forming of the first and second recesses, depositing a blocking layer in the second recess;
    growing a base epitaxial layer in the first recess, wherein the base epitaxial layer is dopant free;
    removing the blocking layer from the second recess; and
    growing a doped epitaxial layer in the first recess and the second recess, wherein the doped epitaxial layer abuts the first fin in the first region and the second fin in the second region.

2. The method of claim 1, wherein the first region is a device region and the second region is a well pick-up region.

3. The method of claim 1, wherein in the first region the doped epitaxial layer is above a top surface of the first fin, and wherein in the second region the doped epitaxial layer is below a top surface of the second fin.

4. The method of claim 1, wherein the doped epitaxial layer has a convex top surface in the first region and a concave top surface in the second region.

5. The method of claim 1, wherein in the first region the base epitaxial layer separates the doped epitaxial layer from contacting the substrate, and wherein in the second region the doped epitaxial layer is in contact with the substrate.

6. The method of claim 1, wherein the base epitaxial layer is in contact with the substrate.

7. The method of claim 1, prior to the growing of the base epitaxial layer, further comprising:
depositing a dielectric layer in the first recess and the second recess, wherein the dielectric layer covers the substrate and sidewalls of the first and second fins; and
partially etching the dielectric layer, thereby exposing the substrate in the first recess and the second recess.

8. The method of claim 7, prior to the growing of the doped epitaxial layer, further comprising:
trimming the dielectric layer, thereby exposing the sidewalls of the first and second fins, wherein the doped epitaxial layer is in contact with the exposed sidewalls of the first and second fins.

9. The method of claim 1, wherein the base epitaxial layer and the doped epitaxial layer includes a same semiconductor material with the substrate.

10. The method of claim 1, wherein the base epitaxial layer includes Si and the doped epitaxial layer includes SiGe.

11. A method, comprising:
forming a first source/drain (S/D) recess for an n-type transistor in a first region of a substrate;
forming a second S/D recess for a p-type transistor in the first region;
forming a third S/D recess for an n-type transistor in a second region of the substrate;
forming a fourth S/D recess for a p-type transistor in the second region;
depositing a first blocking layer in the third and fourth S/D recesses;
growing a first epitaxial layer in the first and second S/D recesses, wherein the first epitaxial layer is dopant free;
removing the first blocking layer from the third and fourth S/D recesses;
depositing a second blocking layer in the second and fourth S/D recesses;
growing a second epitaxial layer in the first and third S/D recesses, wherein the second epitaxial layer is doped with a first dopant;
removing the second blocking layer from the second and fourth S/D recesses;
depositing a third blocking layer in the first and third S/D recesses;
growing a third epitaxial layer in the second and fourth S/D recesses, wherein the third epitaxial layer is doped with a second dopant that is different from the first dopant; and
removing the third blocking layer from the first and third S/D recesses.

12. The method of claim 11, wherein the first region is a memory cell region of a memory device, and wherein the second region is a well pick-up region of the memory device.

13. The method of claim 11, wherein the first epitaxial layer and the second epitaxial layer both include Si.

14. The method of claim 13, wherein the third epitaxial layer includes SiGe.

15. The method of claim 11, wherein each of the first, second, and third blocking layers includes $Al_2O_3$.

16. The method of claim 11, wherein a top surface of the second epitaxial layer in the first S/D recess is higher than a top surface of the second epitaxial layer in the third S/D recess.

17. The method of claim 11, wherein the third epitaxial layer includes a convex top surface in the second S/D recess and a concave top surface in the fourth S/D recess.

18. A method, comprising:
forming a first fin-shaped structure in a first region, the first fin-shaped structure comprising a plurality of first channel layers interleaved by a plurality of first sacrificial layers;
forming a second fin-shaped structure in a second region, the second fin-shaped structure comprising a plurality of second channel layers interleaved by a plurality of second sacrificial layers;
etching a portion of the first fin-shaped structure to form a first recess;
recessing a portion of the second fin-shaped structure to form a second recess;
after the first recess and the second recess are formed, depositing a blocking layer in the second recess;
growing a dopant-free epitaxial layer in the first recess;
after the growing of the dopant-free epitaxial layer, removing the blocking layer from the second recess;
growing a doped epitaxial layer in the first recess and the second recess, the doped epitaxial layer interfacing the first channel layers in the first region and the second channel layers in the second region;
removing the first sacrificial layers to release the first channel layers;
removing the second sacrificial layers to release the second channel layers;
forming a first gate structure wrapping around at least one of the first channel layers; and
forming a second gate structure wrapping around at least one of the second channel layers.

19. The method of claim 18, wherein the first region is a memory cell region and the second region is a well pick-up region.

20. The method of claim 18, wherein the doped epitaxial layer includes SiGe, and the dopant-free epitaxial layer is free of Ge.

* * * * *